(12) United States Patent
Uno et al.

(10) Patent No.: US 6,335,572 B1
(45) Date of Patent: Jan. 1, 2002

(54) HEAT TRANSFER APPARATUS

(75) Inventors: Hiroshi Uno; Yutaka Takahashi, both of Nara; Shinichi Nakajima, Osaka; Hidetaka Yabuuchi, Hyogo; Takaaki Kusaka, Hyogo; Masaru Kikukawa, Hyogo, all of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/354,568

(22) Filed: Jul. 16, 1999

(30) Foreign Application Priority Data

| Dec. 16, 1998 | (JP) | 10-357528 |
|---|---|---|
| Mar. 2, 1999 | (JP) | 11-054084 |
| Mar. 5, 1999 | (JP) | 11-058202 |
| Mar. 11, 1999 | (JP) | 11-064465 |
| Mar. 12, 1999 | (JP) | 11-066394 |
| Apr. 16, 1999 | (JP) | 11-109335 |

(51) Int. Cl.$^7$ ................................................. H02P 9/04
(52) U.S. Cl. ...................................... 290/1 R; 290/1 A
(58) Field of Search .............................. 290/1 R, 1 A; 136/205, 217; 431/350, 76, 46, 53; 126/110 E

(56) References Cited

U.S. PATENT DOCUMENTS

| 615,541 A | * | 12/1898 | Emanuel | 136/210 |
|---|---|---|---|---|
| 3,269,873 A | * | 8/1966 | Dent | 136/208 |
| 3,627,588 A | * | 12/1971 | Rubinstein et al. | 136/205 |
| 3,719,532 A | * | 3/1973 | Falkenberg et al. | 136/208 |
| 3,765,170 A | * | 10/1973 | Nakamura | 60/39.17 |
| 4,106,889 A | * | 8/1978 | Katchka | 431/46 |
| 4,140,475 A | * | 2/1979 | Wolfe | 431/42 |
| 4,218,266 A | * | 8/1980 | Guazzoni et al. | 136/209 |
| 4,294,225 A | * | 10/1981 | Mayo | 126/204 |
| 4,381,463 A | * | 4/1983 | Branover | 310/11 |
| 4,633,029 A | * | 12/1986 | Tillett, Jr. et al. | 136/205 |
| 4,639,542 A | * | 1/1987 | Bass et al. | 136/210 |
| 4,651,019 A | | 3/1987 | Gilbert et al. | 307/43 |
| 4,658,597 A | * | 4/1987 | Shum | 62/235.1 |
| 4,767,467 A | * | 8/1988 | Holland et al. | 136/217 |
| 4,906,178 A | * | 3/1990 | Goldstein et al. | 431/79 |
| 4,942,863 A | | 7/1990 | Chou et al. | 126/110 E |
| 5,397,922 A | * | 3/1995 | Paul et al. | 290/1 A |
| 5,427,086 A | * | 6/1995 | Brownell | 126/110 R |
| 5,512,108 A | * | 4/1996 | Noreen | 136/253 |
| 5,918,805 A | * | 7/1999 | Guyer | 237/8 A |
| 5,931,655 A | * | 8/1999 | Maher, Jr. | 431/14 |
| 6,053,418 A | * | 4/2000 | Guyer | 237/12.1 |

FOREIGN PATENT DOCUMENTS

| DE | 43 01 872 | 7/1994 |
|---|---|---|
| DE | 44 09 685 | 10/1994 |
| DE | 196 19 042 | 11/1997 |
| GB | 2 194 330 | 3/1988 |

* cited by examiner

Primary Examiner—Joseph Waks
(74) Attorney, Agent, or Firm—Wenderoth, Lind & Ponack, L.L.P.

(57) ABSTRACT

A portable heat transfer apparatus including a combustion device, a thermoelectric convertor for receiving the heat of the combustion device at its high temperature side, transferring the heat from its low temperature side to a heat exchanger, and generating electric power depending on the temperature difference between the high temperature side and low temperature side. A heat medium forced circulating device is driven by the power generated from the thermoelectric converter for transferring heat medium to the heat exchanger. Also provided is a heat releasing device for circulating and releasing the heat medium exchanged of heat in the heat exchanger. Therefore, the heat exchanger can be heated through the thermoelectric converter while heating the thermoelectric converter with the combustion device, and by heating with the heat exchanger. The temperature difference between the high temperature side and low temperature side of the thermoelectric converter can be obtained rationally and sufficiently. Therefore, the apparatus is reduced in size and weight, and it is convenient for portable use.

29 Claims, 32 Drawing Sheets

HEAT TRANSFER APPARATUS

BACKGROUND OF THE INVENTION

1. Technical Field

The present invention relates to a heat transfer apparatus using a thermoelectric converter.

2. Description of Related Art

One of the conventional examples of heat transfer apparatus using a thermoelectric converter is a bath heating apparatus. As shown in FIG. 35, a bathtub main body 1 is connected to a heat exchanger 4 of a bath boiler main body 3 through a circulating water path 2, and tub water is circulated by a pump 5, and a thermoelectric converter 6 is used for driving pump 5.

In this thermoelectric converter 6, a heat receiving section 7 at high temperature side is disposed closely to the combustion flame of a burner 8, while a tail end section 9 is provided in contact with a bypass water feed path 10 that is branched off the circulating water path 2 from the pump 5 in order to cool by setting at a low temperature side.

In this construction, when boiling the water in the bathtub main body 1, by heating the burner 8, the water is heated by the heat exchanger 4, and at the same time the heat receiving section 7 of the thermoelectric converter 6 is heated as the high temperature side by the combustion heat of the burner 8, while the tail end section 9 is cooled as the low temperature side by the branched bypass water feed path 10, thereby producing a temperature difference, and the thermoelectric converter 6 generates electric power by the Seebeck effect. The generated power is supplied into the pump 5 through a wiring 11, and drives the pump 5 to circulate the hot water in the bathtub main body 1.

In such conventional heat transfer apparatus, however, although the pump 5 is driven by the power generated by the thermoelectric converter 6, the majority of the heat value of the burner 8 directly heats the heat exchanger 4, and heats the warm water getting into the heat exchanger 4 from the bathtub main body 1 through the circulating water path 2, and therefore the heat value for heating the thermoelectric converter 6 is a low rate, and the generated power is smaller than the driving electric power of the pump 5 and it cannot be driven, or the circulation flow rate into the heat exchanger 4 through the circulating water path 2 is insufficient. Yet, since the thermoelectric converter 6 heats its heat receiving section 7 disposed closely to the burner 8 at the high temperature side, and cools its tail end section 9 by setting at the low temperature side, due to restrictions in positions, it cannot be fixed directly to the circulating water path 2, and the tail end section 9 is fixed to the bypass water feed path 10 that is branched off the circulating water path 2 from the pump 5, and is cooled, so that the construction is complicated.

The present invention solves the above problems of the prior art, and presents a portable type heat transfer apparatus preferably used as being incorporated into a warming suite or similar clothes.

SUMMARY OF THE INVENTION

To achieve the object, the heat transfer apparatus of the invention comprises combustion means, a thermoelectric converter for receiving the heat from this combustion means at the high temperature side, transferring the heat from the low temperature side to a heat exchanger, and generating electric power depending on the temperature difference between the high temperature side and the low temperature side, heat medium forced circulating means driven by the generated power of the thermoelectric converter for transferring the heat medium to the heat exchanger, and heat releasing means for releasing heat by circulating the heat medium exchanged of heat by the heat exchanger.

By heating the combustion means, the thermoelectric converter receives the combustion heat from the combustion means at its high temperature side, which is heated to high temperature. The heat is further transferred from the high temperature side to the low temperature side of the thermoelectric converter, and the heat is transferred to the heat exchanger. Since the low temperature side of the thermoelectric converter is cooled by heat transfer to the heat exchanger, the thermoelectric converter generates electric power depending on the temperature difference between the high temperature side and low temperature side. The heat medium forced circulating means is driven by the generated power of the thermoelectric converter, and the heat medium is transferred to the heat exchanger, and the heat of the combustion means is exchanged with the heat medium. The heat medium circulates in the heat releasing means to release heat, and returns to the heat medium forced circulating means to transfer heat.

That is, while heating the thermoelectric converter by the combustion means, the heat exchanger can be heated through this thermoelectric converter, and as the heat exchanger is heated, the temperature difference between the high temperature side and low temperature side of the thermoelectric converter can be obtained rationally and sufficiently. It hence does not require separate bypass water feed path branched off the circulating water path, and the problem of complicated and large constitution is solved.

Moreover, the heat medium forced circulating means is driven by the generated power of the thermoelectric converter, without using external power source, and as compared with the case of using the battery, it is free from trouble of replacing the batteries, expenses of batteries do not occur and it is economical, and the apparatus is reduced in size and weight and is hence convenient for portable use.

By the generated power of the thermoelectric converter, the heat medium forced circulating means is driven, and the heat of the combustion means is exchanged with the heat medium, and heat is circulated and released by the heat releasing means, so that the warmth may be kept.

In the heat transfer apparatus of the invention, the heat exchanger is preferred to exchange heat between the heat medium and both the heat transmitted through the thermoelectric converter and the heat transmitted directly from the combustion means, as the constitution for receiving heat directly from the combustion means, and therefore if the heat transmitted through the thermoelectric converter is too small, the heat directly transmitted from the combustion means is added, and therefore the heat medium can be heated appropriately, and the combustion means does not elevate the temperature excessively due to insufficient transfer of heat, so that combustion will not be stopped by the safety device. Still more, the constitution is simple because heat is transmitted to the same heat exchanger from two routes.

In the heat transfer apparatus of the invention, the combustion means is provided with combustion emission exhaust port, and preferably the thermoelectric converter and/or heat exchanger is heated by the combustion emission from this combustion emission exhaust port, and in addition to the above effects, the efficiency of the apparatus itself is enhanced because of direct contact with the combustion emission.

The heat transfer apparatus of the invention further comprises a main feed valve for opening and closing supply of fuel of the combustion means, a combustion detection solenoid of which coil is excited by the generated power of the thermoelectric converter so as to attract and hold the movable valve unit by its magnetic force, and a combustion operation mechanism coupling the main feed valve and the movable valve unit of the combustion detection solenoid, and therefore the safety is assured by detecting presence or absence of combustion by the generated power of the thermoelectric converter.

The heat transfer apparatus of the invention also comprises a battery for feeding electric power to the heat medium forced circulating means, a changeover switch for changing over the electric power supply source to the heat medium forced circulating means to the thermoelectric converter or the battery, and a controller for controlling this changeover switch, in which the electric power is supplied from the battery power source while the electromotive force of the thermoelectric converter is low, and the electric power is supplied from the thermoelectric converter power source when the electromotive force of the thermoelectric converter is elevated, and therefore, if the electromotive force of the thermoelectric converter is lowered, the operation can be continued without stopping the apparatus connected to the load circuit.

In the heat transfer apparatus of the invention, further comprising a boosting circuit for boosting the power generation of the thermoelectric converter and an oscillating circuit for operating the boosting circuit, preferably, the voltage generated by the thermoelectric converter is boosted, and is supplied to the load such as the heat medium forced circulating means, and therefore even the load of high impedance can be operated by the electromotive force of the thermoelectric converter.

The heat transfer apparatus of the invention further comprises voltage detecting means for detecting the generated power of the thermoelectric converter, in which the changeover switch is operated when the voltage generated by the thermoelectric converter reaches a preset voltage, and therefore by interlocking the operation of the changeover switch with the electromotive force of the thermoelectric converter, power consumption due to excessive operation of the battery power source is prevented.

The heat transfer apparatus of the invention also comprises a controller for preventing supply of electric power to the heat medium forced circulating means from start of operation until the generated power of the thermoelectric converter reaches a specified value, feeding the electric power generated by the battery or the thermoelectric converter to the combustion detection solenoid, and stopping power feed of the battery and feeding the generated power of the thermoelectric converter to both the combustion detection solenoid and heat medium forced circulating means when the generated power of the thermoelectric converter reaches the specified value.

Accordingly, by heating the combustion means, the thermoelectric converter generates electric power. The controller does not feed power to the heat medium forced circulating means until the generated power of the thermoelectric converter reaches the specified value, and feeds the electric power generated by the battery or the thermoelectric converter to the combustion detection solenoid. When the generated power of the thermoelectric converter reaches the specified value, the controller stops power feed of the battery, and feeds the generated power of the thermoelectric converter to both the combustion detection solenoid and the heat medium forced circulating means. While the battery power is fed to the combustion detection solenoid, the power feed of the battery is stopped.

Until the generated power of the thermoelectric converter reaches the specified value, electric power is not supplied to the heat medium forced circulating means, and when battery power is fed to the combustion detection solenoid, the movable valve unit of the combustion detection solenoid can be attracted and held in a short time, and therefore the required operation time for keep opening the combustion main feed valve by force until attracted and held is shortened, and the convenience is enhanced.

Until the generated power of the thermoelectric converter reaches the specified value, electric power is not supplied to the heat medium forced circulating means, and when feeding the generated power of the thermoelectric converter to the combustion detection solenoid, all the generated power is supplied only to the combustion detection solenoid, and therefore in a short time after start of combustion of the combustion means, the movable valve unit of the combustion detection solenoid is attracted and held, so that the convenience is enhanced.

Moreover, only after the generated power of the thermoelectric converter reaches the specified value, it is supplied to the combustion detection solenoid and the heat medium forced circulating means, and therefore the operation does not become unstable due to lack of electric power, so that the both can operate stably.

The heat transfer apparatus of the invention also comprises a controller for feeding battery power to the heat medium forced circulating means from start of operation until the generated power of the thermoelectric converter reaches a specified value, feeding the electric power generated by the battery or the thermoelectric converter to the combustion detection solenoid, and stopping power feed of the battery and feeding the generated power of the thermoelectric converter to both the combustion detection solenoid and heat medium forced circulating means when the generated power of the thermoelectric converter reaches the specified value.

Accordingly, from start of operation until the generated power of the thermoelectric converter reaches the specified value, when feeding the battery power to the combustion detection solenoid and heat medium forced circulating means, the movable valve unit of the combustion detection solenoid can be attracted and held in a short time, and the heat medium can be also transferred, and transfer of heat value to the heat releasing unit is quick, the temperature rises in a short time, the heat medium does not remain still, and therefore the temperature difference of the thermoelectric converter is large, and the generated power increases early.

From start of operation until the generated power of the thermoelectric converter reaches the specified value, when feeding the generated power of the thermoelectric converter to the combustion detection solenoid, and feeding battery power to the heat medium forced circulating means, all the generated power is supplied only to the combustion detection solenoid, and therefore in a short time after start of combustion of the combustion means, the movable valve unit of the combustion detection solenoid is attracted and held.

Moreover, only after the generated power of the thermoelectric converter reaches the specified value, it is supplied to the combustion detection solenoid and the heat medium forced circulating means, and therefore the operation does not become unstable due to lack of electric power, so that the both can operate stably.

The heat transfer apparatus of the invention further comprises storage means for storing electric power from the thermoelectric converter, and a controller, in which until the stored power in the storage means reaches a specified value, power supply is stopped or battery power is supplied to the heat medium forced circulating means, and the generated power of the thermoelectric converter is supplied into the combustion detection solenoid, and when the stored power of the thermoelectric converter reaches the specified value, the generated power of the thermoelectric converter is continuously supplied into the combustion detection solenoid, and the electric power stored in the thermoelectric converter is supplied into the heat medium forced circulating means.

By heating the combustion means, the thermoelectric converter generates electric power. Until the electric power stored in the thermoelectric converter reaches the specified value, power supply is stopped or the battery power is supplied to the heat medium forced circulating means. The generated power of the thermoelectric converter is supplied to the combustion detection solenoid and is also stored in the storage means. When the storage in the storage means reaches the specified value, the controller causes the heat medium forced circulating means to release heat, and the generated power of the thermoelectric converter is continuously supplied to the combustion detection solenoid. In this case, if the battery power is supplied to the heat medium forced circulating means, the supply of battery power is stopped. As the storage means releases power, the stored power decreases gradually, and when the discharged power drops below the driving power of the heat medium forced circulating means, the controller stops discharging, and stores again the generated power of the thermoelectric converter. If the battery is used, it is changed to the battery power feed. This operation is repeated thereafter, and the operation continues.

If the battery power is supplied to the heat medium forced circulating means until the stored power reaches the specified value, since the stored power is discharged into the heat medium forced circulating means, the battery life is extended. The thermoelectric converter is not required to generate always the electric power corresponding to the driving power of the heat medium forced circulating means, so that the thermoelectric converter may be small in size and weight. If the combustion heat amount of the combustion means fluctuates and changes to the smaller generated power side, the heat medium forced circulating means can be driven.

The heat transfer apparatus of the invention also comprises a controller for stopping supply of electric power, feeding battery power to the heat medium forced circulating means, and feeding battery power to the combustion detection solenoid from start of operation until the stored power in the thermoelectric converter reaches a specified value, and supplying the generated power of the thermoelectric converter or the battery power to the combustion detection solenoid, and supplying the stored power of the thermoelectric converter to the heat medium forced circulating means when the stored power of the thermoelectric converter reaches the specified value.

If the battery power is supplied to the heat medium forced circulating means until the stored power reaches the specified value, since the stored power is discharged into the heat medium forced circulating means, the battery life is extended. The thermoelectric converter is not required to generate always the electric power corresponding to the driving power of the heat medium forced circulating means, so that the thermoelectric converter may be small in size and weight. If the combustion heat amount of the combustion means fluctuates and changes to the smaller generated power side, the heat medium forced circulating means can be driven.

The heat transfer apparatus of the invention also comprises a controller for controlling electric power supply to the heat medium forced circulating means, and the controller is designed to control the supply power to the heat medium forced circulating means to a preset electric power so as not to surpass the upper limit of the electromotive force of the thermoelectric converter, and therefore the heat medium transfer means is operated below the operation upper limit power, and the speed of the rotating system or the current of the electric system of the heat medium forced circulating means is suppressed below the limit value, and the durability is assured. Moreover, since the heat medium forced circulating means is operated by the power below the preset electric power, the upper limit of the rotating speed is suppressed, and the noise and vibration level can be kept low. Therefore, the operation of the heat medium forced circulating means is held in the optimum state.

The heat transfer apparatus of the invention also comprises a switch for turning on o off the generated power of the thermoelectric converter, a piezoelectric igniter for igniting the fuel, and an operation knob for operating the fuel operating mechanism, in which when this operation knob is turned from the stop position to the ignition position, the switch is closed to move to a position for attracting and holding the movable valve unit of the combustion detection solenoid, and the main feed valve is opened to strike a spark in the piezoelectric igniter to ignite the combustion means, and when turned from the stop position in the reverse direction, the switch from the thermoelectric converter to the combustion detection solenoid is opened, thereby stopping the operation.

According to this invention, when the operation knob is turned from the stop position to the ignition position, igniting securely and burning normally, as far as the power generation is sufficient, the combustion detection solenoid continues to attract and hold the movable valve unit, and combustion operation is continued. When the operation knob is turned in the reverse direction, the electric power circuit to the combustion detection solenoid is shut off by the switch, and the movable valve unit is disengaged by the repulsive force of the spring, and the fuel main feed valve is closed, supply of fuel is stopped, and the combustion ceases.

Thus, the ignition operation is executed by the operation knob, and the ignition can be confirmed by the operator himself, there is a feel of relief. At the same time, the constitution is simple and the manufacturing cost is low. Moreover, the fire can be extinguished by reverse rotation of the operation knob, and ignition and extinction can be done by simple operation, and the convenience is enhanced.

The heat transfer apparatus of the invention comprises a heat medium temperature overheat switch for detecting the heat medium temperature, and when the heat medium temperature rises too high, the electric power circuit to the combustion detection solenoid is opened, and fuel supply is stopped, and therefore when the heat medium temperature becomes abnormally high due to closing of heat medium passage or trouble in the heat medium forced circulating means, the heat medium temperature overheat switch for detecting the heat medium temperature is operated, and the electric power circuit to the combustion detection solenoid is opened, and excitation of the coil is stopped, the movable valve unit is disengaged by the repulsive force of the spring, the fuel main feed valve is closed and combustion ceases. That is, since the combustion is stopped by detecting the heat medium temperature closer to the final output, instead of the temperature of the combustion means remote from the final output, the safety is maintained securely.

In the heat transfer apparatus of the invention, when the combustion means is changed from normal combustion to imperfect combustion or misfiring state as detected by the combustion detection solenoid, the generated power of the thermoelectric converter is lowered, and the movable valve unit of the combustion detection solenoid for closing the fuel passage is disengaged, and the fuel is stopped, so that the safety is assured if the combustion means is changed from normal combustion to imperfect combustion or misfiring state.

In the heat transfer apparatus of the invention, a gas capturing container is provided in part of the heat medium passage, and this gas capturing container has flow-in and flow-out paths of heat medium, and the flow inlet of the flow-out path is positioned in the gap capturing container, and therefore the gas component in the heat medium can be separated in the gap capturing container, and the heat medium circulates in a state after removal of the gas component, so that the efficiency may be enhanced.

The heat transfer apparatus of the invention comprises liquid level detecting means provided near the flow inlet of the flow-out path in the gas capturing container, and it is designed to emit a liquid level drop signal when the detection signal entered from the liquid level detecting means reaches a preset detection level, and regardless of the direction of the gas capturing container, therefore, the gas component flowing in from the liquid flow-in path stays in the upper part of the flow inlet of the liquid flow-out path, and flowing of the gas component into the liquid flow-out path is prevented, and before the gas component flows into the liquid flow-out path, it is noticed that the liquid level is lowered, so that the liquid conveying and circulating system can be held in stable operating state.

Further, the heat transfer apparatus of the invention comprises a heat medium passage for circulating heat medium by sequentially connecting heat medium forced circulating means, heat exchanger, and heat releasing means, a fuel feeder for feeding fuel to combustion means, temperature regulation switching means for opening and closing fuel passage depending on the temperature, and a temperature regulation variable mechanism for regulating the temperature by varying the temperature in the portion having the temperature regulation switching means, and the temperature of the temperature regulation switching means portion can be varied by the temperature regulation variable mechanism, so that the temperature of the heat medium can be adjusted.

The heat transfer apparatus of the invention, moreover, comprises temperature regulation switching means for opening or closing supply of fuel by driving by the generated power of the thermoelectric converter, temperature detecting means for detecting the temperature of the combustion means, a temperature regulation controller operating by the generated power of the thermoelectric converter, for controlling the driving of the temperature regulation switching means by receiving temperature detection of the temperature detecting means, and having setting means of adjusting temperature, and a temperature regulation switching means drive unit for starting operation for feeding fuel by opening the temperature regulation switching means for heating the combustion means before the thermoelectric converter generates power upon start of operation.

According to this construction, since the temperature detecting means and temperature regulation controller operate electrically, it is possible to prevent stopping of the heat medium forced circulating means as the starting and stopping period of combustion becomes short, and the generated power is lowered, and hence the apparatus operates stably. Moreover, since the supply of fuel is opened or closed by the temperature regulation switching means driven by electric power, the fuel can be opened and closed securely, and it prevents such phenomena as injection of slight fuel although combustion flame is put out or failure of combustion in spite of injection of slight fuel, and the heat medium temperature can be controlled stably, and it can be also usable in thermotherapy or the like. Further, by the temperature detecting means for detecting temperature electrically and the temperature regulation controller having the setting means of the conditioning temperature, the temperature regulation range of the heat medium can be changed steplessly, and the scope of application is expanded. In addition, utilizing power generation of the thermoelectric converter, as compared with the constitution for operating the temperature detecting means and temperature regulation controller electrically by using battery or the like, the labor for replacing the batteries is saved, and the convenience is enhanced.

Moreover, the heat transfer apparatus of the invention comprises a thermoelectric converter for generating electric power depending on temperature difference, combustion means for giving heat to this thermoelectric converter, a heat exchanger for exchanging heat with the heat medium by the heat transmitted through the thermoelectric converter, heat medium forced circulating means for conveying heat medium by driving by the generated power of the thermoelectric converter, heat releasing means for releasing heat by circulating the heat medium exchanged of heat by the heat exchanger, a combustion detection solenoid for attracting and holding the movable valve unit when the coil is excited, ignition means for igniting the combustion means, a temperature detector for detecting the temperature of the combustion means, ignition judging unit judging ignition of the combustion means by the output of the temperature detector, and controlling power supply to the combustion detection solenoid, a temperature regulator for judging the combustion means temperature correlating with the heat medium temperature by the output of the temperature detector, for conditioning the temperature of the heat medium, and controlling power supply to the fuel amount controller, a controller operated by battery for controlling driving of the ignition means and combustion detection solenoid, and a combustion operation mechanism for starting operation of the controller while moving to a position for attracting and holding the movable valve unit of the combustion detection solenoid by ignition operation.

According to this construction, by the ignition operation, the combustion operation mechanism moves the movable valve unit of the combustion detection solenoid to the position for attracting and holding, and the fuel main feed valve is opened, thereby starting operation of the controller. When power is supplied to the controller, the fuel amount controller is opened, and fuel is supplied into the combustion means, and the ignition unit strikes a spark electrically, and the fuel is ignited. As the fuel is ignited and the combustion means is heated, the temperature of the combustion means detected by the temperature detector is raised, and the judging unit judges that the fuel is ignited, and combustion is continued. At the same time, the thermoelectric converter receives the combustion heat of the combustion means at its high temperature side, and transfers heat from the low temperature side to the heat exchanger, and generates an electric power depending on the temperature difference between the high temperature side and low temperature side. When the generated power reaches the value enough for driving the heat medium forced circulating means, the heat medium forced circulating means is driven to transfer the heat medium, and the heat medium is exchanged of heat in the heat exchanger, and heat is transferred to the heat releasing means, and the heat medium returns to the heat exchanger after heat releasing. The temperature of the heat medium is regulated as follows. When the combustion continues and the heat medium temperature rises, the temperature of the combustion means also climbs up in correlation, but when the temperature of the combustion means detected by the temperature detector reaches the preset temperature, the temperature regulator closes the fuel amount controller to stop the combustion, and when the temperature drops, combustion is started again. This operation is repeated thereafter, and the temperature is regulated.

When stopping the combustion operation, by stopping operation, the controller stops supply of electric power to the combustion detection solenoid, and excitation of coil is stopped, and the movable valve unit is disengaged by the repulsive force of the spring, and the fuel main feed valve is closed through the combustion operation mechanism. As a result, supply of fuel is stopped, and the combustion ceases.

In this way, ignition, combustion and extinction operations are carried out, and since the heat medium forced circulating means that requires the largest electric power is driven by the generated power of the thermoelectric converter, the battery is not consumed in a short period but is used for a long period. The battery is used as the power source for combustion detection solenoid, fuel amount controller, ignition unit and controller, and the ignition, extinction, combustion, heat medium temperature regulation are done by electronic control, so that a stable operation is realized. Moreover, a display unit is provided, and the ignition state is exhibited clearly, and the convenience of use is enhanced.

In the heat transfer apparatus of the invention, the generated power of the thermoelectric converter is supplied into the heat medium forced circulating means and combustion detection solenoid, and the ignition judging unit controls the power supply to the combustion detection solenoid from the thermoelectric converter, and by ignition operation, battery power is supplied into the controller, and operation starts, and the circuit from the thermoelectric converter to the combustion detection solenoid is connected. When the combustion means starts combustion, the combustion detection solenoid generates electric power, and the generated power is supplied into the combustion detection solenoid. Consequently, the coil is excited, and the movable valve unit is attracted and held, and combustion continues through the combustion operation mechanism. When the temperature detector detects the temperature of the combustion means reaching the specified temperature, ignition can be detected earlier than judgement of completion of ignition. Moreover, the battery does not feed power to the combustion detection solenoid, and the life is extended.

In the heat transfer apparatus of the invention, the heat medium forced circulating means employs a brushless motor for the driving motor, and power to the motor coil of the brushless motor is supplied from the generated power of the thermoelectric converter, and it further comprises a motor controller for controlling the power supply from the thermoelectric converter into the motor coil, and this motor controller is preferred to operate by the battery power, so that the battery power is not supplied to the motor coil of the brushless motor of the heat medium forced circulating means, but is supplied into the controller having the motor controller for sequentially changing over and supplying the generated power of the thermoelectric converter into a plurality of motor coil, so that the battery life may be extended.

In the heat transfer apparatus of the invention, the electric power to the combustion detection solenoid and heat medium forced circulating means is supplied from the battery when the generated power of the thermoelectric converter is below a specified value, and is changed over to the generated power of the thermoelectric converter above the specified value.

According to this construction, by ignition operation, the combustion operation mechanism moves the movable valve unit of the combustion detection solenoid to the attracting and holding position, and opens the fuel main feed valve, and starts operation of the controller. When the battery power is supplied into the controller, the controller opens the fuel amount controller by the battery power, and also the ignition unit is put in operation to start ignition operation. When the fuel amount controller opens, since the fuel main feed valve is also open, the combustion fuel is supplied into the combustion means, and the ignition unit strikes a spark to ignite the fuel. As the combustion means starts combustion, the thermoelectric converter generates electric power. The ignition judging unit detects the generated power, and when reaching the specified value, it is judges that the combustion means has ignited, and power supply to the combustion detection solenoid is changed over from the battery to the generated power of the thermoelectric converter.

In consequence, when the generated power of the thermoelectric converter reaches the specified value, the controller changes over the power supply to the fuel amount controller from the battery to the generated power of the thermoelectric converter.

Moreover, when the generated power of the thermoelectric converter reaches the specified value, the controller changes over the power supply to the heat medium forced circulating means from the battery to the generated power of the thermoelectric converter.

When the brushless motor is used in the forced circulating means, the power supply to the motor coil is changed over from the battery to the generated power of the thermoelectric converter.

In the case of temperature regulation of the heat medium, further, when the temperature of the combustion means detected by the temperature detector reaches the specified temperature, the temperature regulator blocks the fuel amount controller, and stops combustion, and when the generated power of the thermoelectric converter declines, the controller changes over the power supply to the heat medium forced circulating means to the battery. When combustion is resumed and the generated power of the thermoelectric converter exceeds the specified value, the controller changes over the power supply to the generated power of the thermoelectric converter, and the same operation is repeated thereafter. Thus, right after start of operation, stable operation is realized by the supply of battery power, and when the generated power of the thermoelectric converter exceeds the specified value, it is changed over to the generated power of the thermoelectric converter, so that the battery life can be extended.

When exceeding the specified value, the power supply to the combustion detection solenoid is changed over from the battery to the generated power of the thermoelectric converter, and completion of ignition is judged, so that the ignition is detected earlier than when judging the completion of ignition by the temperature detector when the temperature of the combustion means has reaches the specified value.

The heat medium forced circulating means generally employs a motor, and it requires the largest electric power when starting up. When the generated power of the thermoelectric converter is close to the electric power required for starting up the heat medium forced circulating means, and it fails in starting, the heat medium does not flow, and the temperature difference contracts, and starting is not successful as far as the combustion continues, but since the battery power is supplied right after start of operation, the heat medium forced circulating means is started securely.

In temperature regulation, by stopping combustion, if the generated power of the thermoelectric converter declines, it is changed over to the battery power, and the heat medium forced circulating means is stably driven continuously without stopping, and the heat medium is transferred.

The heat transfer apparatus of the invention further comprises aluminum laminate sheets of multilayer structure laminating both sides of an aluminum foil with a resin material, and heat releasing means overlaying the aluminum laminate sheets, forming a heat medium passage for passing heat medium in the portion not sealed by fusing, and fusing and sealing other parts than the heat medium passage with each other, and since the heat medium passage for passing the heat medium is formed in the portion of the aluminum laminate sheets not sealed by fusing, flow-out of the aluminum laminate sheet to outside of the heat medium is prevented, and stable heat transfer for a long period is assured. Moreover, since the aluminum laminate sheet itself is used as the heat medium passage, an outstandingly excellent flexibility is obtained, and further since the aluminum laminate sheet itself is contacting with the heat medium, the aluminum foil exhibits the uniform heating effect, and when used and worn on the human body as the heating jacket or mat, the sense of comfort is further enhanced.

Moreover, the heat transfer apparatus of the invention includes a detachable joint for connecting and separating the unit main body accommodating the thermoelectric converter, combustion means, heat medium forced circulating means and heat exchanger, and the heat releasing means, so that it is possible to separate from the heating means without leaking the internal heat medium through the detachable joint provided in the heat medium passage.

The heat transfer apparatus of the invention is a warming device using any one of the heat transfer apparatuses mentioned above, and it can uniformly warm the warming device such as jacket, trousers, mat, lap blanket, and wheelchair mat, and the temperature distribution is improved and the sense of comfort is enhanced.

DETAILED DESCRIPTION OF THE INVENTION

Figure 1:
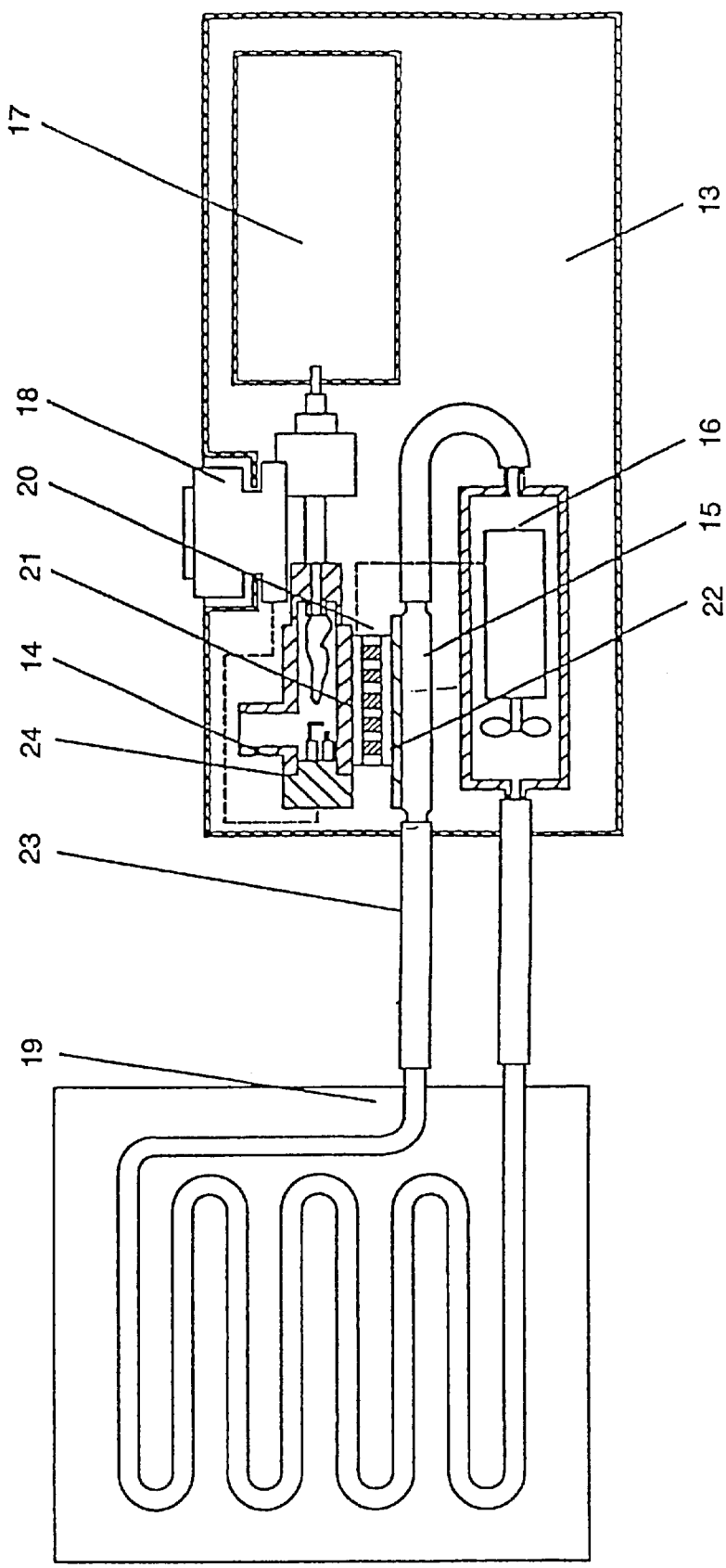
FIG. 1 is a structural diagram of a heat transfer apparatus in embodiment 1 of the invention.

Referring now to the drawing, preferred embodiments of the invention are described in detail below.

(Embodiment 1)

FIG. 1 is a structural diagram of a heat transfer apparatus in embodiment 1 of the invention.

As shown in the diagram, the heat transfer apparatus incorporates, in its apparatus main body 13, combustion means 14, a heat exchanger 15 for exchanging the heat of the combustion means 14 with heat medium, heat medium forced circulating means 16 comprising a pump for conveying the heat medium and others, a fuel container 17 for supplying, for example, gas as the energy source for the combustion means 14, and an operation unit 18 for manipulating the operation. Heat release means 19 has one end connected to the heat medium forced circulating means 16, and the other end connected to the heat exchanger 15, so that the heat medium exchanged of heat in the heat exchanger 15 is circulated to release heat. A thermoelectric convertor 20 is disposed between and in contact with both the combustion means 14 and heat exchanger 15, and the heat of the combustion means 14 is received at its high temperature side 21, and this heat is transferred from its low temperature side 22 to the heat exchanger 15. By this heat transfer, a temperature difference occurs between the high temperature side 21 and low temperature side 22, and an electric power depending on this temperature difference is generated, and the heat medium forced circulating means 16 is driven by this electric power. A transfer tube 23 is made of an elastic material and is disposed in the heat releasing means 19, and one end is connected to the heat medium forced circulating means 16 and the other end is connected to the heat exchanger 15, so that the heat medium is circulated to release heat. The combustion means 14 is constructed so as to surround the combustion flame with its body 24.

The operation and action in this embodiment will now be described. When started by the operation unit 18, the gas is supplied as fuel from the fuel container 17 to the combustion means 14, and is ignited at the same time, and the combustion means 14 starts combustion. The combustion heat of the combustion means 14 is received at the high temperature side 21 of the thermoelectric converter 20, and its temperature becomes high. The heat is further transferred from the high temperature side 21 to the low temperature side 22 of the thermoelectric converter 20, and is transmitted to the heat exchanger 15. Since the low temperature side 22 of the thermoelectric converter 20 is cooled as the heat is transmitted to the heat exchanger 15, a temperature difference occurs between the high temperature side 21 and low temperature side 22 of the thermoelectric converter 20, and an electric power depending on this temperature difference is generated. The heat medium forced circulating means 16 is driven by the generated power of the thermoelectric converter 20, and the heat medium is transferred to the heat exchanger 15, and the heat of the combustion unit 14 transmitted through the thermoelectric converter 20 is exchanged with the heat medium. The heat medium is further circulated into the heat releasing means 19, and returns to the heat medium forced circulating means 16. In this way, the heat is transferred.

In the combustion means 14, the heat exchanger 15 is heated through the thermoelectric converter 20, and by heating of the heat exchanger 15, the temperature difference between the high temperature side 21 and low temperature side 22 of the thermoelectric converter 20 is obtained rationally and sufficiently. Therefore, unlike the prior art, it does not require a bypass water feed path that is branched off the circulating water path, and the problem of a complicated and large construction is solved. In the conventional construction, the majority of the heat value of the burner 8 was directly exchanged of heat with warm water by heating the heat exchanger 4, and the thermoelectric converter 6 was heated by the heat value of low rate, and the generated power was small and the pump 5 could not be driven, but such problems are eliminated in the first embodiment so that the heat medium forced circulating means 16 can be driven securely. Moreover, not requiring the bypass water feed path 10 branched off the circulating water path 2, as in the prior art, the construction is simplified.

Meanwhile, since the combustion means 14 surrounds the combustion flame by the body 24, the combustion flame does not contact directly with the high temperature side 21 of the thermoelectric converter 20, but the combustion heat is received through the body 24, and therefore the high temperature side 21 of the thermoelectric converter 20 receives the heat uniformly. Usually, solder (not shown) is used in the thermoelectric converter 20, and when heated unevenly, the hottest portion may exceed the solder melting point (about 200), and the solder may melt down to result in malfunction, but such problem is solved and the reliability is enhanced.

On the other hand, the heat medium enters the heat releasing means 19 through the transfer tube 23, and after releasing heat in the heat releasing means 19, it passes through the transfer tube 23 and returns to the heat medium forced circulating means 16. That is, through the transfer tube 23, the heat can be transferred to the heat releasing means 19 by the length of the transfer tube 23, so that it can be used in versatile applications.

Moreover, since the transfer tube 23 is made of a foldable flexible material, the heat releasing means 19 may be placed anywhere within the distance of the length of the transfer tube 23, and in addition since the heat releasing means 19 itself is also made of a flexible material, it can be modified freely depending on the place of installation, and versatile uses are possible.

(Embodiment 2)

Figure 2:
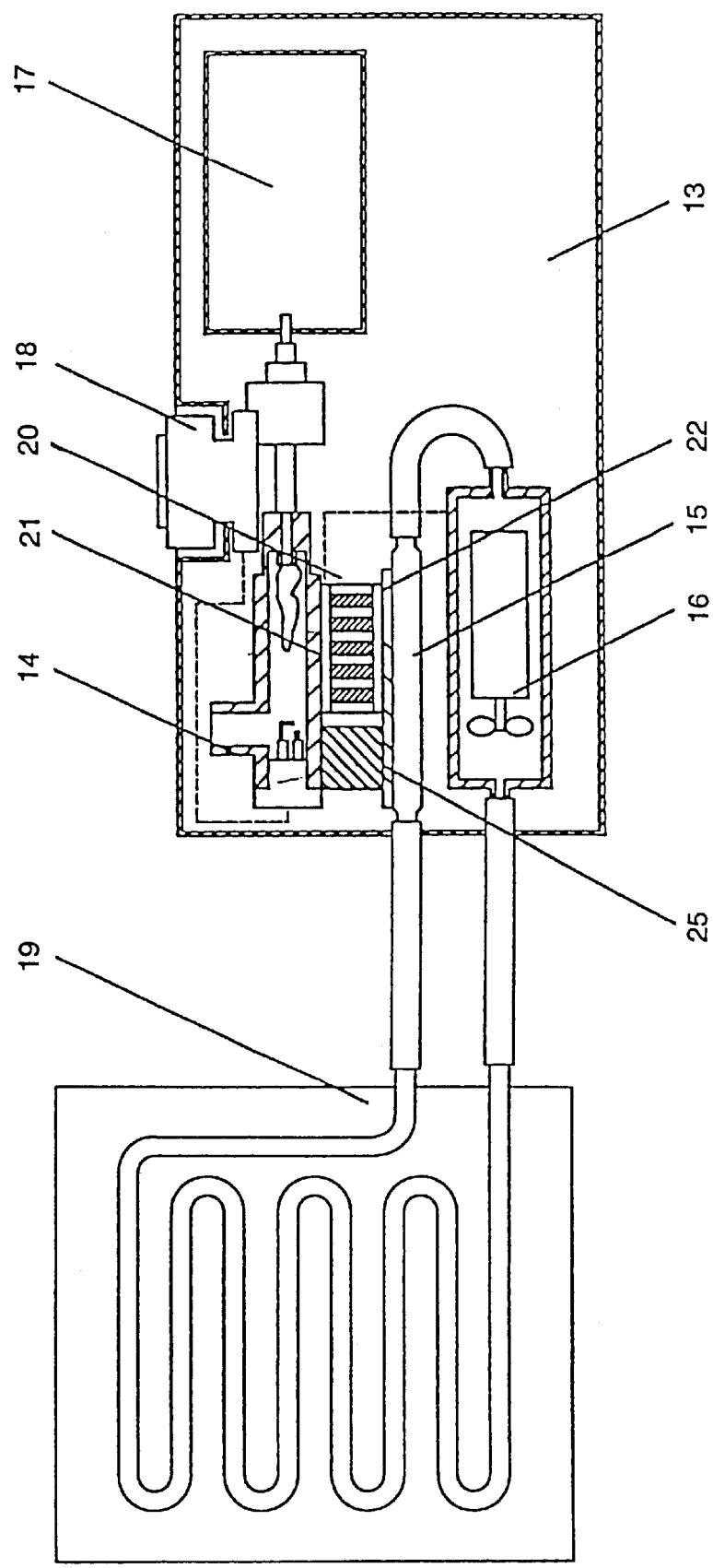
FIG. 2 is a structural diagram of a heat transfer apparatus in embodiment 2 of the invention.

FIG. 2 is a structural diagram of a heat transfer apparatus in embodiment 2 of the invention.

What differs from embodiment 1 is that the heat of the combustion means 14 transmitted through the thermoelectric converter 20 is received at the low temperature side 22 of the thermoelectric converter 20, and is also received directly by a heat transfer element 25 so as to transfer the heat to the heat exchanger 15.

The same reference numerals as in embodiment 1 refer to the same constituent parts, and duplicate explanation is omitted.

According to this construction, part of the combustion heat is directly transmitted to the heat exchanger 15 also from the heat transfer element 25. That is, the heat exchanger 15 exchanges heat between the sum of the heat transmitted through the thermoelectric converter 20 and the heat transmitted to the heat exchanger 15 through the heat transfer element 25, and the heat medium.

Therefore, if the heat transmitted through the thermoelectric converter 20 is not sufficient, the heat directly transmitted from the combustion means 14 is added, so that the heat medium can be heated appropriately, and further combustion of the combustion means 14 is not stopped by the safety device due to insufficient heat transfer and excessive rise of temperature. Moreover, since heat is transmitted to the same heat exchanger 15 from two routes, the construction is simplified.

(Embodiment 3)

Figure 3:
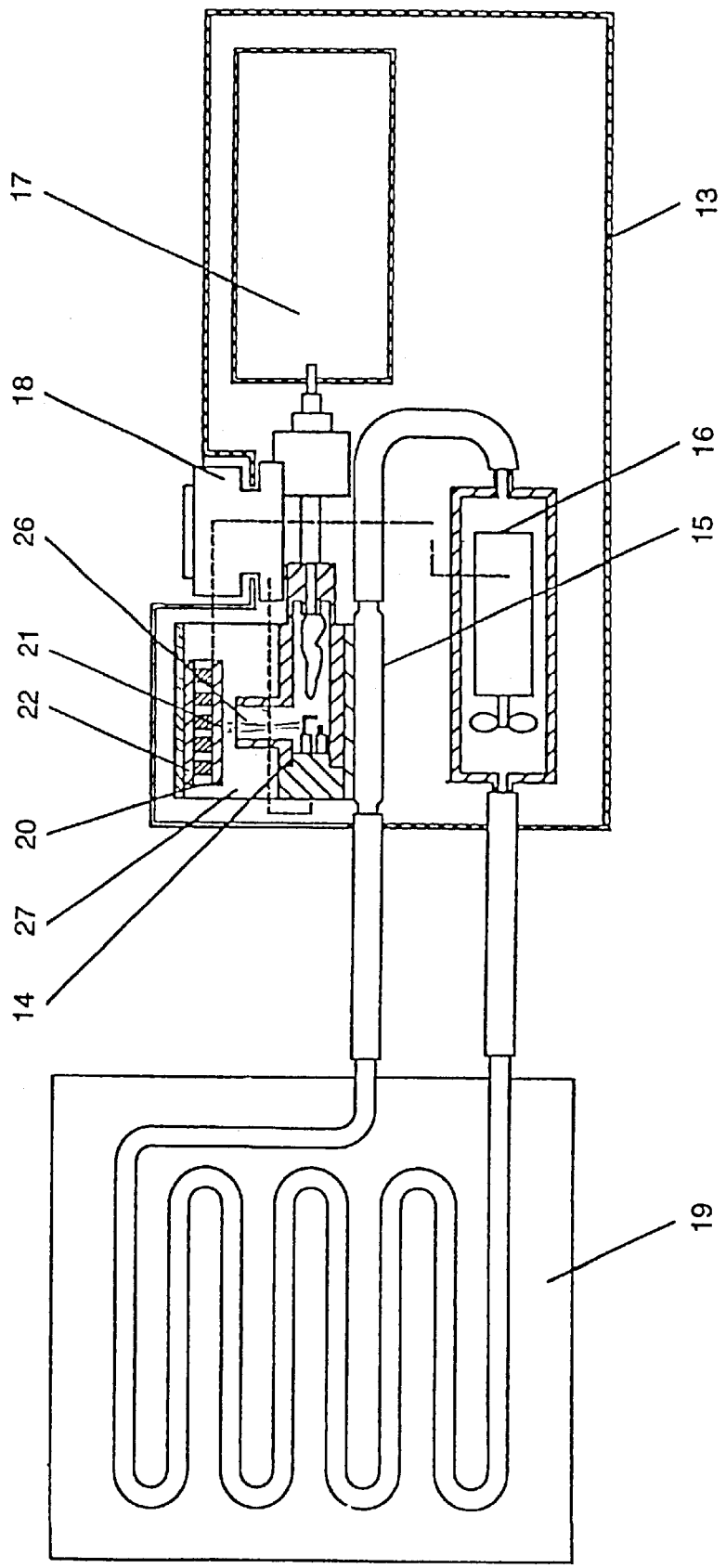
FIG. 3 is a structural diagram of a heat transfer apparatus in embodiment 3 of the invention.

FIG. 3 is a structural diagram of a heat transfer apparatus in embodiment 3 of the invention.

What differs from embodiment 1 is as follows: a combustion emission exhaust port 26 is provided in the combustion means 14, the heat of the combustion emission is received at the high temperature side 21 near this combustion emission exhaust port 26, by the temperature difference from the low temperature side 22, a thermoelectromotive force is generated by the thermoelectric converter 20, and the heat of the combustion emission of the combustion means 14 transmitted through the thermoelectric converter 20 is received from the low temperature side 22 to a heat transfer element 27 serving also as fixing means for the thermoelectric converter, while the combustion heat is also received directly from the combustion means 14, so that the heat is exchanged between the sum of the both heats and the heat medium.

The same reference numerals as in embodiment 1 refer to the same constituent parts, and duplicate explanation is omitted.

According to this construction, the heat exchanger 15 exchanges heat between the sum of the heat of the combustion emission transmitted through the thermoelectric converter 20 and the heat of the combustion means 14 directly transmitted to the heat exchanger 15, and the heat medium. That is, the heat exchanger 15 exchanges the heat with the heat medium, by both of the heat of the combustion emission transmitted through the thermoelectric converter 20 and the heat directly transmitted from the combustion means 14, and therefore if the heat transmitted through the thermoelectric converter 20 is insufficient, the heat directly transmitted from the combustion means 14 is added, and the heat medium can be heated appropriately. Moreover, since the combustion means 14 transmits the heat directly to the heat exchanger 15, combustion is not stopped by the safety device due to insufficient heat transfer and excessive rise of temperature. Still more, since the heat is transmitted to the same heat exchanger 15 through two routes, the construction is more simplified than in the prior art. Further, the heat transmitted through the thermoelectric converter 20 is the heat of the combustion emission, and thus the efficiency of the apparatus is enhanced.

(Embodiment 4)

Figure 4:
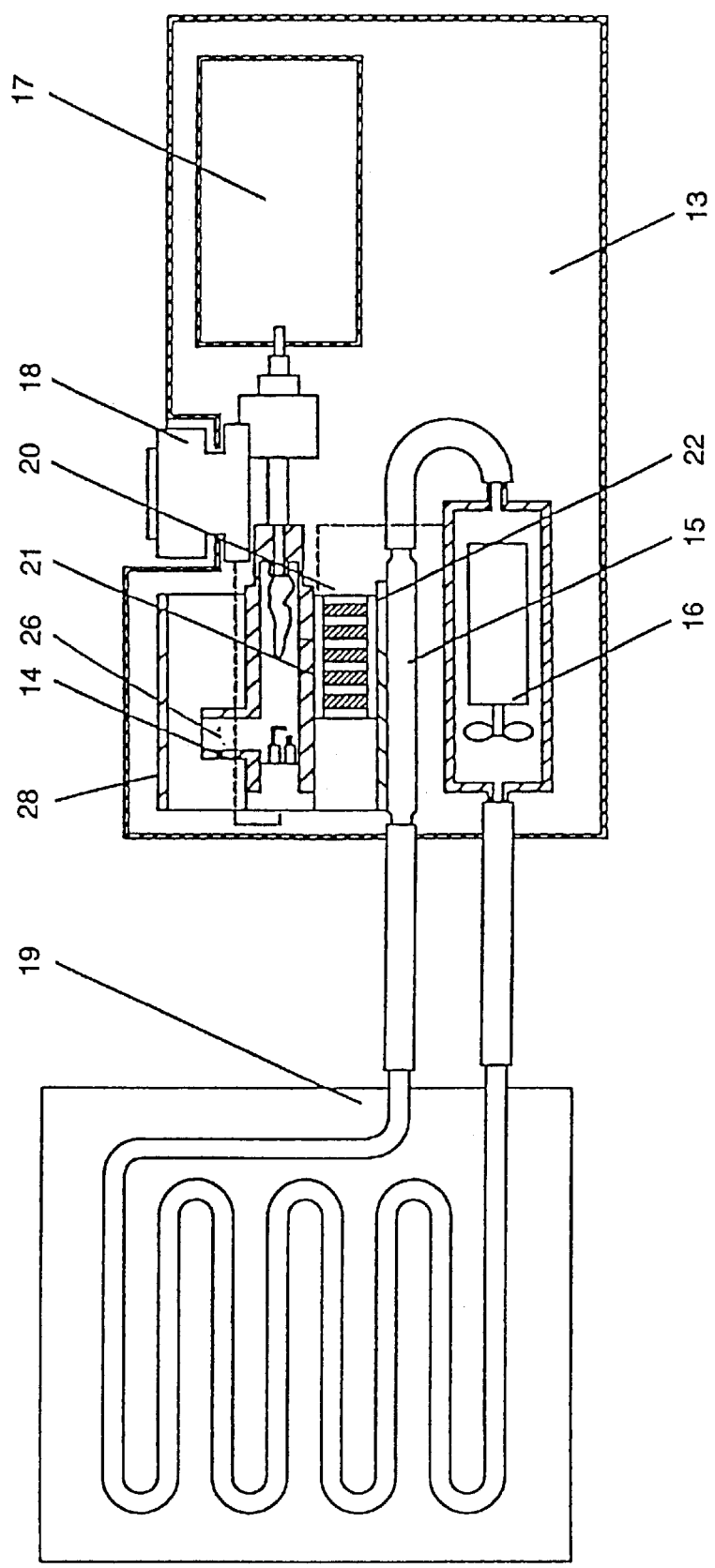
FIG. 4 is a structural diagram of a heat transfer apparatus in embodiment 4 of the invention.

FIG. 4 is a structural diagram of a heat transfer apparatus in embodiment 4 of the invention.

What differs from embodiment 1 is as follows: heat of combustion emission is received by a combustion emission heat receiving unit 28 near a combustion emission exhaust port 26 of the combustion means 14, and the sum of this heat and the heat from the thermoelectric converter 20 is transferred to the heat exchanger 15.

The same reference numerals as in embodiment 1 refer to the same constituent parts, and duplicate explanation is omitted.

According to this construction, since both the heat transmitted through the thermoelectric converter 20 and the heat of emission transmitted directly are transferred to the heat exchanger 15, and are exchanged of heat with the heat medium, if the heat transmitted through the thermoelectric converter 20 is insufficient, the heat of the emission transmitted directly is added, so that the same effects as in embodiment 3 are obtained.

(Embodiment 5)

Figure 5:
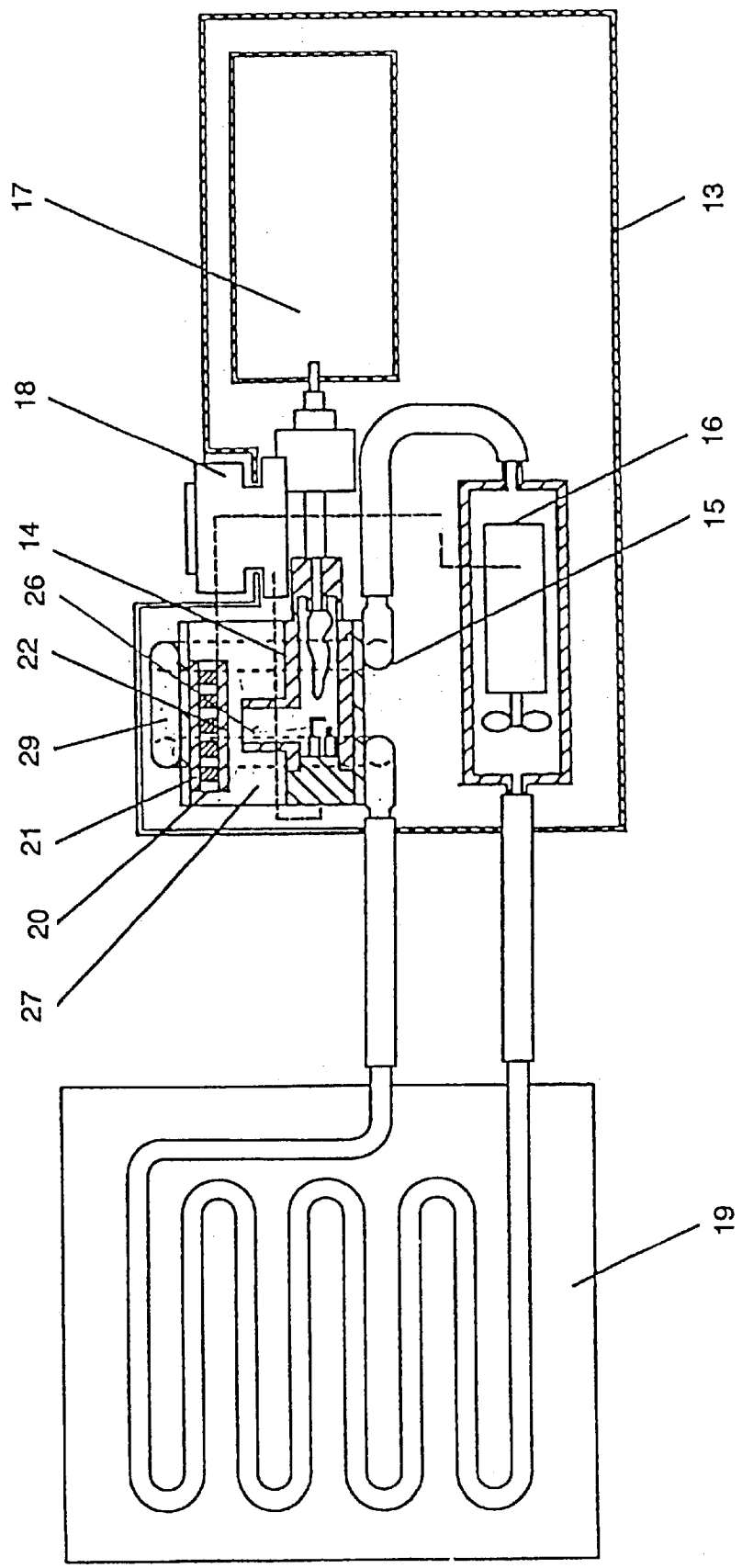
FIG. 5 is a structural diagram of a heat transfer apparatus in embodiment 5 of the invention.

FIG. 5 is a structural diagram of a heat transfer apparatus in embodiment 5 of the invention.

What differs from embodiments 3 and 4 is as follows: a heat medium passage 29 which is a part of the heat exchanger 15 is disposed near the combustion emission exhaust port 26 of the combustion means 14, and in the location for receiving also the heat of the combustion emission, so that the heat may be also received easily from the combustion emission.

The same reference numerals as in embodiments 3 and 4 refer to the same constituent parts, and duplicate explanation is omitted.

According to this construction, the heat exchanger 15 exchanges heat between the sum of the heat of the combustion means 14 transmitted through the thermoelectric converter 20 and the heat of the combustion emission directly transmitted to the heat exchanger 15, and the heat medium.

The heat transmitted through the thermoelectric converter 20, and the heat of emission directly transmitted are both transmitted to the heat exchanger 15, and the heat exchanger 15 exchanges them with the heat medium, and in this case, since the passage of heat medium is disposed in the location for receiving also the heat of the combustion emission so that the combustion emission heat may be received easily, if the heat transmitted through the thermoelectric converter 20 is insufficient, the heat of the emission transmitted directly is added efficiently, so that the heat medium may be heated appropriately. Moreover, the heat of the combustion emission is efficiently utilized for heating the heat medium, so that the efficiency of the apparatus may be further enhanced.

Incidentally, if the heat medium passage 29 is disposed in the combustion emission heat receiving unit 28 in embodiment 4, the same effects will be obtained.

(Embodiment 6)

Figure 6:
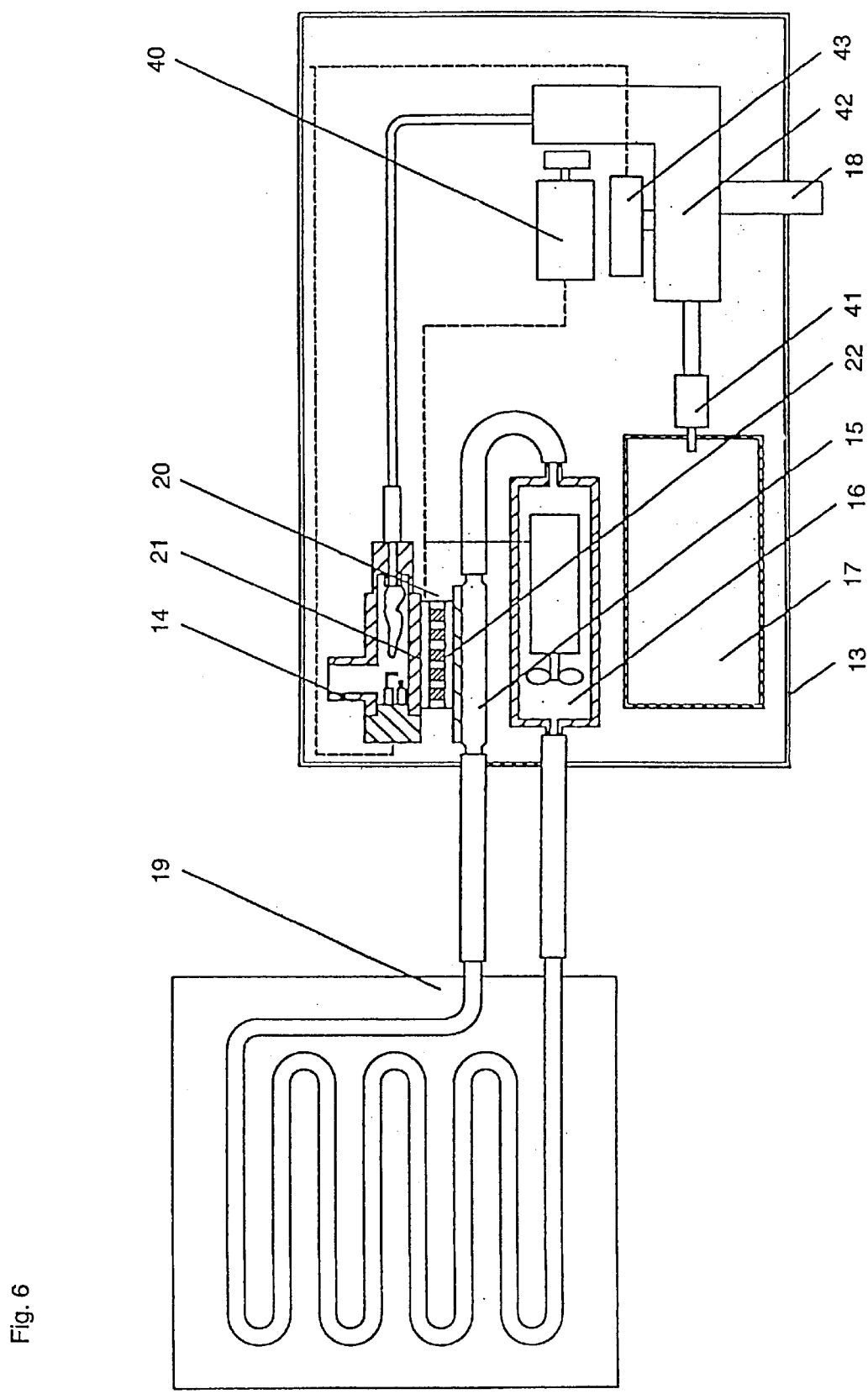
FIG. 6 is a structural diagram of a heat transfer apparatus in embodiment 6 of the invention.

FIG. 6 is a structural diagram of a heat transfer apparatus in embodiment 6 of the invention.

What differs from embodiment 1 is that it further comprises a combustion detection solenoid 40 having a coil that is excited by the generated power of the thermoelectric converter 20, for attracting and holding the movable valve unit as fuel opening and closing valve by its magnetic force, and a combustion operation mechanism 42 for interlocking and driving a main feed valve 41 at the upstream side of the combustion detection solenoid 40 and the movable valve unit of the combustion detection solenoid 40.

That is, as shown in FIG. 6, the coil of the combustion detection solenoid 40 is excited by electric power, and the movable valve unit is attracted and held by this magnetic force. The main feed valve (gas main feed valve) 41 supplies the gas in the fuel container 17 into the combustion means 14 by means of the operation unit 18. The combustion operation mechanism 42 interlocks and drives the gas main feed valve 41 and the movable valve unit of the combustion detection solenoid 40, and also interlocks and operates an ignition unit 43. The combustion detection solenoid 40 and the heat medium forced circulating means 16 are driven by the generated power of the thermoelectric converter 20.

The same reference numerals as in embodiment 1 refer to the same constituent parts, and duplicate explanation is omitted.

The operation and action are described below. Starting operation by the operation unit 18, the gas main feed valve 41 is opened by force by the combustion operation mechanism 42, and the gas flows into the combustion means 14, and the ignition unit 43 is ignited at the same time. Further, the movable valve unit of the combustion detection solenoid 40 is moved to the holding position. In this state, when the combustion means 14 starts combustion, the combustion heat of this combustion means 14 is received by the thermoelectric converter 20 at its high temperature side 21, the heat is transmitted from the high temperature side 21 to the low temperature side 22, and is further transferred to the heat exchanger 15. The thermoelectric converter 20 generates an electric power depending on the temperature difference between the high temperature side 21 and low temperature side 22. By the generated power of the thermoelectric converter 20, the coil of the combustion detection solenoid 40 is excited, and movable valve unit is attracted and held by its magnetic force. If manipulated by the operation unit 18 to open the gas main feed valve 41 by force, since the gas main feed valve 41 and the movable valve unit of the combustion detection solenoid 40 are interlocked by the combustion operation mechanism 42, the gas main feed valve 41 is maintained in open state, and the gas is supplied from the fuel container 17 into the combustion means 14, and combustion continues.

Further, the heat medium forced circulating means 16 is also driven by the generated power of the thermoelectric converter 20, and the heat medium is conveyed to the heat exchanger 15, and the heat of the combustion means 14 is exchanged of heat with the heat medium. The heat medium circulates into the heat releasing means 19 to release heat, and returns to the heat medium forced circulating means 16, so that the heat is transferred.

On the other hand, while the combustion means 14 is not burning, the thermoelectric converter 20 does not generate power. Accordingly, since the coil of the combustion detection solenoid 40 is not excited, the movable valve unit cannot be attracted and held. Since the gas main feed valve 41 and the movable valve unit of the combustion detection solenoid 40 are coupled by the combustion operation mechanism 42, the gas main feed valve 41 returns from the open state to the closed state by its own mechanical force, and gas is not supplied from the fuel container 17 into the combustion means 14. Hence, the safety is assured.

(Embodiment 7)

Figure 7:
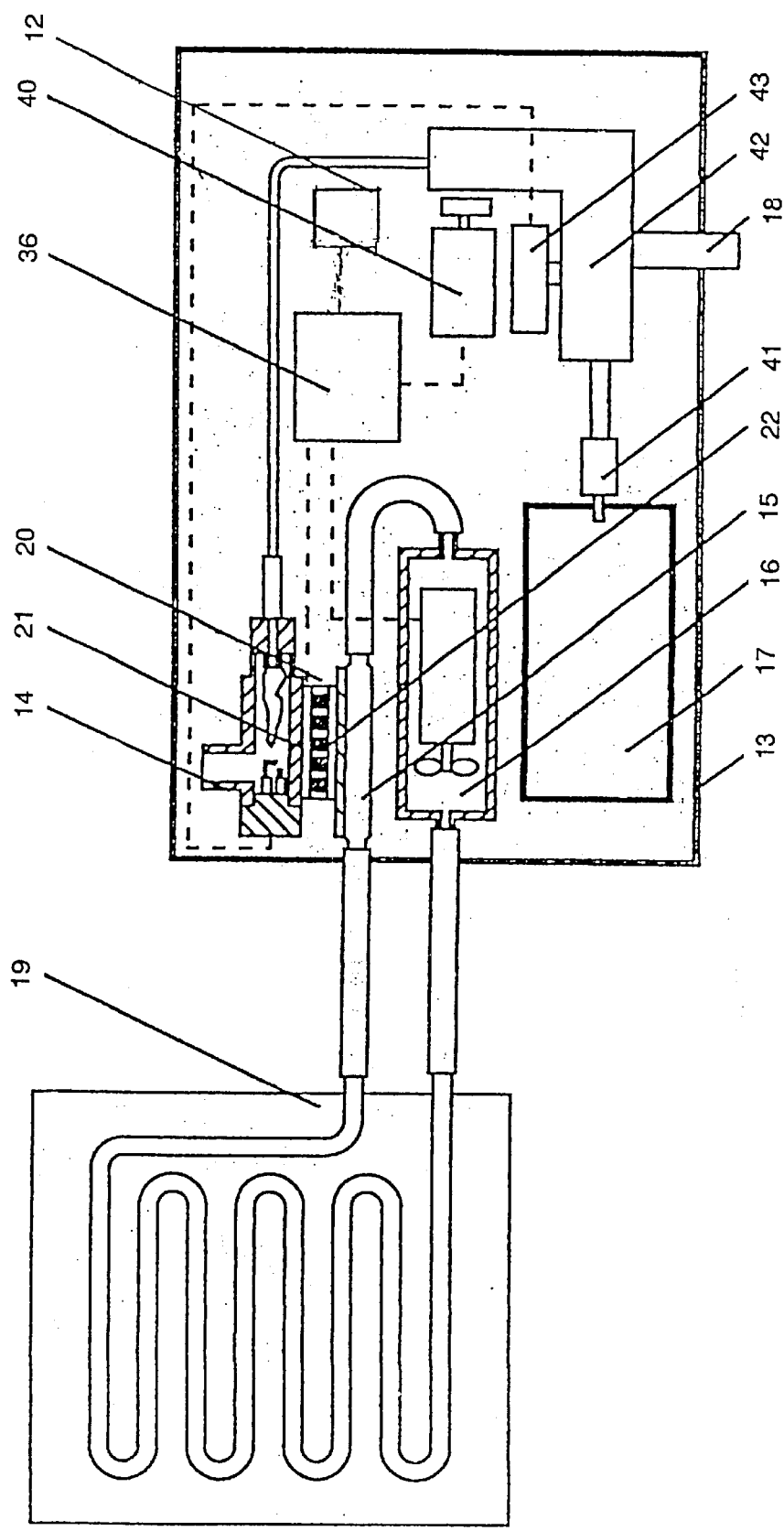
FIG. 7 is a structural diagram of a heat transfer apparatus in embodiment 7 of the invention.

FIG. 7 is a structural diagram of a heat transfer apparatus in embodiment 7 of the invention.

What differs from embodiment 6 is that a controller 36 is provided, which controls as follows: electric power is not supplied to the heat medium forced circulating means 16 from start of operation until the generated power of the thermoelectric converter 20 reaches a specified value, and the power of the battery 12 or the generated power of the thermoelectric converter 20 is supplied to the combustion detection solenoid 40, and when the generated power of the thermoelectric converter 20 reaches the specified value, power supply from the battery 12 is stopped, and the generated power of the thermoelectric converter 20 is supplied into both the combustion detection solenoid 40 and the heat medium forced circulating means 16.

Figure 8:
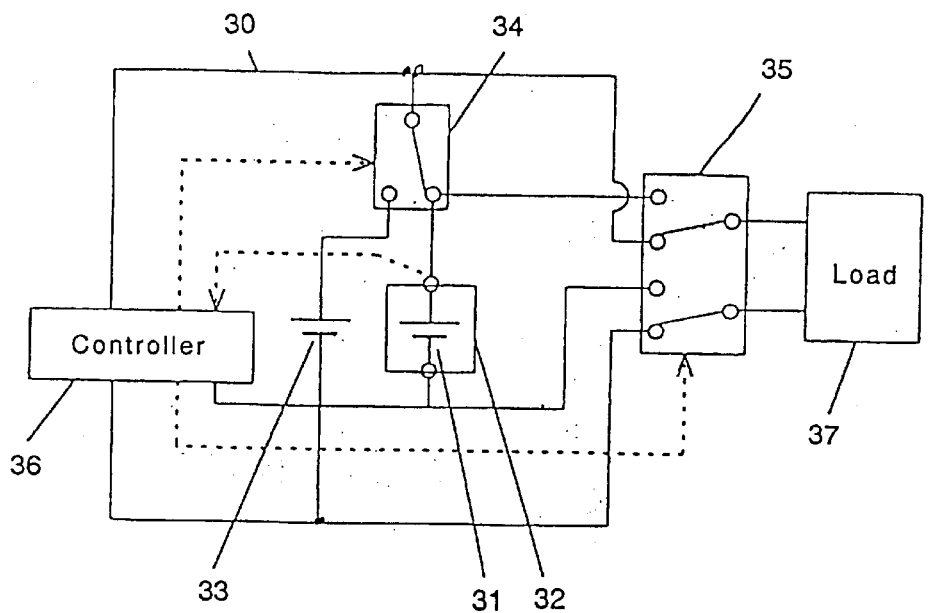
FIG. 8 is a block diagram of a power source device in the heat transfer apparatus in embodiment 7.

In this construction, the power supply unit is composed as shown in the block diagram in FIG. 8.

That is, in FIG. 8, the power supply unit 30 comprises two power sources, that is, a thermoelectric converter power source 32 having the thermoelectric converter 20 and a battery power source 33, and the two power sources are changed over by a power source selecting switch 34. In the power source selecting switch 34, the normally closed contact is connected to the battery power source 33, and the normally open contact is connected to the thermoelectric converter power source 32. A load changeover switch 35 receives a signal from the controller 36, and changes over the load 37 such as the combustion detection solenoid 40 or heat medium forced circulating means 16, and two supply power sources.

Figure 9:
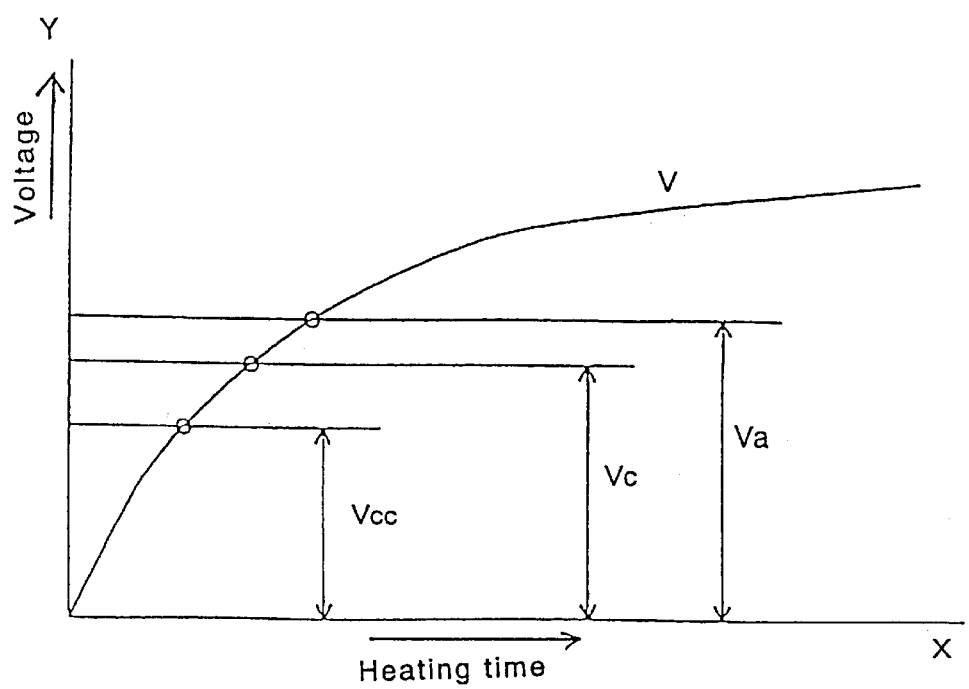
FIG. 9 is a characteristic diagram of electromotive force of a thermoelectric converter in the heat transfer apparatus in embodiment 7.

FIG. 9 shows a characteristic diagram of a thermoelectromotive force of the thermoelectric converter, in which the X-axis denotes the heating time and the Y-axis shows the electromotive force. Moreover, V is the electromotive force of the thermoelectric converter 20, Vc is the operating limit voltage for normal operation of the load 37, Va is the power source changeover voltage, and Vcc is the operating voltage of the circuit.

Explaining the operation, when the thermoelectric converter 20 is heated by a heating device, voltage V is generated as shown in FIG. 9. When the starting voltage in the initial phase of heating is below Vc, by the signal from the controller 36, the contact of the power source selecting switch 34 is connected to the normally closed side, and the load changeover switch 35 is also connected to the normally closed contact at the lower side. As a result, the power from the battery power source 33 is supplied to the load 37. The voltage of the battery power source 33 is a constant voltage higher than Vc, and the electric power is supplied in this state.

As the heating continues, when the electromotive force of the thermoelectric converter 20 is increased and the voltage exceeds Vc to be Va, a signal is issued from the controller 36, and the power source selecting switch 34 is connected to the normally open contact, and the load changeover switch 35 is connected to the normally open contact at the upper side. As a result, electric power is supplied to the load 37 from the thermoelectric converter power source 32. The electric power is supplied at a voltage higher than Va exceeding Vc.

By detecting the voltage of the thermoelectric converter 20 by voltage detecting means (not shown), when a voltage signal is fed into the controller 36, the controller 36 sends a changeover signal of higher precision to the power source selecting switch 34 and load changeover switch 35.

(Embodiment 8)

Figure 10:
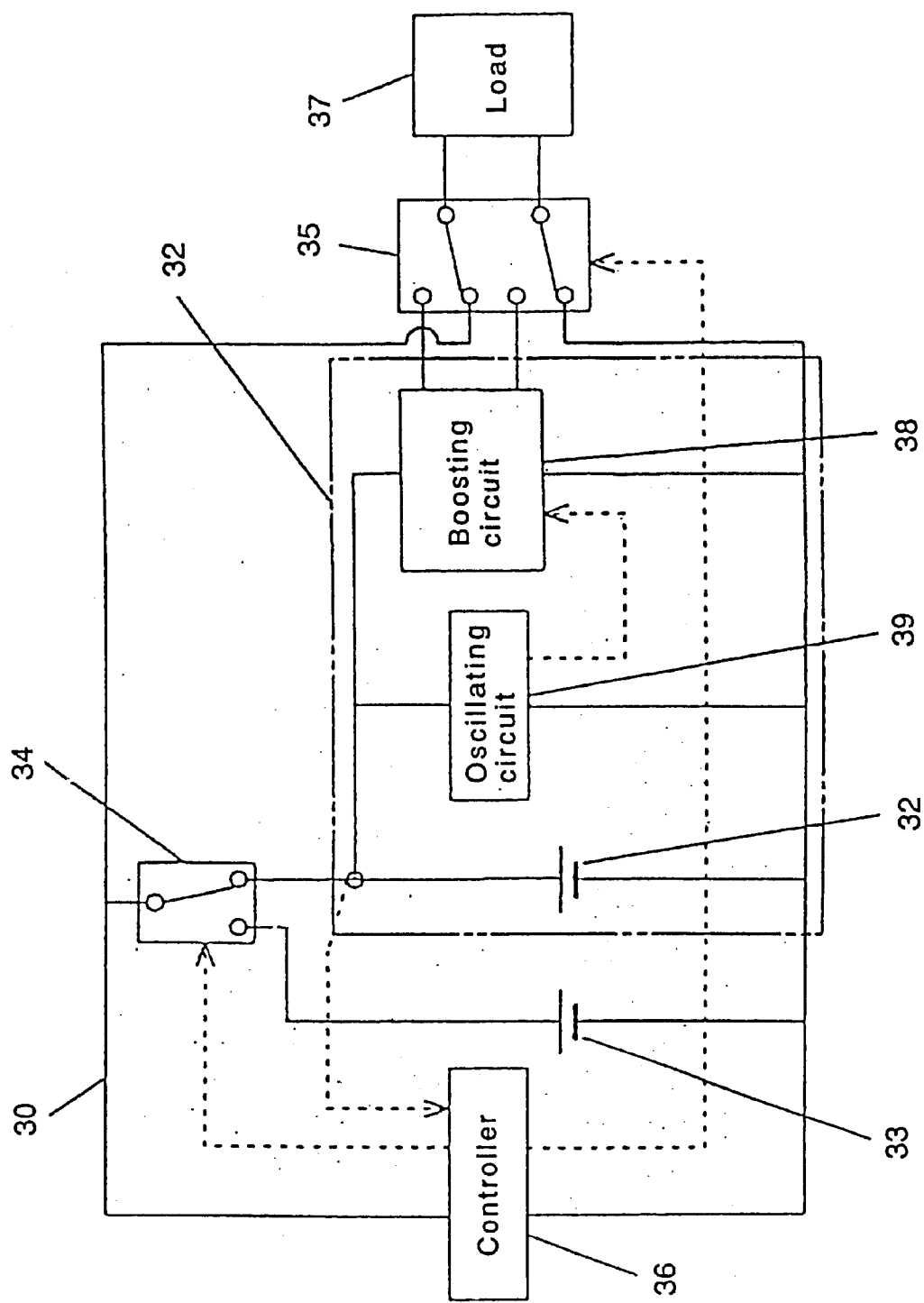
FIG. 10 is a block diagram of a power source device in a heat transfer apparatus in embodiment 8 of the invention.

FIG. 10 is a block diagram of a power supply unit in embodiment 8 of the invention.

What differs from embodiment 6 is that the thermoelectric converter power source 32 is provided with a voltage boosting circuit 38 and an oscillating circuit 39 for operating the voltage boosting circuit 38.

The same reference numerals as in embodiment 7 refer to the same constituent parts, and duplicate explanation is omitted.

Explaining the operation, in the initial phase of heating, while the electromotive force V of the thermoelectric converter 20 is below Vc, same as in embodiment 7, the electric power is supplied from the battery power source 33 to the load 37.

On the other hand, the voltage generated in the thermoelectric converter 20 is supplied into the oscillating circuit 39 and voltage boosting circuit 38 of the thermoelectric converter power source 32. When heating proceeds, and the starting voltage of the thermoelectric converter 20 reaches the operating voltage Vcc of the circuit, the oscillating circuit 39 starts oscillation, and the pulse signal is sent into the voltage boosting circuit 38, and the voltage of the thermoelectric converter 20 is boosted from the voltage boosting circuit 38, and is issued.

When the heating is further advanced, and the voltage of the thermoelectric converter 20 reaches Va exceeding Vc, a signal is issued from the controller 36, the power source selecting switch 34 is connected to the normally open contact, and the load changeover switch 35 is connected to the normally open contact at the upper side. As a result, the voltage of the thermoelectric converter 20 is boosted and supplied from the thermoelectric converter power source 32 into the load 37.

Figure 11:
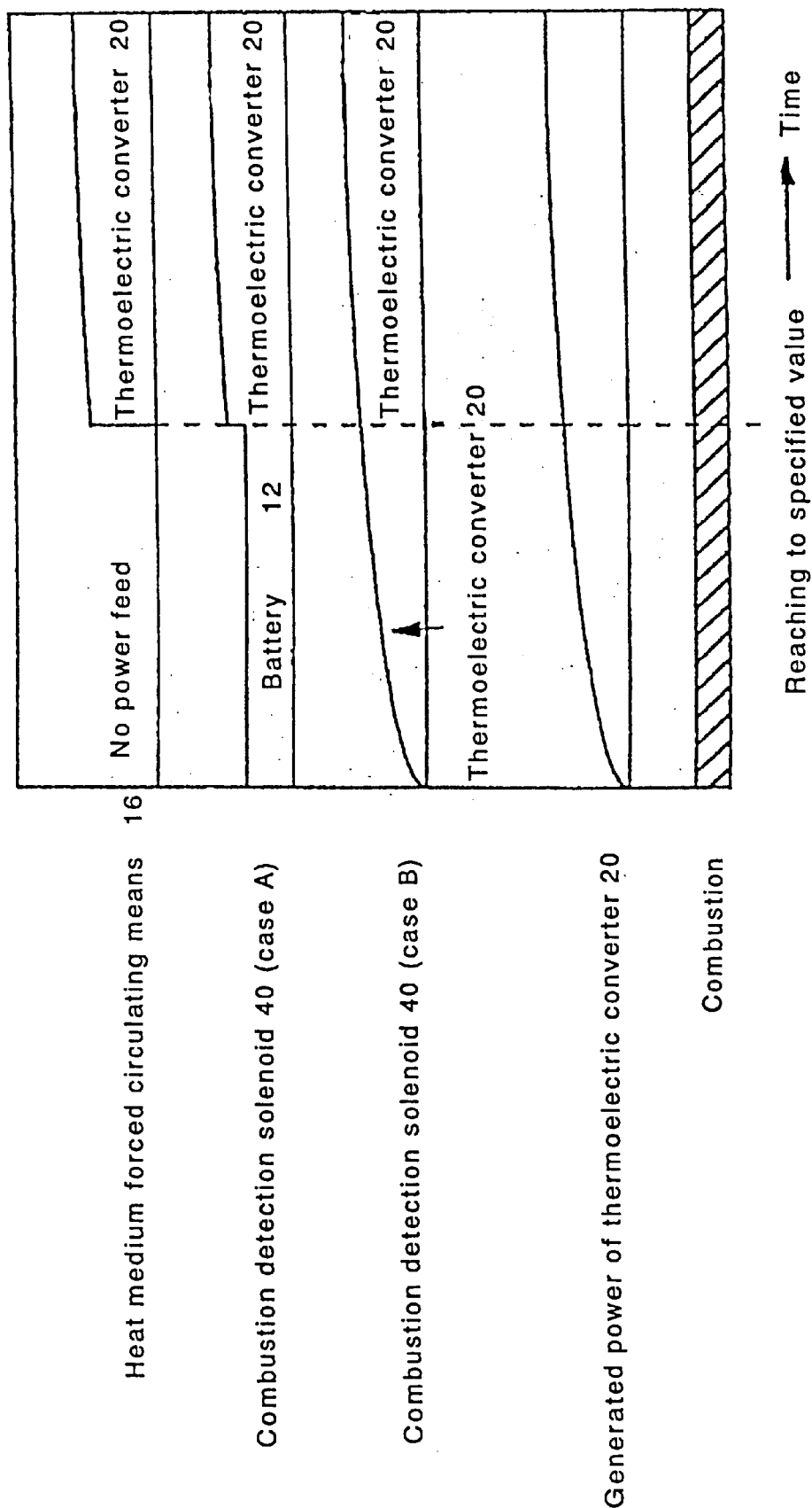
FIG. 11 is a sequence diagram of a heat transfer apparatus in embodiment 9 of the invention.
Figure 12:
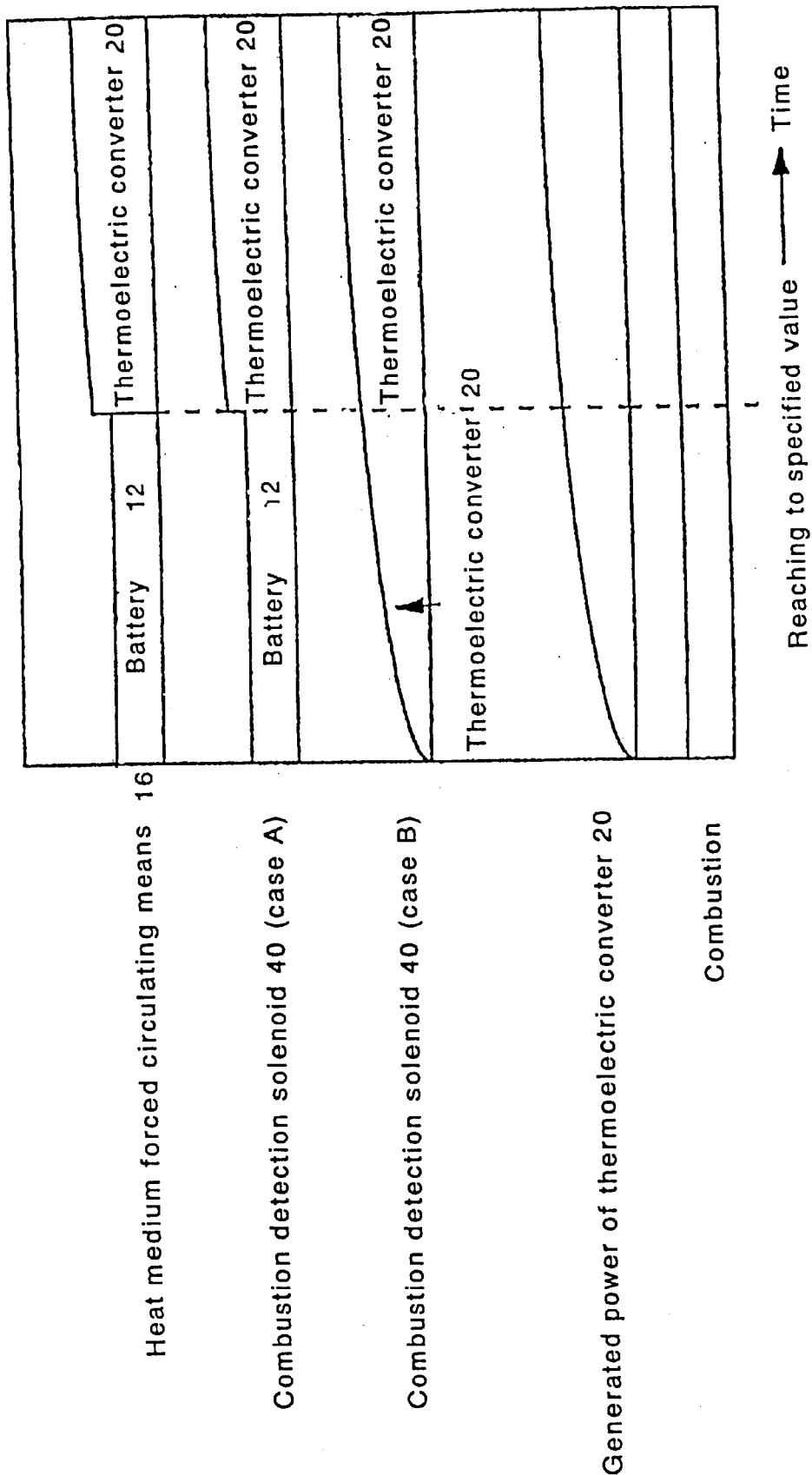
FIG. 12 is a sequence diagram of a heat transfer apparatus in embodiment 10 of the invention.

FIG. 11 and FIG. 12 show the sequence diagram of the embodiment of changeover of the battery power source and thermoelectric converter by the changeover switch.

(Embodiment 9)

First of all, the case of FIG. 11 is explained. When the combustion means 14 starts combustion, the thermoelectric converter 20 generated electric power. The controller 36 does not supply electric power to the heat medium forced circulating means 16 until the generated power of the thermoelectric converter 20 reaches a specified value, and the power of the battery 12 (case A) or the generated power of the thermoelectric converter 20 (case B) is supplied into the combustion detection solenoid 40. When the generated power of the thermoelectric converter 20 reaches the specified value, the controller 36 stops power feed from the battery 12, and feeds the generated power of the thermoelectric converter 20 to both the combustion detection solenoid 40 and the heat medium forced circulating means 16. If the power of the battery 12 is being supplied into the combustion detection solenoid 40, power supply of the battery 12 into the heat medium forced circulating means 16 is stopped.

Thus, until the generated power of the thermoelectric converter 20 reaches the specified value, electric power is not supplied into the heat medium forced circulating means 16, and when feeding power of the battery 12 (case A) to the combustion detection solenoid 40, the movable valve unit of the combustion detection solenoid 40 can be attracted and held in a short time, and the operation time for keeping the gas main feed valve open by force until it is attracted and held can be shortened, so that the convenience is enhanced.

Until the generated power of the thermoelectric converter 20 reaches the specified value, electric power is not supplied into the heat medium forced circulating means 16, and when feeding the generated power of the thermoelectric converter 20 into the combustion detection solenoid 40 (case B), all the generated power is supplied only to the combustion detection solenoid 40, and therefore the movable valve unit of the combustion detection solenoid 40 can be attracted and held in a short time after start of combustion of the combustion means 14, so that the convenience is enhanced.

Furthermore, after reaching the specified value, the generated power of the thermoelectric converter 20 is supplied into the combustion detection solenoid 40 and heat medium forced circulating means 16, and therefore the operation does not become unstable due to lack of electric power, and the both can be operated stably.

(Embodiment 10)

FIG. 12 is a sequence diagram of the heat transfer apparatus of embodiment 10. In this embodiment 10, when the combustion means 14 starts combustion, the thermoelectric converter 20 generates electric power. The controller 36 shown in FIG. 7 feeds the power of the battery 12 into the heat medium forced circulating means 16, and feeds the power of the battery 12 (case A) or the generated power of the thermoelectric converter 20 (case B) into the combustion detection solenoid 40, from start of operation until the generated power of the thermoelectric converter 20 reaches a specified value. When the generated power of the thermoelectric converter 20 reaches the specified value, power feed from the battery 12 is stopped, and the generated power of the thermoelectric converter 20 is supplied into both the combustion detection solenoid 40 and the heat medium forced circulating means 16.

From start of operation until the generated power of the thermoelectric converter 20 reaches the specified value, if the power of the battery 12 is supplied into the combustion detection solenoid 40 and heat medium forced circulating means 16 (case A), the movable valve unit of the combustion detection solenoid 40 can be attracted and held in a short time, and the heat medium can be also conveyed, and therefore the heat medium can be conveyed to the heat releasing means quickly, and the temperature is raised in a short time. Moreover, since the heat medium does not remain still, the temperature difference of the thermoelectric converter 20 is large, and the generated power becomes large earlier.

From start of operation until the generated power of the thermoelectric converter 20 reaches the specified value, if the generated power of the thermoelectric converter 20 is supplied into the combustion detection means 40 and the power of the battery 12 is supplied into the heat medium forced circulating means 16 (case B), since all the generated power is supplied only into the combustion detection solenoid 40, the movable valve unit of the combustion detection solenoid 40 can be attracted and held in a short time after start of combustion of the combustion means 14.

Furthermore, after reaching the specified value, the generated power of the thermoelectric converter 20 is supplied into the combustion detection solenoid 40 and heat medium forced circulating means 16, and therefore the operation does not become unstable due to lack of electric power, and the both can be operated stably.

(Embodiment 11)

Figure 13:
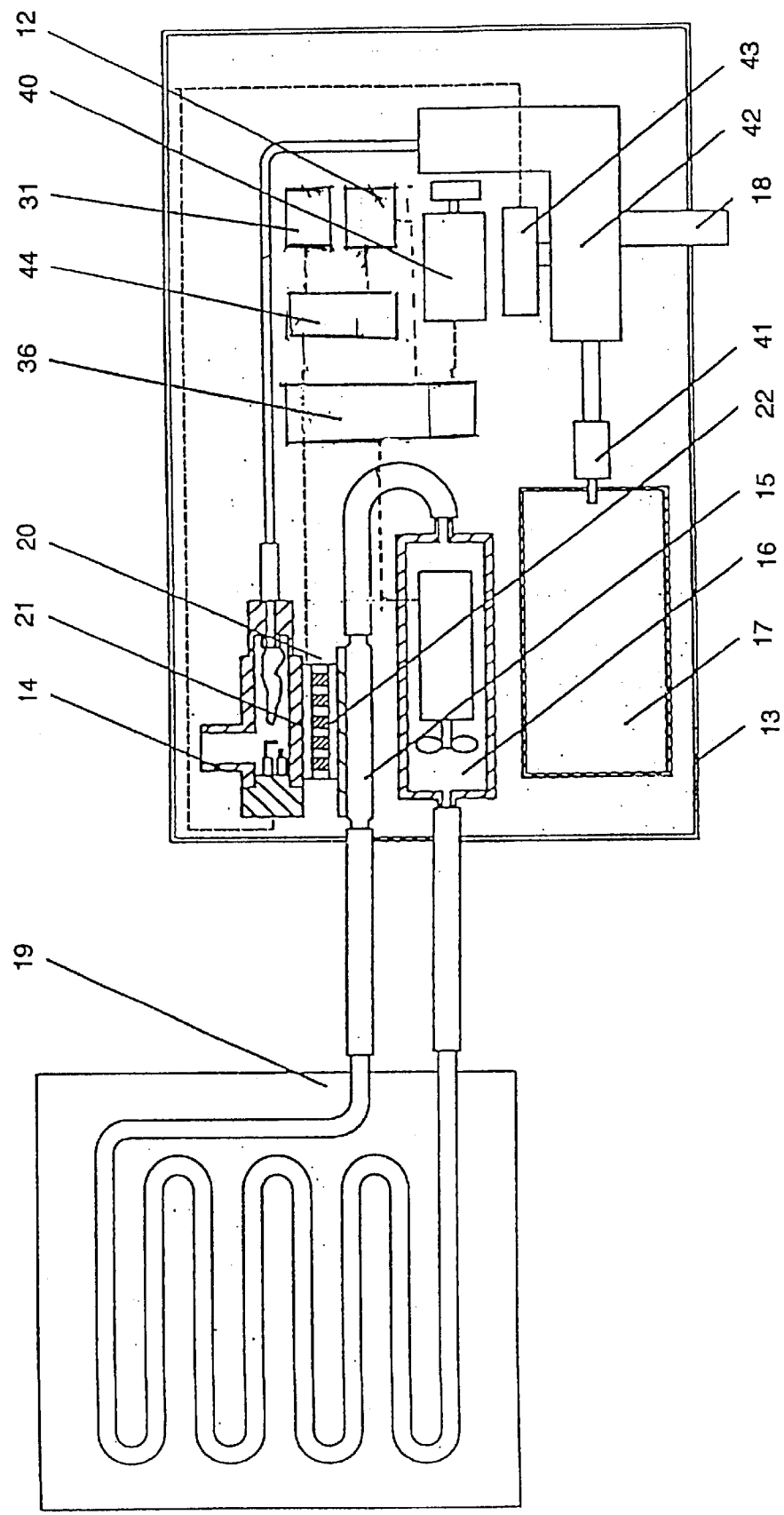
FIG. 13 is a structural diagram of a heat transfer apparatus in embodiment 11 of the invention.
Figure 14:
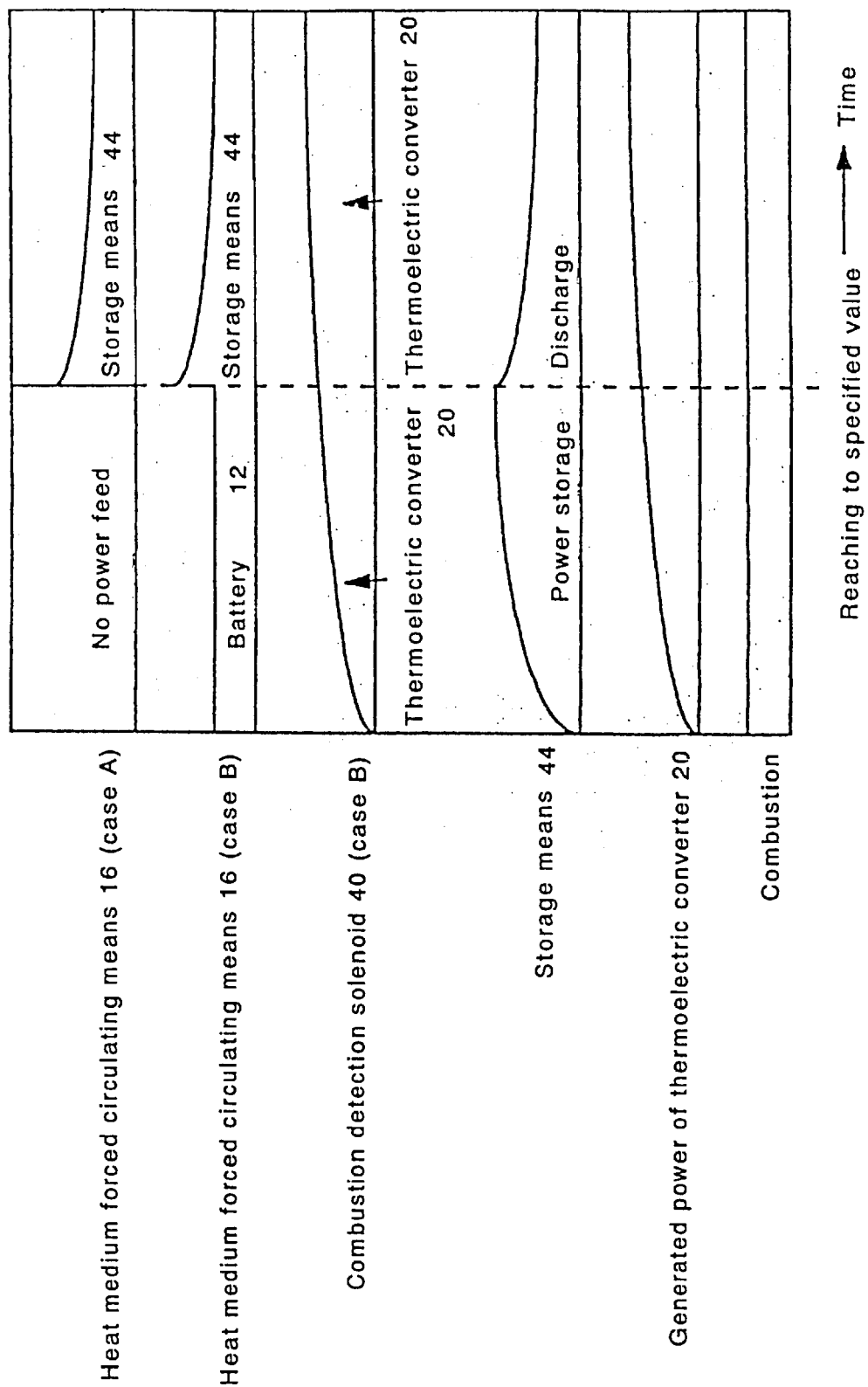
FIG. 14 is a sequence diagram of the heat transfer apparatus in embodiment 11.

FIG. 13 and FIG. 14 are a structural diagram and a sequence diagram of a heat transfer apparatus in embodiment 11 of the invention.

What differs from embodiments 7 to 9 is that it further comprises storage means 44 for storing the generated power of the thermoelectric converter 20 and storage and discharge control means 31 for controlling storage and discharge.

The same reference numerals as in embodiment 7 refer to the same constituent parts, and duplicate explanation is omitted.

In this embodiment, when the combustion means 14 starts combustion, the thermoelectric converter 20 generates electric power. Until the stored power of the thermoelectric converter 20 reaches a specified value, power feed is stopped (case A) or power of the battery 12 is supplied (case B) to the heat medium forced circulating means 16. The generated power of the thermoelectric converter 20 is supplied into the combustion detection solenoid 40 and stored in the storage means 44. The controller 36, when the power stored in the storage means 44 reaches a specified value, discharged into the heat medium forced circulating means 16, and continues to feed the generated power of the thermoelectric converter 20 into the combustion detection solenoid 40. In this case, when the battery power is supplied into the heat medium forced circulating means 16 (case B), power feed of the battery 12 is stopped. As the storage means 44 discharges, the charge decreases gradually, and when the discharged power drops below the driving power of the heat medium forced circulating means 16, the controller 36 stops discharging, and the generated power of the thermoelectric converter 20 is stored again. When using the battery 12, the power supply is changed over to the battery 12. Thereafter, the same operation is repeated.

Until the stored power reaches the specified value, if power of the battery 12 is supplied into the heat medium forced circulating means 16 (case B), since the stored power is discharged in the heat medium forced circulating means 16, the life of the battery 12 is extended. The thermoelectric converter 20 is not always required to generate the power equivalent to the driving power of the heat medium forced circulating means 16, and hence the thermoelectric converter 20 may be small in size and weight. Besides, if the combustion heat value of the combustion means 14 fluctuates and the generated power changes to the smaller direction, the heat medium forced circulating means 16 can be driven.

(Embodiment 12)

Figure 15:
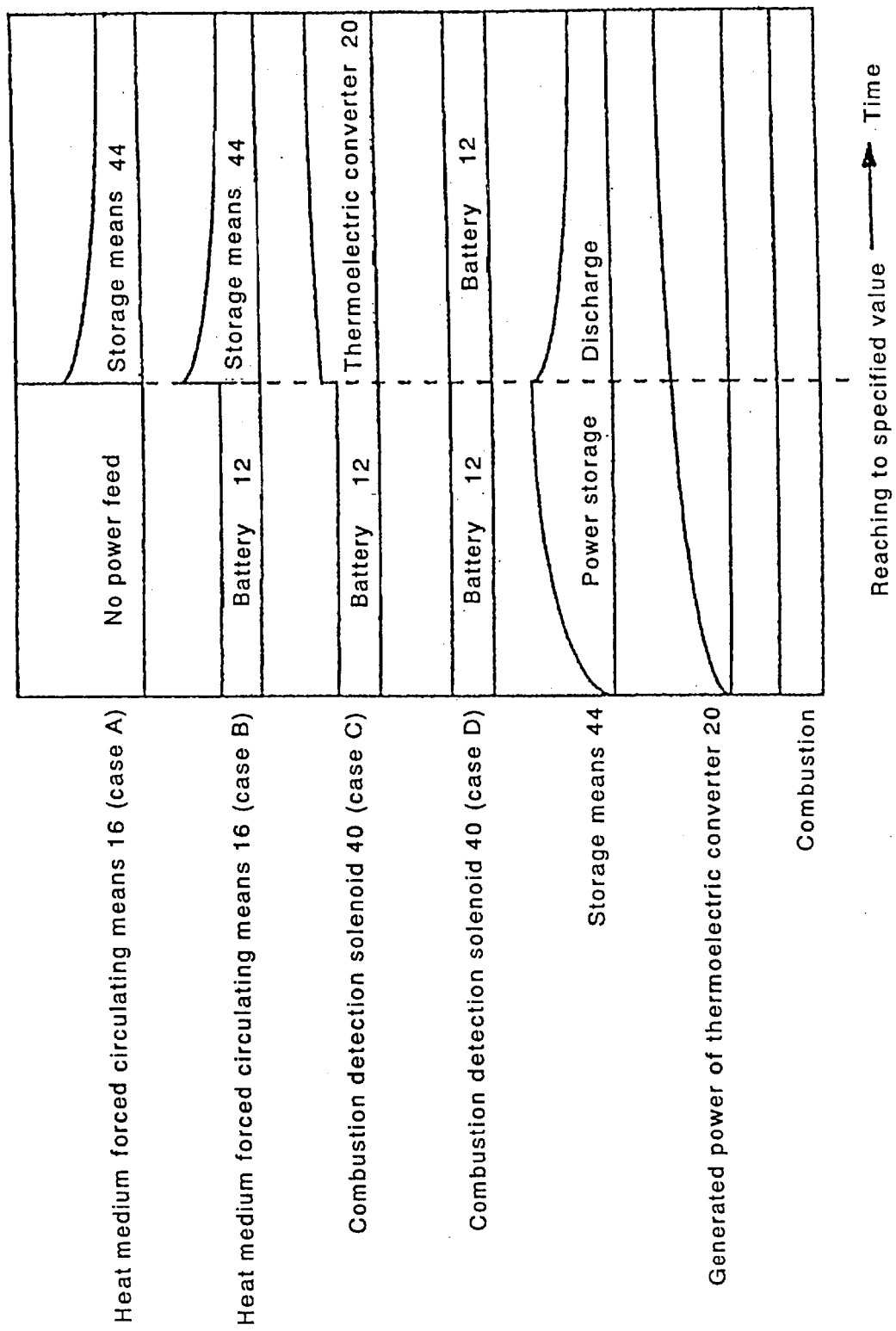
FIG. 15 is a sequence diagram of a heat transfer apparatus in embodiment 12 of the invention.

FIG. 15 is a sequence diagram of a heat transfer apparatus in embodiment 12 of the invention.

In this embodiment, when the combustion means 14 starts combustion, the thermoelectric converter 20 generates electric power. The generated power is stored in the storage means 44. In this period, power feed is stopped (case A) or battery power 12 is supplied (case B) to the heat medium forced circulating means 16, and the battery power 12 is supplied into the combustion detection solenoid 40. When the power stored in the storage means 44 reaches a specified value, the controller 36 discharges it into the heat medium forced circulating means 16. At the same time, if the battery power is supplied into the heat medium forced circulating means 16, power feed of the battery is stopped. Further, the battery power 12 is continuously supplied into the combustion detection solenoid 40 (case D), or it is changed over to the generated power of the thermoelectric converter 20 to feed (case C). As the storage means 44 discharges, the charge decreases gradually, and when the discharged power drops below the driving power of the heat medium forced circulating means 16, the controller 36 stops discharging, and the generated power of the thermoelectric converter 20 is stored again. When using the battery 12, the power supply is changed over to the battery 12. Thereafter, the same operation is repeated.

Until the stored power reaches the specified value, same as in the preceding embodiment, if power of the battery 12 is supplied into the heat medium forced circulating means 16 (case B), since the stored power is discharged in the heat medium forced circulating means 16, the life of the battery 12 is extended. The thermoelectric converter 20 is not always required to generate the power equivalent to the driving power of the heat medium forced circulating means 16, and hence the thermoelectric converter 20 may be small in size and weight. Besides, if the combustion heat value of the combustion means 14 fluctuates and the generated power changes to the smaller direction, the heat medium forced circulating means 16 can be driven.

(Embodiment 13)

Figure 16:
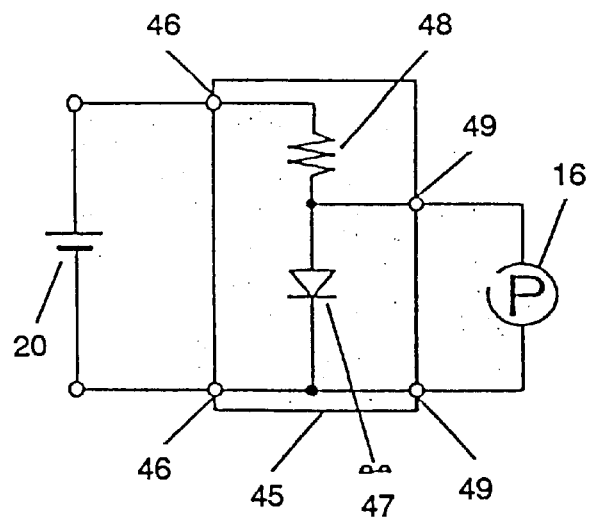
FIG. 16 is a circuit diagram of a controller in a heat transfer apparatus in embodiment 13 of the invention.
Figure 17:
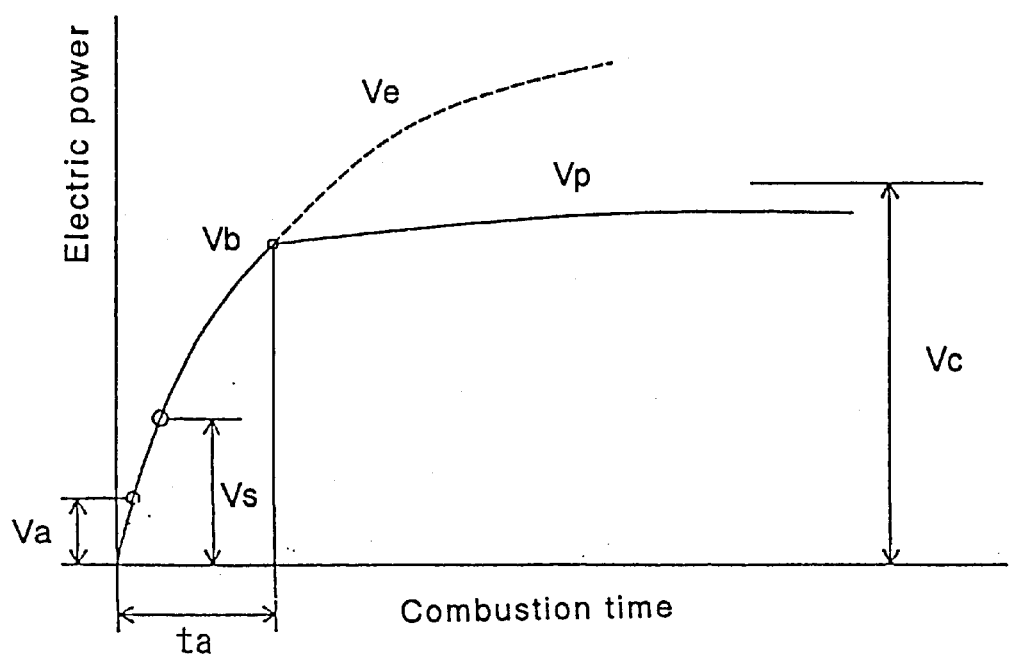
FIG. 17 is a characteristic diagram of power feed of the controller in the heat transfer apparatus in embodiment 13.

FIG. 16 is a circuit diagram of a controller of a heat transfer apparatus in embodiment 13 of the invention, and FIG. 17 is its characteristic diagram of power supply.

In this embodiment, having a controller for feeding electric power into the heat medium forced circulating means 16, this controller receiving the electromotive force from the thermoelectric converter 20, and controls the supply power to the heat medium forced circulating means 16 within a preset power, not exceeding the upper limit of the electromotive force of the thermoelectric converter 20. A constant voltage control circuit 45 is provided in order to control to this preset voltage.

That is, as shown in FIG. 16, the constant voltage control circuit 45 comprises a diode 47 and a limiting resistance 48 connected in series to its input terminal 46, and an output terminal 49 connected to the heat medium forced circulating means 16 from both ends of the diode 47, In FIG. 17, on the other hand, Ve is the starting voltage of the thermoelectric converter 20, Vp is the applied voltage to the heat medium forced circulating means 16, Vb is the voltage control starting voltage, Vc is the operation upper limit voltage of the heat medium forced circulating means 16, Vs is the operation starting voltage of the heat medium forced circulating means 16, and Va is the minimum holding voltage for attracting and holding the movable valve unit of the combustion detection solenoid 40.

In this embodiment, when the combustion means 14 runs to start heating, the temperature at the high temperature side of the thermoelectric converter 20 climbs up, and a temperature difference from the low temperature side occurs, and the thermoelectric converter 20 generates electric power. The generated power is fed into the controller (not shown). The electromotive force of the thermoelectric converter 20 elevates along with the time as indicated by Ve in FIG. 17, and is saturated at the balanced point of the generated heat of the combustion means 14 and the thermal load of the thermoelectric converter 20 and heat exchanger 15. The heat medium forced circulating means 16 starts up when the electromotive force of the thermoelectric converter 20 reaches the operation starting voltage Vs, and transfer of heat medium is started. As heating of the combustion means 14 is advanced and the electromotive force of the thermoelectric converter 20 reaches the preset electromotive force Vb, the controller is actuated to control so that the applied power in the heat medium forced circulating means 16 may be almost at a constant value Vb.

Using the constant voltage control circuit 45 in the controller, when the electromotive force of the thermoelectric converter 20 is fed into the input terminal 46, the current flows in the limiting resistance 48, and reaches up to the heat medium forced circulating means 16 connected to the diode 47 and the output terminal 49. Upon start of combustion, the electromotive force of the thermoelectric converter 20 is low, and almost no current flows in the diode 47, but the current flows in the heat medium forced circulating means 16, and the heat medium forced circulating means 16 is put into operation. As the heat medium forced circulating means 16 starts, the heated heat medium is pumped into the object device such as heat releasing device. As heating by combustion is promoted, the electromotive force of the thermoelectric converter 20 increases, and when the voltage of the diode 47 reaches the diode forward voltage (Vb in FIG. 17), the current leaving the limiting resistance 48 flows into the diode 47 and heat medium forced circulating means 16, and the distribution ratio of the supplied electromotive force is changed, and the applied voltage to the heat medium forced circulating means 16 is controlled to be almost a constant voltage.

The heat medium forced circulating means 16 transfers the heat medium with the optimum power for the heat release load of the object device such as heat releasing device.

According to this embodiment, the heat medium forced circulating means 16 is operated below the operation upper limit voltage Vc, and the speed of the rotary system and the power value of the electric system of the heat medium forced circulating means 16 are kept below the limit values, and the durability is assured. Moreover, since the rotating speed of the heat medium forced circulating means 16 is below a specific value, the noise and vibration levels can be lowered.

Using the constant voltage circuit 45 in the controller, the forward voltage or the break voltage of the voltage control element can be used as the control voltage, means for detecting the starting voltage is not necessary, and the control construction is simplified, and the reliability of the controller is enhanced.

(Embodiment 14)

Figure 18:
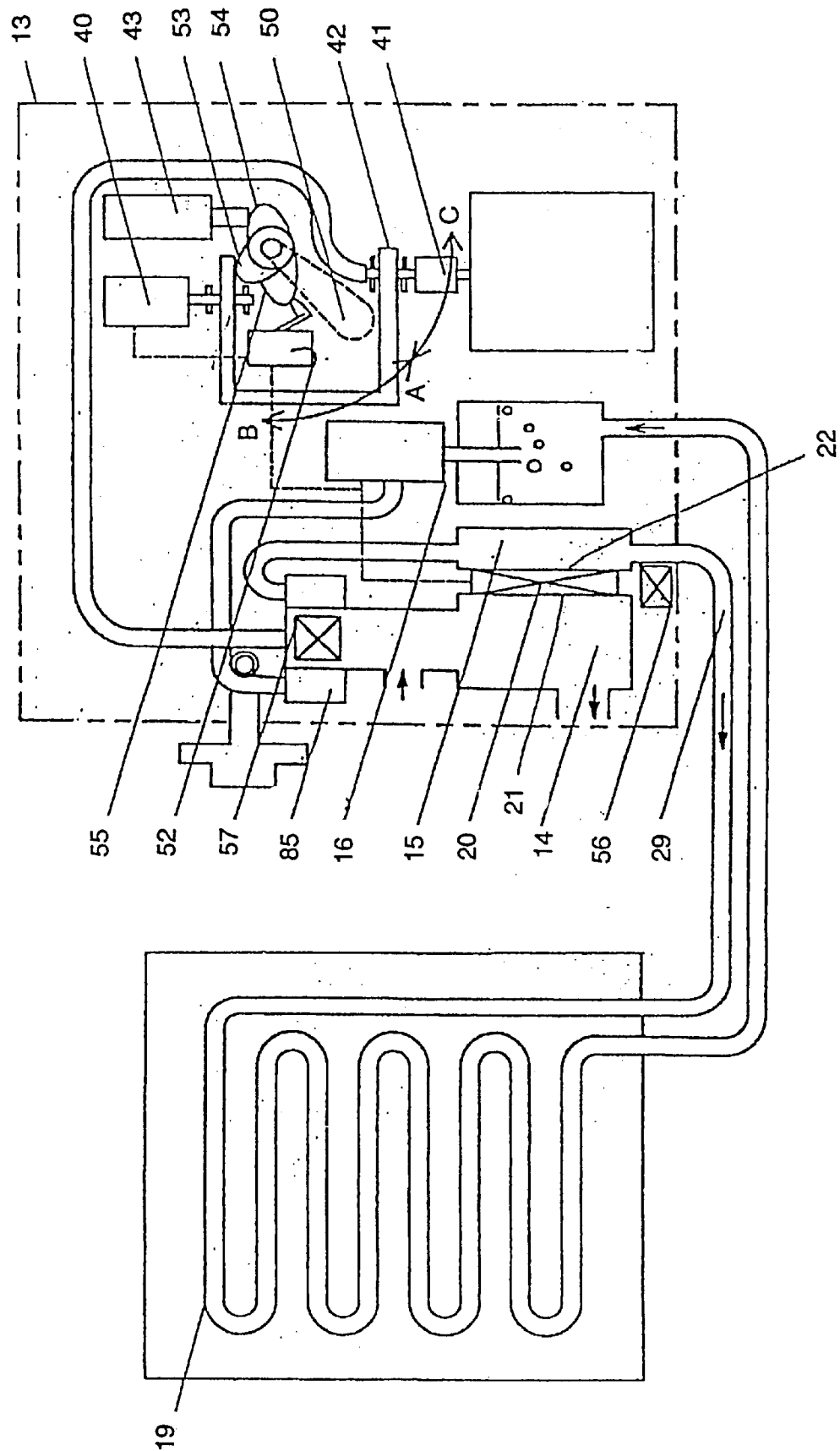
FIG. 18 is a structural diagram of a heat transfer apparatus in embodiment 14 of the invention.
Figure 19:
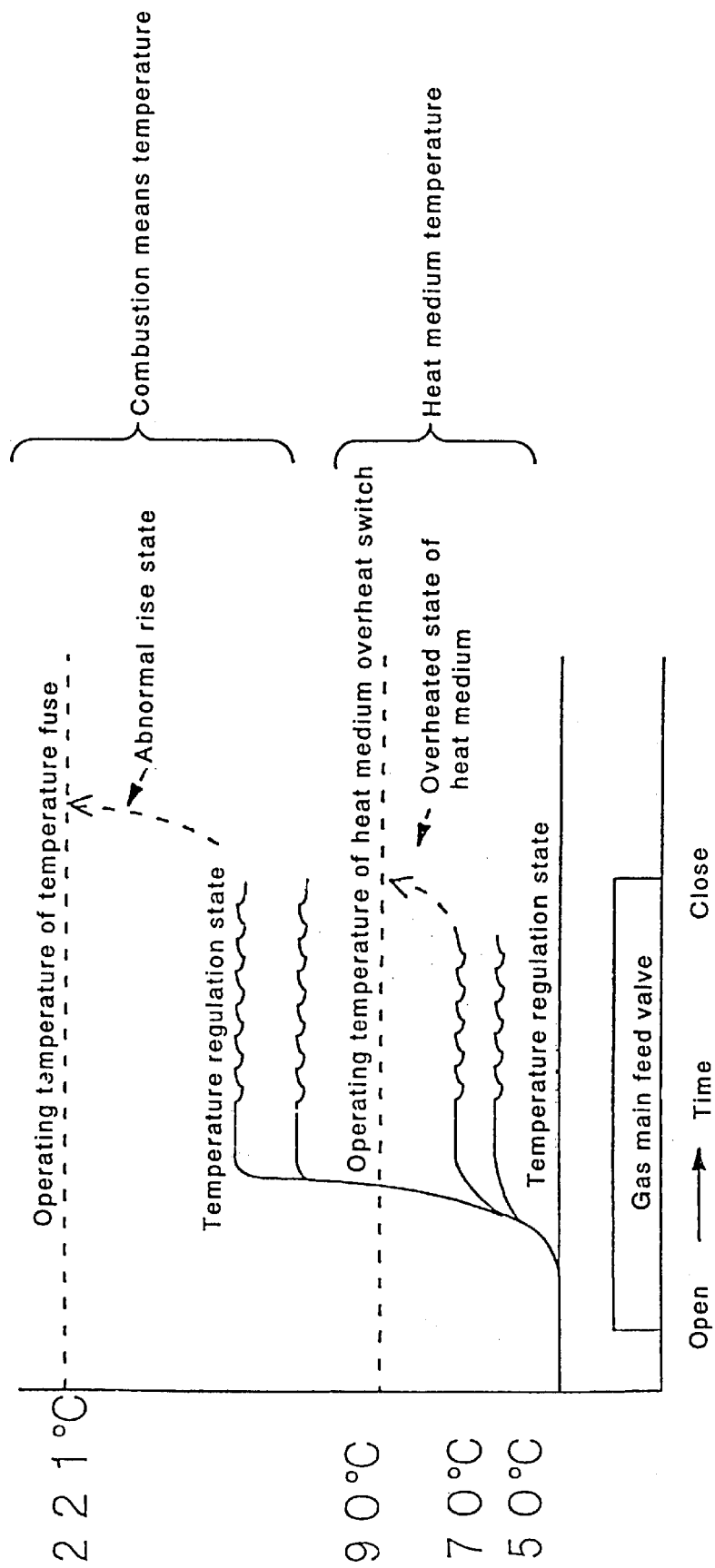
FIG. 19 is an operation explanatory diagram of heat medium temperature overheat switch of the heat transfer apparatus in embodiment 14.

FIG. 18 is a structural diagram of a heat transfer apparatus in embodiment 14 of the invention, and FIG. 19 is an operation explanatory diagram of heat medium temperature overheat switch.

What differs from embodiment 7 is as follows: it comprises a gas main feed valve 41 for opening or closing feed of gas as the fuel for combustion means, a switch 52 for opening and closing the generated power of the thermoelectric converter 20, a combustion detection solenoid 40 for attracting and holding the movable valve unit by the generated power, a piezoelectric igniter (ignition unit) 43 for igniting the gas, and an operation knob 50 for operating the combustion operation mechanism 42, in which, by turning the operation knob 50 from the stop position to the ignition position, the combustion operation mechanism moves to the position for attracting and holding the movable valve unit of the combustion detection solenoid 40, opens the gas main feed valve 41, strikes a spark to the piezoelectric igniter 43, and ignites the combustion means 14, and when turned from the stop position to the extinction position in the reverse direction, it opens the switch circuit from the thermoelectric converter 20 to the combustion detection solenoid 40, and stops the operation.

That is, as shown in FIG. 18, the gas main feed valve 41 opens or closes the supply of gas as the fuel for the combustion means 14. The internal coil of the combustion detection solenoid 40 is excited by the generated power of the thermoelectric converter 20, and the movable valve unit is attracted and held by this magnetic force, so that the gas is opened or closed. The piezoelectric igniter 43 ignites the gas in the combustion means 14. When the operation knob 50 for manipulation of operation in the combustion operation mechanism 42 is turned from the stop position A to the ignition position B, the movable valve unit of the combustion detection solenoid 40 is moved to the attracting and holding position, and the gas main feed valve 41 is opened, and a spark is fired in the piezoelectric igniter 43. When the knob 50 is turned from the stop position A to the extinction position C in the reverse direction as shown in the diagram, the switch 52 connected to the power circuit from the thermoelectric converter 20 to the combustion detection solenoid 40 cuts off the power circuit to the combustion detection solenoid 40. A cam A 53, a cam B 54, and a cam C 55 rotate in cooperation with the operation knob 50. The heat medium temperature overheat switch 56 provided in the heat medium passage 29 for detecting the heat medium temperature is connected to the power circuit from the thermoelectric converter 20 to the combustion detection solenoid 40, and when the heat medium is overheated during operation, the movable valve unit of the combustion detection solenoid 40 is separated, and the gas main feed valve 41 is closed.

The operation and action are described below. When the operation knob 50 is turned from the stop position A to the ignition position B, the combustion operation mechanism 42 actuates the cam A 53 to move the movable valve unit of the combustion detection solenoid 40 to the attracting and holding position, opens the gas main feed valve 41, and strikes a spark to the piezoelectric igniter 43 by means of the cam B 54. As a result, gas is supplied from the gas main feed valve 41 into the combustion means 14, and the piezoelectric igniter 43 strikes a spark to start combustion, and the combustion heat of the combustion means 14 is received by the thermoelectric converter 20 at its high temperature side 21, and heat is transferred from the low temperature side to the heat exchanger 15, and electric power is generated depending on the temperature difference between the high temperature side 21 and low temperature side 22. When it is about the time of the combustion detection solenoid 40 reaching a sufficient generated power for keeping the movable valve unit in attracted and held state (usually in about 10 seconds), the operation knob 50 is released. The operation knob 50 returns to the stop position A, but when the power generation is sufficient, igniting securely and burning normally, the combustion detection solenoid 40 keeps its movable valve unit in attracted and held state, and the combustion operation continues.

While the combustion operation continues as the combustion detection solenoid 40 keeps its movable valve unit in attracted and held state, at the same time, the heat medium forced circulating means 16 is driven by the generated power of the thermoelectric converter 20, and the heat medium is conveyed into the heat releasing means 19. Usually, when the heat medium reaches a specified temperature, the temperature is regulated by the temperature regulator 57. Its example is shown in the graph in FIG. 19, in which the heat medium temperature is regulated in a range of 50 to 70. In this state, if the temperature of the heat medium is abnormally raised by closing of the heat medium passage 29 or trouble in the heat medium forced circulating means 16 or the like, the heat medium temperature overheat switch 56 for detecting the heat medium temperature is actuated, and the power circuit to the combustion detection solenoid 40 is opened, and excitation of the coil is stopped, and the movable valve unit is released by the repulsive force of spring, and the gas main feed valve 41 is closed, and combustion stops. In FIG. 19, when exceeding 90, the heat medium temperature overheat switch 56 is actuated.

Thus, combustion is controlled by detecting the heat medium temperature close to the final output, instead of the temperature of the combustion means 14, so that safety is assured.

To stop the combustion operation, by turning the operation knob 50 from the stop position A to the extinction position C in the reverse direction, and the switch 52 is opened by the cam switch C 55, and the power circuit from the thermoelectric converter 20 to the combustion detection solenoid 40 is cut off, and the excitation of the coil of the combustion detection solenoid 40 is stopped, the movable valve unit is released by the repulsive force of the spring, the gas main feed valve 41 is closed, supply of gas is stopped, and the combustion stops. At this time, the operation knob 50 may be turned only for a moment in the reverse direction and may be returned to the stop position.

Thus, the ignition operation can be done by the operation knob, and the user can recognize the ignition, and feels a senses of relief. The construction is simple, and the manufacturing cost is low. For extinguishing, only the same operation knob may be turned in the reverse direction, and ignition and extinction can be realized by simple operation, and the convenience is enhanced.

(Embodiment 15)

Figure 20:
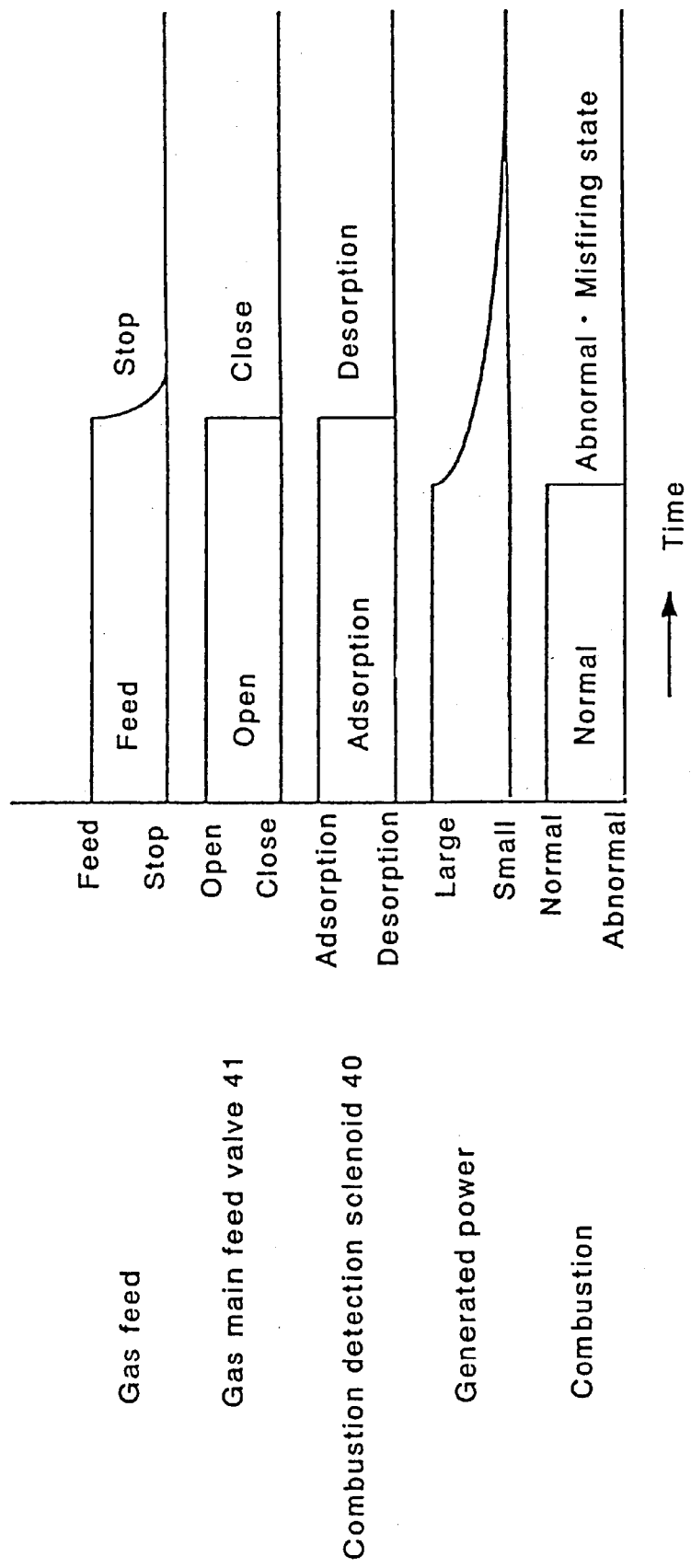
FIG. 20 is a sequence diagram of a heat transfer apparatus in embodiment 15 of the invention.

FIG. 20 is a sequence diagram of a heat transfer apparatus in embodiment 15 of the invention.

What differs from embodiment 14 is as follows: when the combustion means 14 is shifted from the normal combustion to imperfect combustion or misfiring state, it is constructed to drop the generated power of the thermoelectric converter 20, release the movable valve unit of the combustion detection solenoid 40, and close the gas main feed valve 41.

The operation and action are described below. When the combustion means 14 is shifted from normal combustion to imperfect combustion or misfiring state, the combustion heat becomes smaller, and the thermoelectric converter 20 becomes smaller in the temperature difference between the high temperature side 21 and low temperature side 22, and lowers in the generated power. As a result, the excitation of the coil of the combustion detection solenoid 40 becomes smaller, and the movable valve unit is released by the repulsive force of the spring, the gas main feed valve 41 is closed, and the combustion stops.

In this way, the safety is assured if the combustion means 14 is shifted from normal combustion to imperfect combustion or misfiring state, and moreover the heat medium forced circulating means 16 is being driven shortly after shifting to imperfect combustion or misfiring state, and the heat medium is conveyed into the heat exchanger 15 to deprive the combustion means 14 of its heat, and the thermoelectric converter 20 suddenly becomes small in the temperature difference between the high temperature side 21 and low temperature side 22, and the movable valve unit of the combustion detection solenoid 40 is released, and the time for closing the gas main feed valve 41 is shortened, so that the safety is further enhanced.

(Embodiment 16)

Figure 21:
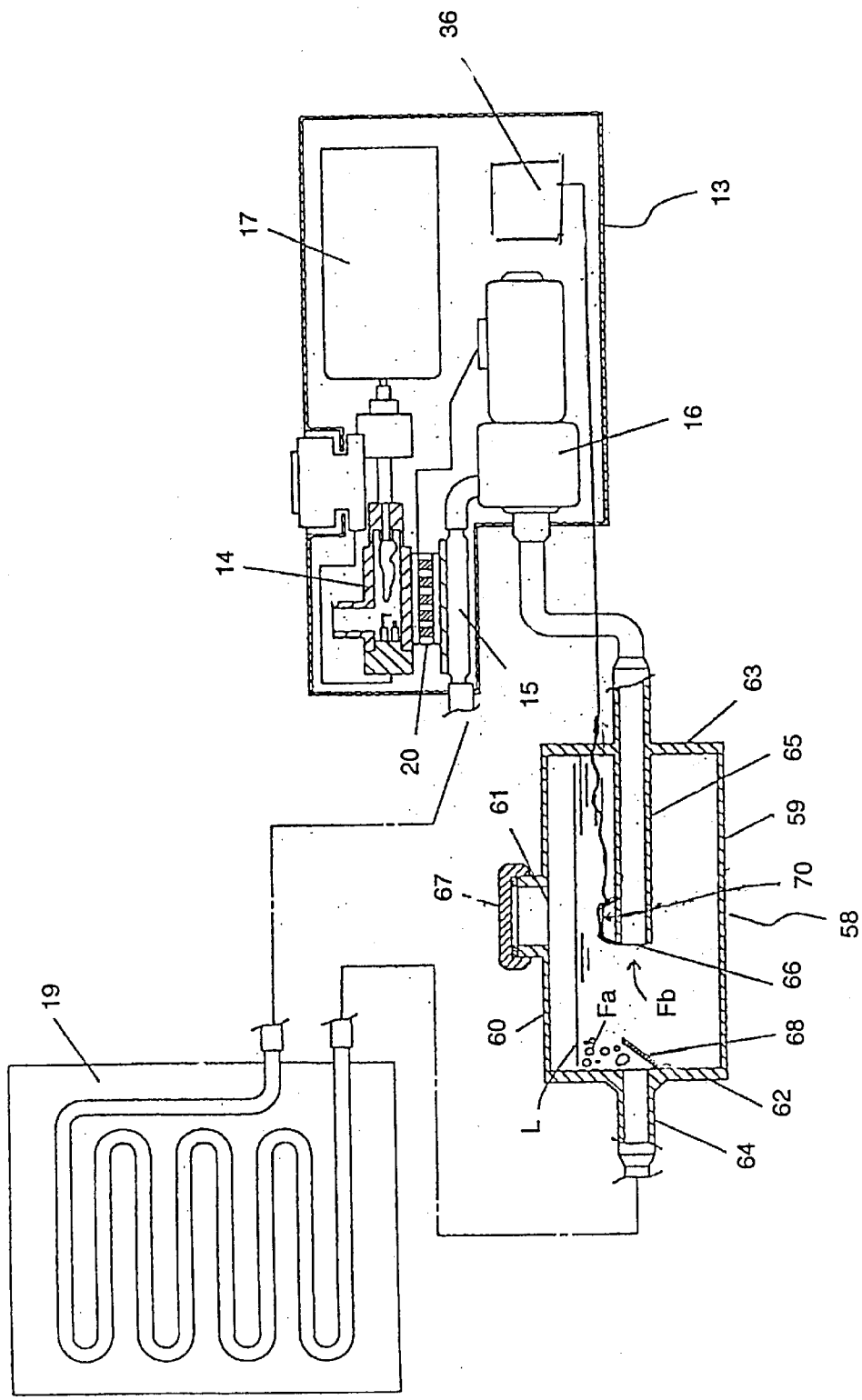
FIG. 21 is a cross sectional view of a gas capturing device in a heat transfer apparatus in embodiment 16 of the invention.
Figure 22:
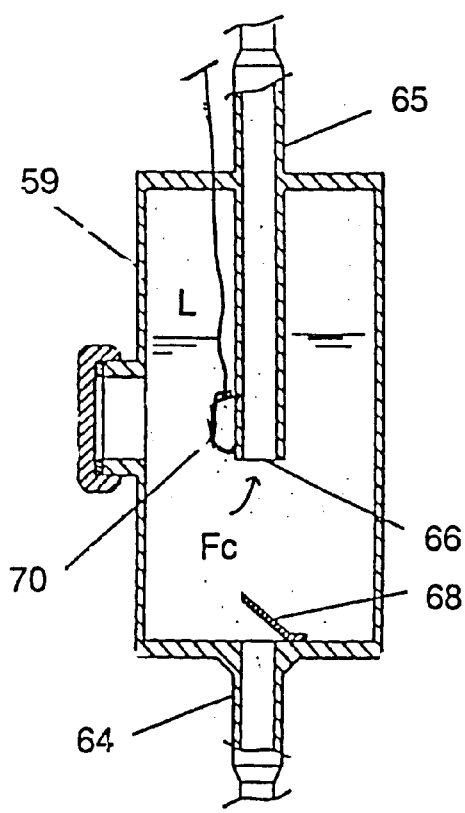
FIG. 22 is a sectional view showing the operating state in upward mode of fluid flow-out path of the gas capturing device in embodiment 16.
Figure 23:
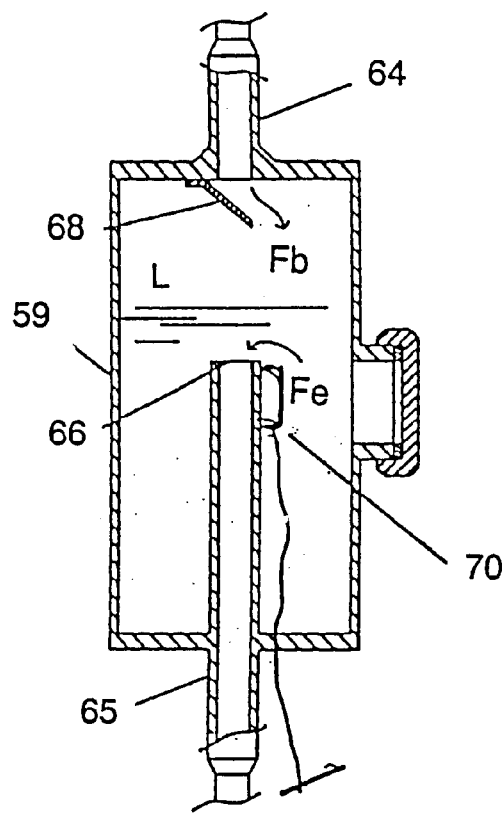
FIG. 23 is a sectional view showing the operating state in downward mode of fluid flow-out path of the gas capturing device in embodiment 16.
Figure 24:
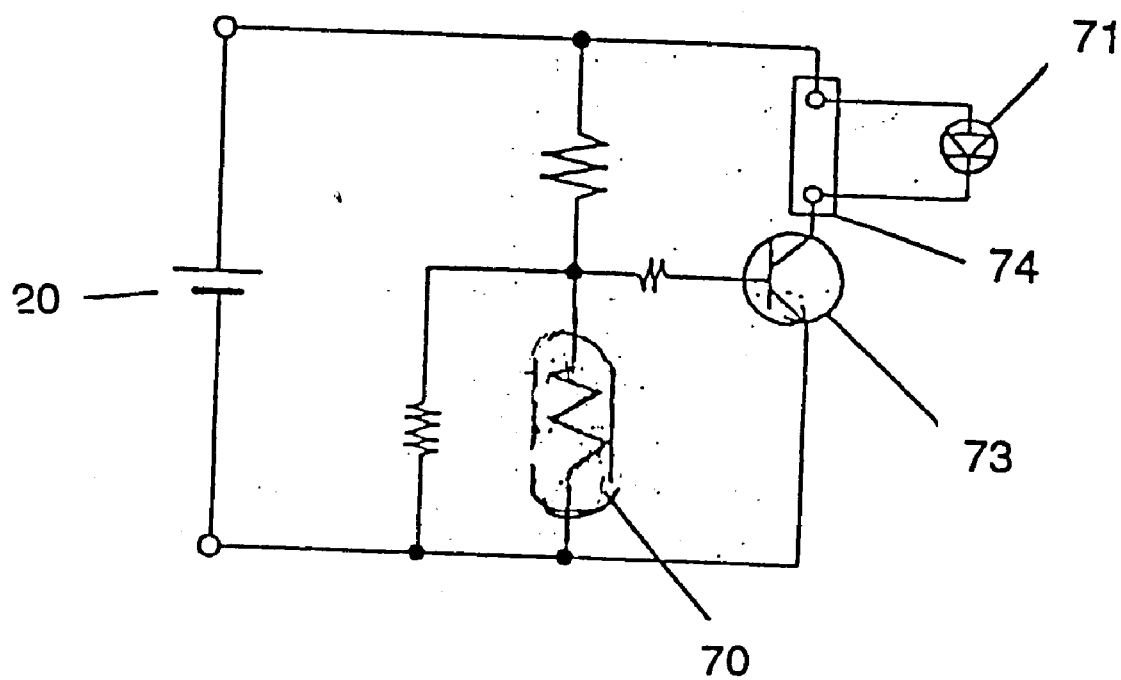
FIG. 24 is a circuit diagram of the controller in the heat transfer apparatus in embodiment 16.

FIG. 21 is a sectional view of a gas capturing device applied in a heat medium passage of a heat transfer apparatus in embodiment 16 of the invention, FIG. 22 and FIG. 23 are sectional views in the vertical configuration of the gas capturing device, and FIG. 24 is a circuit diagram of the heat transfer apparatus.

What differs from embodiment 1 is that it further comprises a gas capturing device composed of a gas capturing container, a liquid feed port for supplying heat medium into this gas capturing container, a liquid flow-in passage for allowing the circulating heat medium to flow into the gas capturing container, and a liquid flow-out passage allowing the heat medium to flow out from the gas capturing container, in which the flow inlet of the flow-out passage is positioned within the gas capturing container.

That is, as shown in FIG. 21 to FIG. 23, a gas capturing device 58 comprises a gas capturing container 59, a liquid feed port 61 provided on an upper wall 60 of the gas capturing container 59, and a liquid flow-in passage 64 and a liquid flow-out passage 65 provided in the mutually confronting side walls 62 and 63. The liquid flow-in passage 64 and liquid flow-out passage 65 are positioned in the center of each side wall, and the liquid flow-out passage 65 is extended into the gas capturing container so that its flow inlet 66 may be positioned nearly in the center of the gas capturing container 59. The liquid feed port 61 is closed by a lid 67. A deflector 68 is provided at the exit of the liquid flow-in passage 64.

Explaining the operation, when the combustion means 14 is put in operation to start heating, the temperature of the high temperature side of the thermoelectric converter 20 goes up, and a temperature difference from the low temperature side occurs, and the thermoelectric converter 20 generates electric power. The generated power is supplied into the heat medium forced circulating means 16, and the heat medium forced circulating means 16 starts up and the heat medium circulates. The circulating heat medium is heated by the combustion heat of the combustion means 14 through the heat exchanger 15, and is sent into the heat releasing means 19. Releasing heat in the heat releasing means 19, the heat medium flows from the liquid flow-in passage 64 into the gas capturing container 59. The heat medium flows into the gas capturing container 59, and gas components in the heat medium float up (Fa), and the gas components in the heat medium are separated. After the gas components are removed, the heat medium flows from the flow inlet 66 into the liquid flow-out passage 65 (Fb), and flows into the heat medium forced circulating means 16, thereby flowing through the circulating circuit. As the heating and circulating operation is repeated, gas components collected in the upper part of the gas capturing container 59 are increased, and when the liquid level L approaches the upper surface of the flow inlet 66 which is the capturing limit level, the lid 67 is opened, and the heat medium is supplemented.

When the gas capturing container 59 is placed in the vertical position, the air capturing mechanism is explained below. As shown in FIG. 22, when the liquid flow-in passage 64 is placed downward, the flowing heat medium hits against the deflector 68 and is changed in direction, and the gas components in the heat medium float in the gas capturing container, and are captured in the upper part of the container. After the gas components are removed, the heat medium flows out from the flow inlet 66 into the liquid flow-out passage 65 (Fc).

Or, as shown in FIG. 23, when the liquid flow-in passage 64 is placed upward, the heat medium flows in and gas components are directly collected and captured in the upper pat in the gas capturing container 59, while the liquid components hit against the deflector 68, and flow into the container (Fd). After removal of gas components, the heat medium flows out from the flow inlet 66 into the liquid flow-out passage 65 (Fe).

According to this embodiment, whether the gas capturing container 59 is placed in the horizontal or vertical direction, gas components in the heat medium are separated and captured, and only liquid components can be circulated.

A circuit diagram of this embodiment is shown in FIG. 24. As shown in the diagram, a liquid level detector 70 is composed of a self-heat generating thermistor, and is provided near the flow inlet 66 of the liquid flow-out passage 65. Noticing means 71 receives a liquid level drop signal, and notices a liquid level drop state to outside. A transistor 73 drives the noticing means 71.

Explaining the operation of this arrangement, the heat medium flows into the gas capturing device 58, and gas components in the heat medium float up, and the gas components are separated from the heat medium. After removal of gas components, the heat medium passes from the flow inlet 66 into the liquid flow-out passage 65, and flows into the heat medium forced circulating means 16, thereby flowing throughout the circulating circuit. As far as the heat medium level in the gas capturing container 59 is above the detection level, the self-heat generating thermistor of the liquid level detector 70 is within the heat medium and is high in heat transfer rate, and the temperature rise of the thermistor is small, so that a high resistance is shown. In the controller (not shown), the entered resistance value and the set resistance value are compared as the partial pressure of the transistor 73, and the transistor 73 is turned off, and the liquid level drop signal is not issued, and it is shown that the heat medium level is above the set level.

As the heating and circulating operation is repeated, gas components staying in the upper part of the gas capturing container 59 are increased due to vaporization of the heat medium or passing through gap, and when the liquid level reaches the detection level for the liquid level detector 70, the self-heat generating thermistor of the liquid level detector 70 is exposed in the air, the heat transfer rate of the heat generating unit becomes smaller, and the temperature rise of the thermistor increases, so that the resistance value of the thermistor becomes smaller. The controller compares the decreased resistance value and the set resistance value as the partial pressure of the transistor 73, and the transistor 73 is turned on, and a liquid level drop signal showing the heat medium level is below the set level is issued. By the output of the liquid level drop signal, the noticing means 71 is actuated, and it is noticed outside that the heat medium level has reached the limit level.

According to the embodiment, the gas components in the heat medium are completely removed, and only the liquid components flow into the heat medium forced circulating means 16, so that the heat medium can be transferred stably. Moreover, by the liquid level detector 70, the liquid level drop signal is issued as external signal, and the liquid can be supplemented earlier, and the flow inlet 66 of the liquid flow-out passage 65 of the gas capturing container 59 is not exposed above the liquid level, so that flow of gas components into the circulating circuit can be prevented.

(Embodiment 17)

Figure 25:
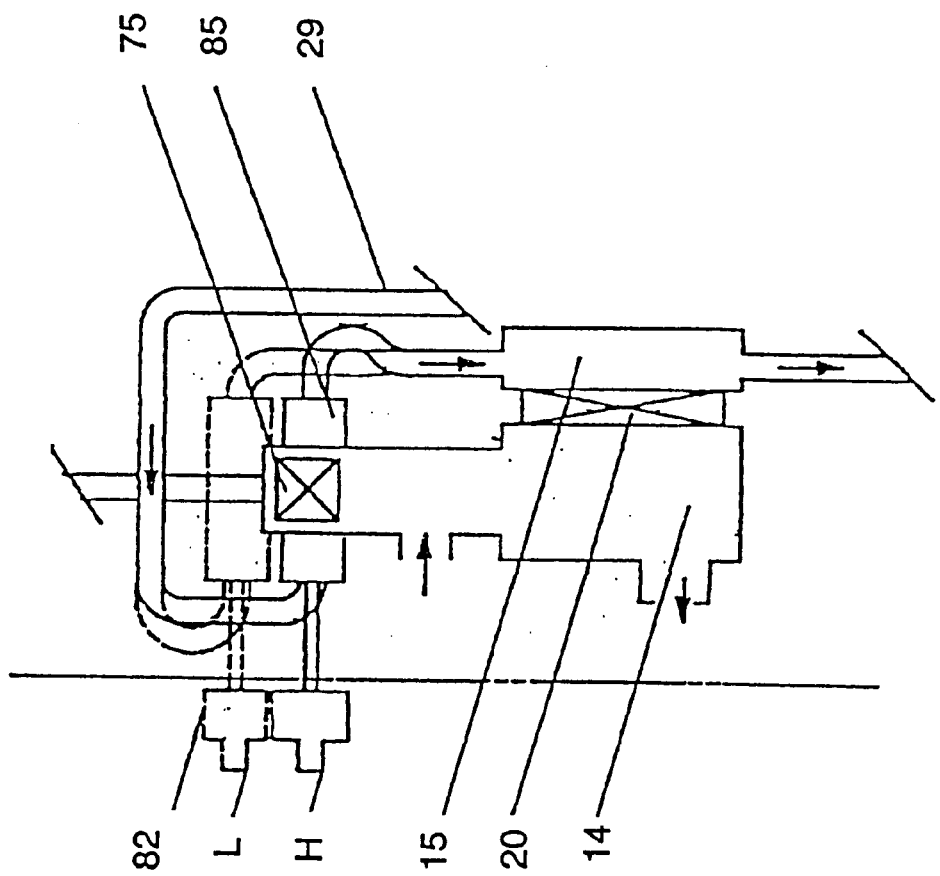
FIG. 25 is an essential structural diagram of a heat transfer apparatus in embodiment 17 of the invention.
Figure 26:
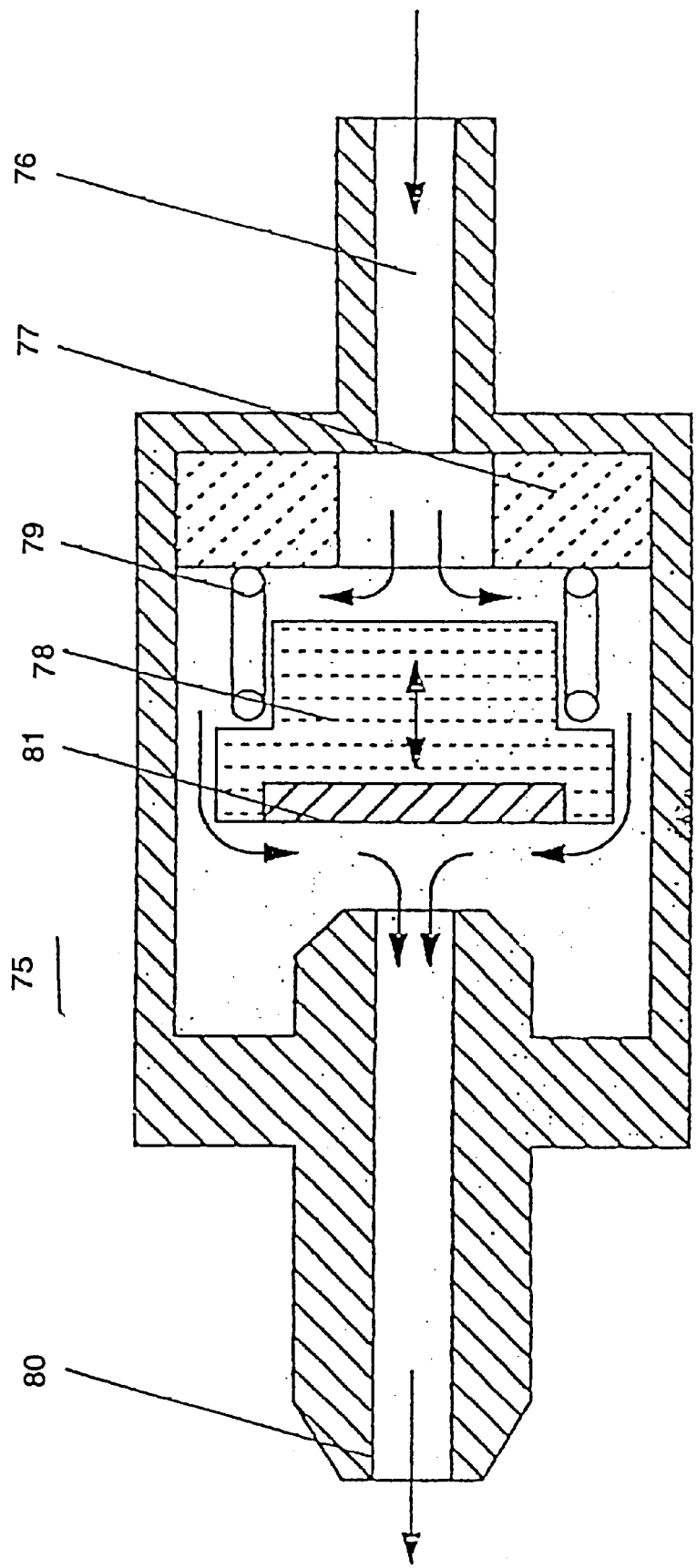
FIG. 26 is a sectional view of temperature regulation switching means in the heat transfer apparatus in embodiment 17.

FIG. 25 is an essential structural diagram of a heat transfer apparatus in embodiment 17 of the invention, and FIG. 26 is a sectional view of temperature regulation switching means.

In the diagrams, temperature regulation switching means 75 is provided in the upstream of the combustion means 14, and has a function of opening or closing the gas passage from the boundary of the specified value of the temperature of the heat received from the combustion means 14. That is, as shown in FIG. 26, it is composed of a ferrite 77 for increasing or decreasing the attracting magnetic force, a magnet 78 attracted to or released from the ferrite 77, a control spring 79 for controlling this magnet 78, and a control valve 81 for opening or closing a gas injection nozzle 80, being composed integrally with the magnet 78. In FIG. 25, reference numeral 82 denotes a temperature regulation variable mechanism, which moves the temperature regulation heat medium passage 85, and varies the temperature of the portion having the temperature regulation switching means 75 of the combustion means 14.

The operation and action of this construction are described below. By manipulating the operation, the gas is supplied, and is ignited at the same time, and the combustion means 14 starts combustion. Herein, the thermoelectric converter 20 generates electric power depending on the temperature difference, and the power is supplied into the heat medium forced circulating means, and the heat medium is transferred. The combustion heat of the combustion means 14 is received by the heat exchanger 15, and is exchanged of heat with the heat medium conveyed by the heat medium forced circulating means. Further, the heat medium circulates into the heat releasing means and releases heat, and returns to the heat exchanger 15 from the heat medium forced circulating means. When the temperature of the heat medium rises, the temperature of the combustion means 14 also elevates to reach a specified value. The ferrite 77 of the temperature regulation switching means 75 receiving heat from the combustion means 14 is decreased in the attracting magnetic force, and the magnet 78 is released, and the gas passage is closed, and the combustion means 14 stops combustion. As the temperature of the heat medium drops, the temperature of the heat combustion means 14 also declines, and the ferrite 77 of the temperature regulation switching means 75 increases in its attracting magnetic force, and the magnet 78 is attracted, thereby opening the gas passage, and the combustion means 14 resumes combustion. The temperature of the heat medium rises up again. Thus, the temperature of the heat medium is regulated.

When varying the temperature for temperature regulation, by manipulating the temperature regulation variable mechanism 82, the heat exchange degree is changed between the portion having the temperature regulation switching means 75 of the combustion means 14 and the temperature regulation heat medium passage 85, and the temperature in the portion having the temperature regulation switching means 75 is varied, and therefore the temperature of the combustion means 14 and the heat medium temperature can be changed when opening or closing the temperature regulation switching means 75.

Moreover, since the temperature regulation switching means 75 comprises the ferrite, the gas passage can be opened or closed quickly from the boundary of the specified temperature, and when re-igniting, a specified amount of gas is supplied, instead of a trace of gas, and the re-ignition is secure, and high dimensional precision for keeping configuration with other parts is not necessary, and the operation is repeatable, not fluctuating, and the temperature of the heat medium can be regulated stably. Similarly, when varying the regulating temperature of the heat medium, the repeatability is excellent, and the heat medium temperature can be regulated stably.

(Embodiment 18).

Figure 27:
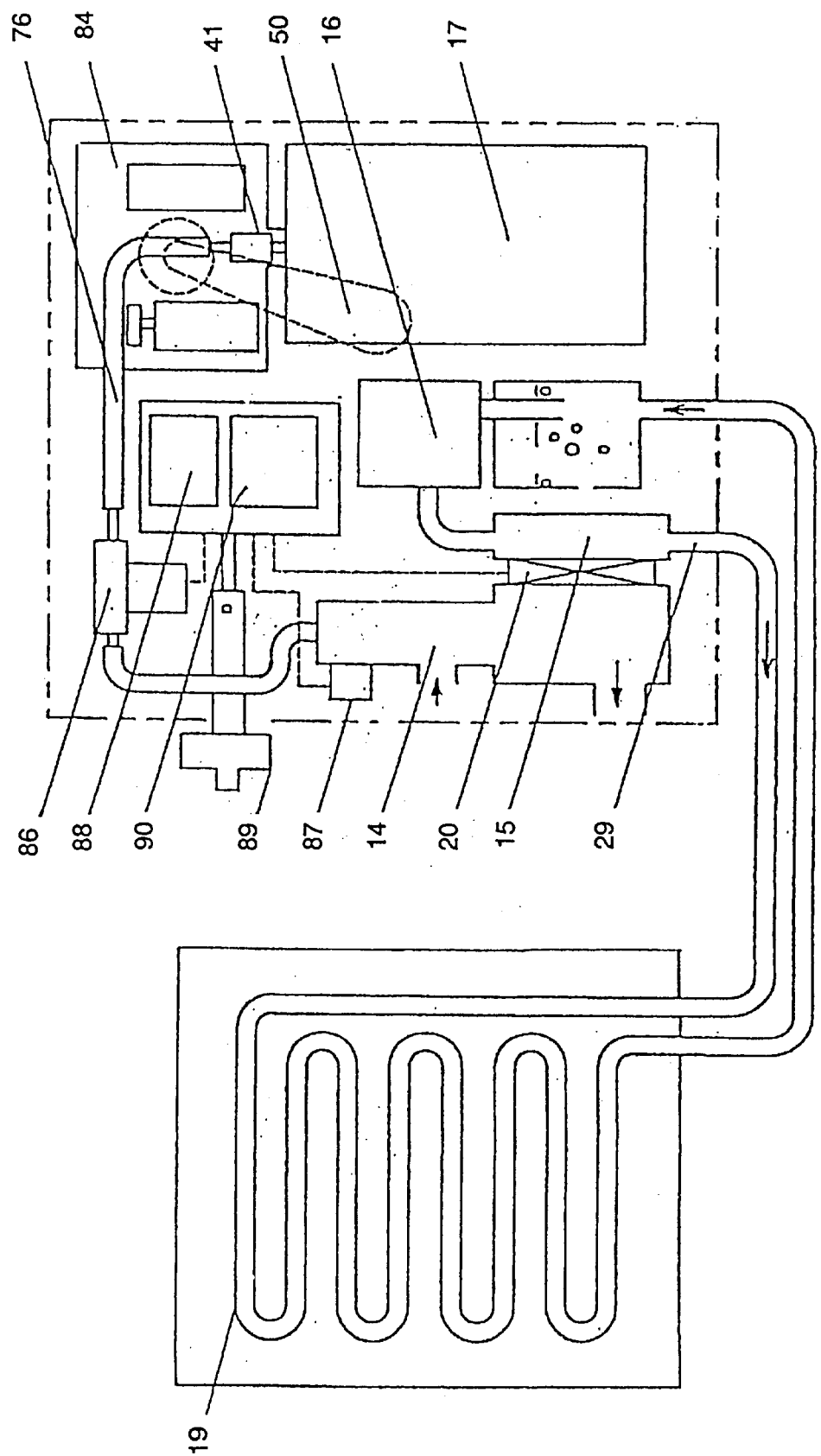
FIG. 27 is a structural diagram of a heat transfer apparatus in embodiment 18 of the invention.
Figure 28:
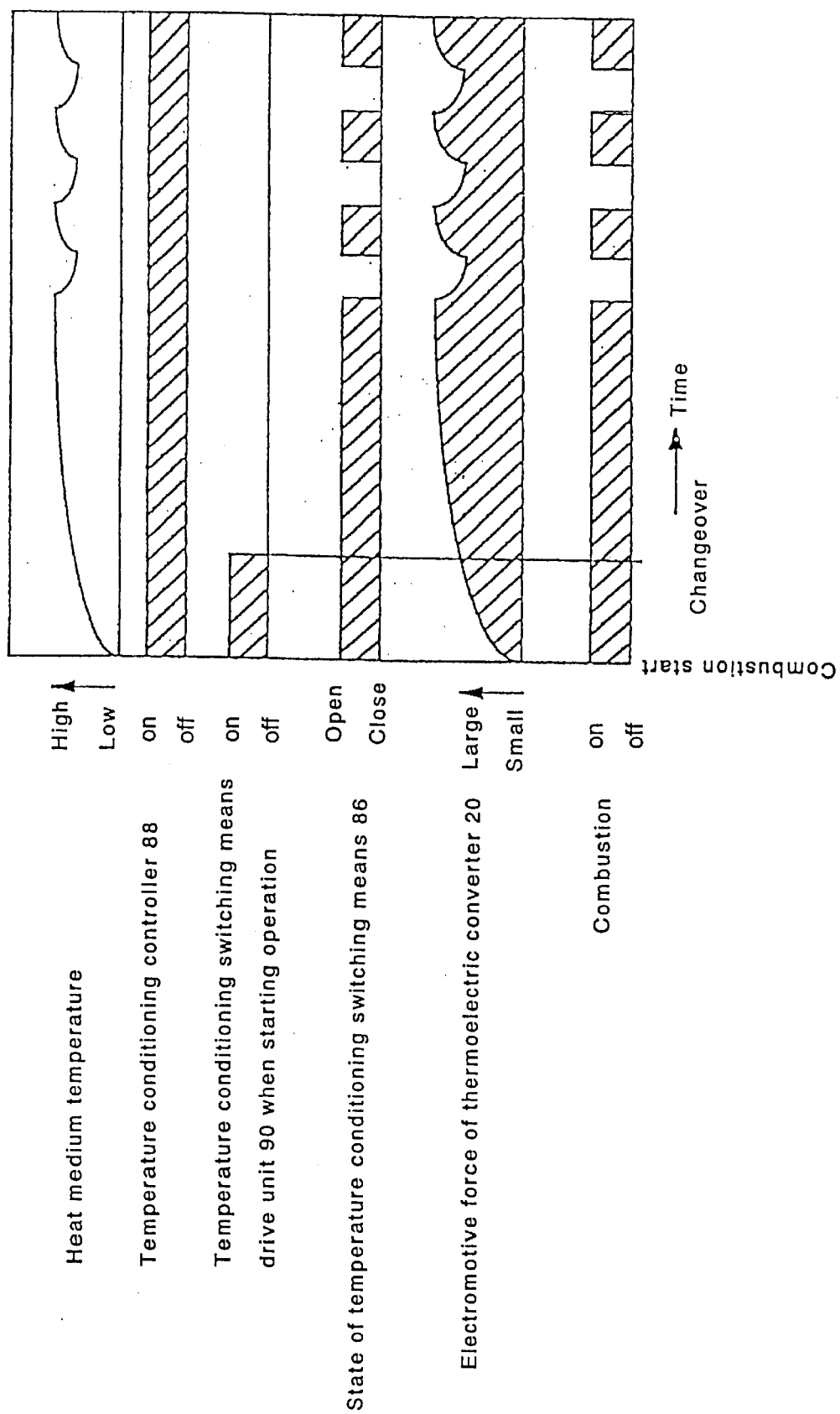
FIG. 28 is a sequence diagram of the heat transfer apparatus in embodiment 18.

FIG. 27 is a structural diagram of a heat transfer apparatus in embodiment 18 of the invention, and FIG. 28 is an operation sequence diagram.

In the diagrams, the heat transfer apparatus circulates the heat medium by connecting heat medium forced circulating means 16, heat exchanger 15, and heat releasing means 19 sequentially to a heat medium passage 29, and comprises a gas main feed valve 41 for opening or closing gas, gas feed means 84 for feeding gas as fuel to the combustion means 14, a gas passage 76 for feeding gas from the gas main feed valve 41 into the combustion means 14, and an operation unit (operation knob) 50 for manipulating the operation. Temperature regulation switching means 86 is provided in the gas passage 76, and it is designed to drive by the generated power of the thermoelectric converter 20 to open or close supply of gas. Temperature detector 87 detects the temperature of the combustion means 14 electrically. A temperature controller 88 is operated by the generated power of the thermoelectric converter 20, and controls driving of the temperature regulation switching means 86 by receiving a temperature detection signal from a temperature detector 87, and also comprises setting means 89 of regulating temperature. A temperature regulation switching means drive unit 90 for starting operation opens the temperature regulation switching means 86 and supplies the gas in order to operate the combustion means 14 while the thermoelectric converter 20 is not generating electric power upon start of operation.

Referring now to FIG. 28, the operation and action are described below. By manipulating to start operation, to supply gas into the combustion means 14 from the gas main feed valve 41, the temperature regulation switching means drive unit 90 for starting operation opens the temperature regulation switching means 86. In this state, when the combustion means 14 starts combustion, a temperature difference is caused in the thermoelectric converter 20, and electric power is generated, and the temperature regulation switching means 86 is kept open, and the temperature regulation controller 88 is operated. The temperature regulation controller 88 receives a temperature detection signal from the temperature detector 87 and controls the temperature regulation switching means 86 so as to be adjusted to the set regulation temperature. At the same time, the power is also supplied into the heat medium forced circulating means 16, and the heat medium is transferred. The combustion heat of the combustion means 14 is received in the heat exchanger 15, and is exchanged of heat with the heat medium transferred by the heat medium forced circulating means 16. Further, the heat medium circulates into the heat releasing means 19 to release heat, and returns to the heat exchanger 15 from the heat medium forced circulating means 16. Since the temperature of the combustion means 14 is correlated with the temperature of the heat medium, when the temperature regulation controller 88 controls the temperature of the combustion means 14, the heat medium is regulated to the set temperature. By further manipulating the setting means 89 of regulating temperature, the heat medium is regulated of temperature and the set temperature can be changed. Thus, the temperature is regulated.

Since the temperature detector 87 and temperature regulation controller 88 operate electrically, the starting and stopping period of combustion is short, and stopping of the heat medium forced circulating means 16 due to drop of power can be prevented, and the apparatus operates stably. Moreover, since the gas feed is opened or closed by the temperature regulation switching means 86 which is driven by electric power, the gas can be opened and closed securely, it is hence possible to prevent such phenomenon as injection of trace of gas in spite of extinction of combustion flame, or failure of combustion in spite of injection of trace of gas, and the heat medium temperature can be controlled stably. Therefore, it can be applied in thermotherapy. Also by the temperature regulation controller 88 having the temperature detector 87 for detecting the temperature electrically and the setting means 89 of regulating temperature, the temperature regulation range of the heat medium can be changed steplessly, and the scope of application is expanded.

(Embodiment 19)

Figure 29:
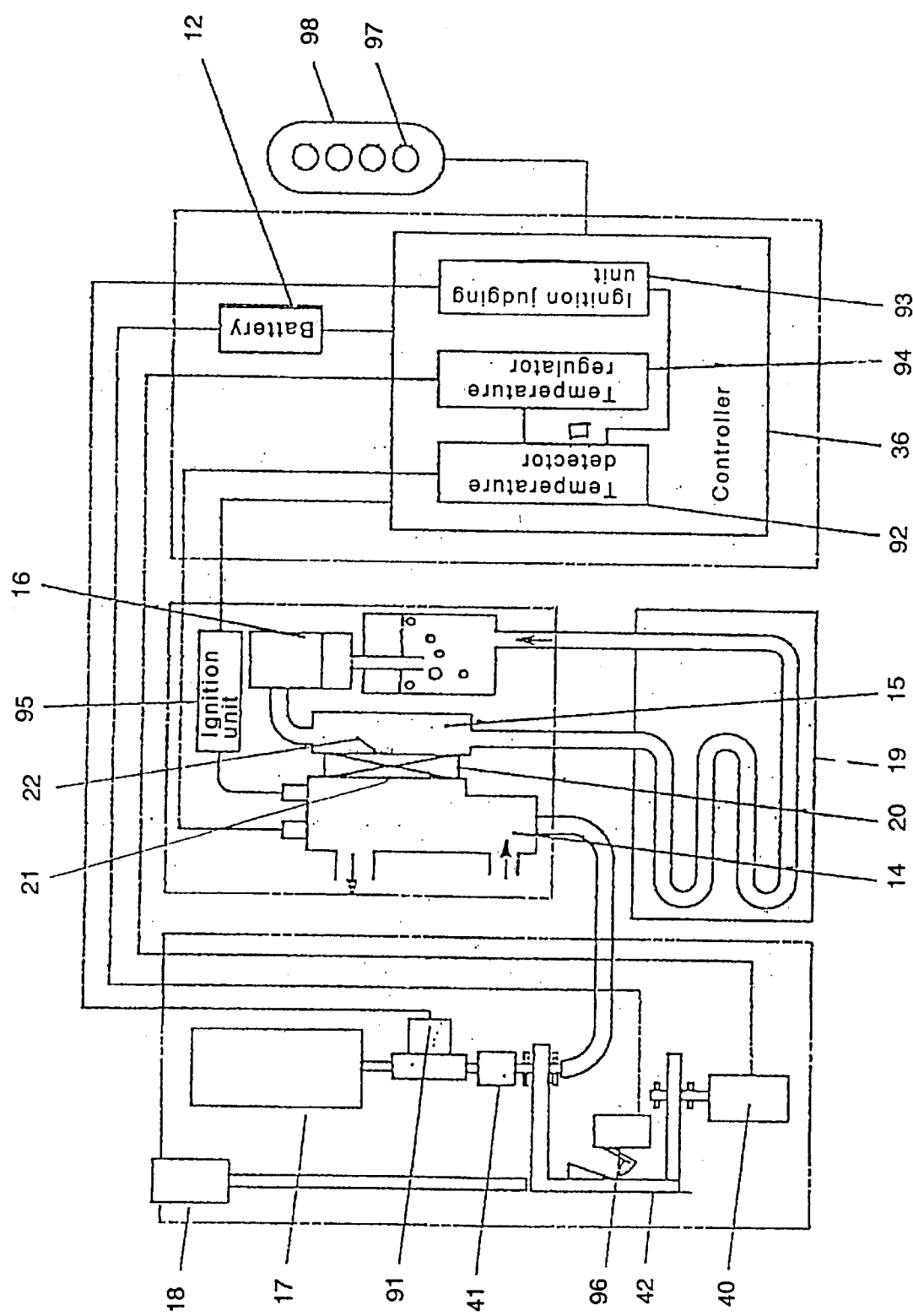
FIG. 29 is a structural diagram of a heat transfer apparatus in embodiment 19 of the invention.

FIG. 29 is a structural diagram of a heat transfer apparatus in embodiment 19 of the invention.

As shown in the diagram, the heat transfer apparatus comprises a thermoelectric converter 20 for generating electric power depending on the temperature difference, combustion means 14 for giving heat to the thermoelectric converter 20, a heat exchanger 15 for exchanging heat between the heat transmitted through the thermoelectric converter 20 and the heat medium, heat medium forced circulating means 16 driven by the generated power of the thermoelectric converter 20 for transferring the heat medium, heat releasing means 19 for circulating the heat medium exchanged of heat by the heat exchanger 15 and releasing heat, and a heat medium passage 29 for circulating the heat medium by connecting the heat medium forced circulating means 16, heat exchanger 15 and heat releasing means 19. A gas main feed valve 41 opens or closes feed of gas as fuel for the combustion means 14, and a gas amount controller 91 communicates with the gas main feed valve 41 and opens and closes the feed of gas. A combustion detection solenoid 40 attracts and holds the movable valve unit when the coil is excited by electric power. A controller 36 comprises a temperature detector 92 operated by a battery 12 for detecting the temperature of the combustion means 14, an ignition judging unit 93 for judging ignition of the combustion means 14 by the output of the temperature detector 92 and controlling power supply of the battery 12 to the combustion detection solenoid 40, a temperature regulator 94 for judging the temperature of the combustion means 14 correlating with the heat medium temperature for regulating the temperature of the heat medium by the output from the temperature detector 92, and controlling power supply of the battery 12 to the gas amount controller 91, and an ignition unit 95 for igniting by striking a spark by the power of the battery 12. A combustion operation mechanism 42, by ignition operation, moves the movable valve of the combustion detection solenoid 40 to the attracting and holding position, and opens the gas main feed valve 41, and starts operation of the controller 36 by an operation switch 96. Reference numeral 97 is a stop switch, 17 is a fuel container for feeding gas, and 98 is a display unit.

The operation and action are described below. By ignition operation, the combustion operation mechanism 42 moves the movable valve unit of the combustion detection solenoid 40 to the attracting and holding position, opens the gas main feed valve 41, and starts operation of the controller 36 by the operation switch 96. Accordingly, when power is supplied into the controller 36, the controller 36 opens the gas amount controller 91, and at the same time operates the ignition unit 95 to start ignition. When the gas amount controller 91 is opened by the controller 36, since the gas main feed valve 41 is also open, the fuel gas is supplied into the combustion means 14, and the ignition unit 95 strikes a spark electrically and the gas is ignited. As the gas is ignited and the combustion means 14 starts combustion, the temperature of the combustion means 14 detected by the temperature detector 92 climbs up, and the ignition judging unit 93 judges that the gas is ignited, and the combustion continues.

At the same time, the thermoelectric converter 20 receives the combustion heat of the combustion means 14 at its high temperature side 21, and transmits the heat from its low temperature side 22 to the heat exchanger 15, and generates electric power depending on the temperature difference between the high temperature side 21 and low temperature side 22. When the generated power reaches the value enough for driving the heat medium forced circulating means 16, the heat medium forced circulating means 16 is driven and the heat medium is transferred, and the heat medium is exchanged of heat in the heat exchanger 15, and is sent into the heat releasing means 19, and after releasing heat, the heat medium returns to the heat exchanger 15. The temperature of the heat medium is regulated as follows. As the combustion continues and the heat medium temperature rises, the temperature of the combustion means 14 also goes up in correlation, and when the temperature of the combustion means 14 detected by the temperature detector 92 reaches a preset temperature, the temperature regulator 94 closes the gas amount controller 91 to stop combustion, and when the temperature declines, combustion is started again. This operation is repeated thereafter to regulate the temperature.

To stop combustion operation, by stopping process, the controller 36 stops power supply to the combustion detection solenoid 40, and excitation of the coil is stopped, and the movable valve unit is released by the repulsive force of spring, and the gas main feed valve 41 is closed through the combustion operation mechanism 42. As a result, supply of gas is stopped, and combustion ceases.

In this way, ignition, combustion and extinction are operated, and the heat medium forced circulating means 16 which requires the largest power is driven by the generated power of the thermoelectric converter 20, and the battery 12 is not consumed in a short time but can be used for a long time. The battery 12 is used as the power source for the combustion detection solenoid 40, gas amount controller 91, ignition unit 95 and controller 36, and the ignition, extinction, combustion, heat medium temperature regulation are controlled electronically, so that a stable operation is realized. Moreover, the display unit 98 is provided so that the ignition state is visually exhibited, so that the convenience of use is enhanced.

(Embodiment 20)

Figure 30:
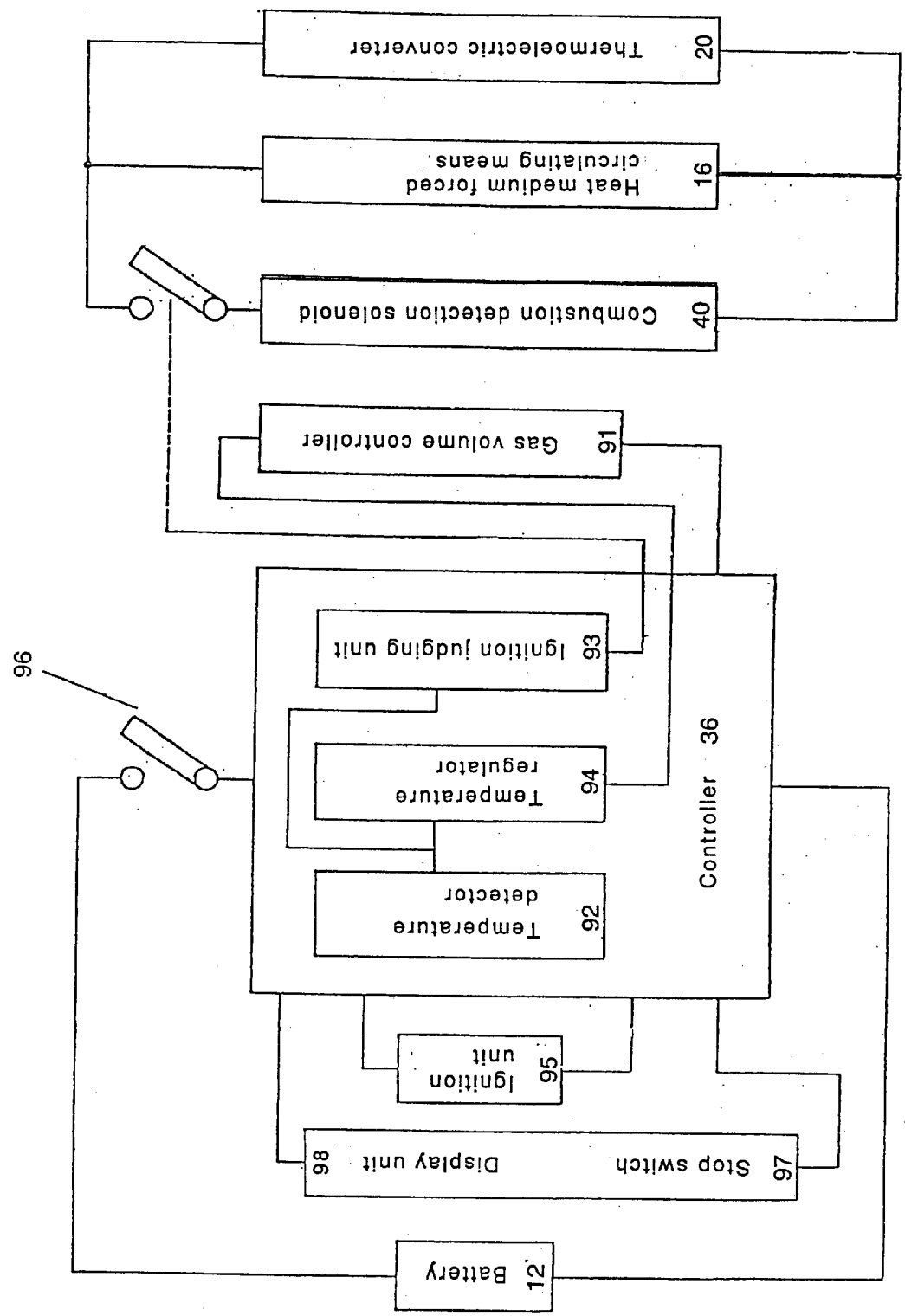
FIG. 30 is a block diagram of an electric circuit of a heat transfer apparatus in embodiment 20 of the invention.

FIG. 30 is a block diagram of an electric circuit of a heat transfer apparatus in embodiment 20 of the invention.

What differs from embodiment 19 is as follows: the generated power of the thermoelectric converter 20 is supplied into the heat medium forced circulating means 16 and combustion detection solenoid 40, the ignition judging unit 93 does not supply power of the battery 12 to the combustion detection solenoid 40, and the controller 36 controls to supply power from the thermoelectric converter 20 to the combustion detection solenoid 40.

The operation and action are described below. By ignition operation, the controller 36 receives power from the battery 12 and operates, and the circuit from the thermoelectric converter 20 to the combustion detection solenoid 40 is connected. When the combustion means 14 starts combustion, the thermoelectric converter 20 generates electric power, and the generated power is supplied into the combustion detection solenoid 40. Its coil is excited, and the movable valve unit is attracted and held, and the combustion continues through the combustion operation mechanism 42.

The ignition can be detected earlier than in the case of judging completion of ignition when the temperature detector 92 detects that the temperature of the combustion means 14 has reached the specified temperature. Moreover, the power of the battery 12 is not supplied to the combustion detection solenoid 40, and hence its life is extended.

(Embodiment 21)

Figure 31:
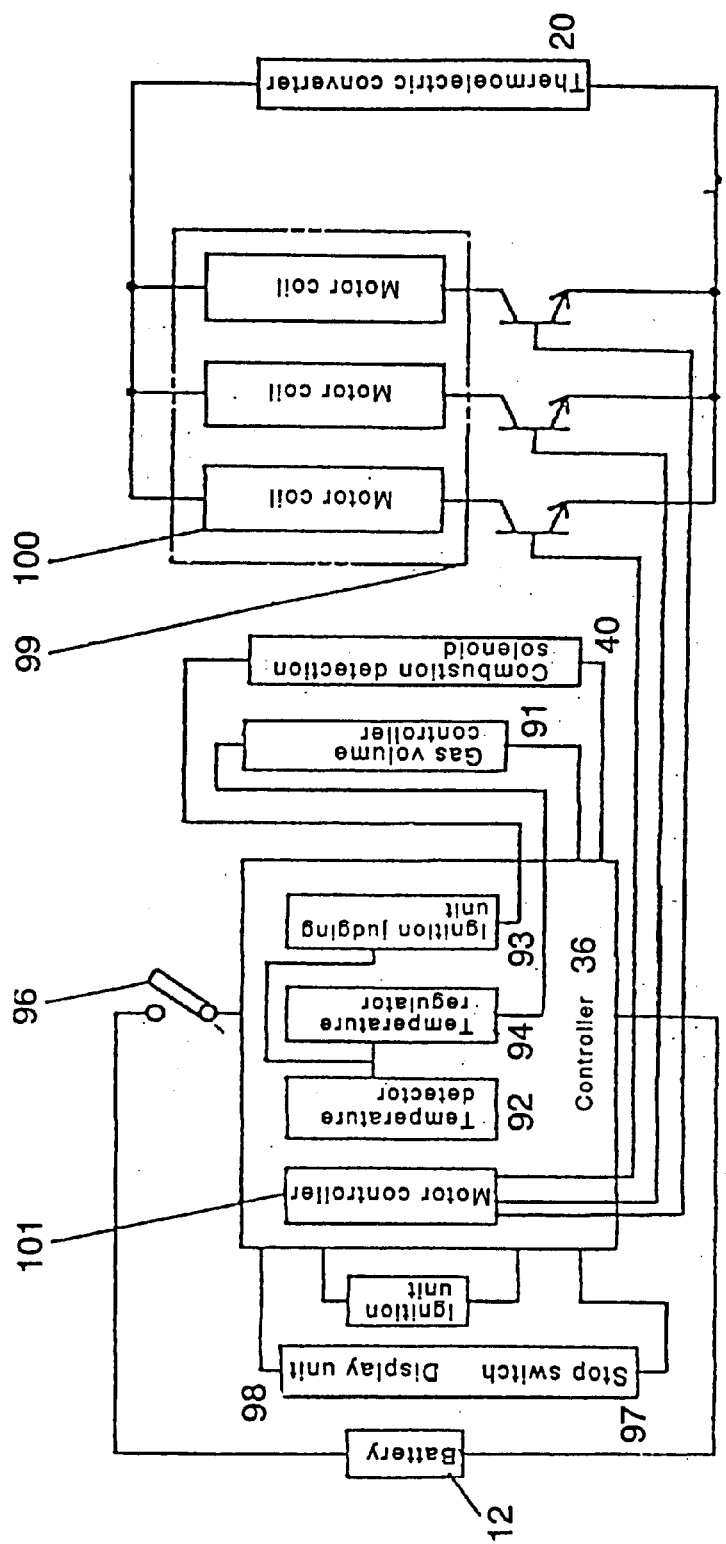
FIG. 31 is a block diagram of an electric circuit of a heat transfer apparatus in embodiment 21 of the invention.

FIG. 31 is a block diagram of an electric circuit of a heat transfer apparatus in embodiment 21 of the invention.

What differs from embodiment 19 is as follows: a brushless motor 99 is used as the motor for driving the heat medium forced circulating means 16, generated power of the thermoelectric converter 20 is supplied into a motor coil 100 of the brushless motor 99, a motor controller 101 is provided for controlling power supply from the thermoelectric converter 20 to the motor coil 100, and the controller 36 is operated by the power of the battery 12.

The operation and action are described below. By ignition operation, the combustion operation mechanism 42 moves the movable valve unit of the combustion detection solenoid 40 to the attracting and holding position, and opens the gas main feed valve 41, thereby starting operation of the controller 36. The gas amount controller 91 is opened by the power of the battery 12, and, at the same time, the ignition unit 95 is put in operation to start ignition. When the gas amount controller 91 is opened, since the gas main feed valve 41 is also open, the fuel gas is supplied into the combustion means 14, and the ignition unit 95 strikes a spark to ignite the gas. When power of the battery 12 is supplied into the controller 36, the motor controller 101 of the controller 36 controls to supply the generated power of the thermoelectric converter 20 sequentially into a plurality of motor coils 100. When the combustion means 14 starts combustion, the thermoelectric converter 20 generates electric power, and the generated power is supplied into the combustion detection solenoid 40, and the coil is excited to attract and hold the movable valve unit, and combustion continues through the combustion operation mechanism 42. At the same time, the generated power of the thermoelectric converter 20 is supplied into the motor coils 100, and the brushless motor 99 is put into rotation.

The power of the battery 12 is not supplied into the motor coils 100 of the brushless motor 99 of the heat medium forced circulating means 16, and the generated power of the thermoelectric converter 20 is supplied into the controller 36 having the motor controller 101 for sequentially changing over and supplying into the plurality of motor coils 100, so that the battery life is extended.

(Embodiment 22)

Figure 32:
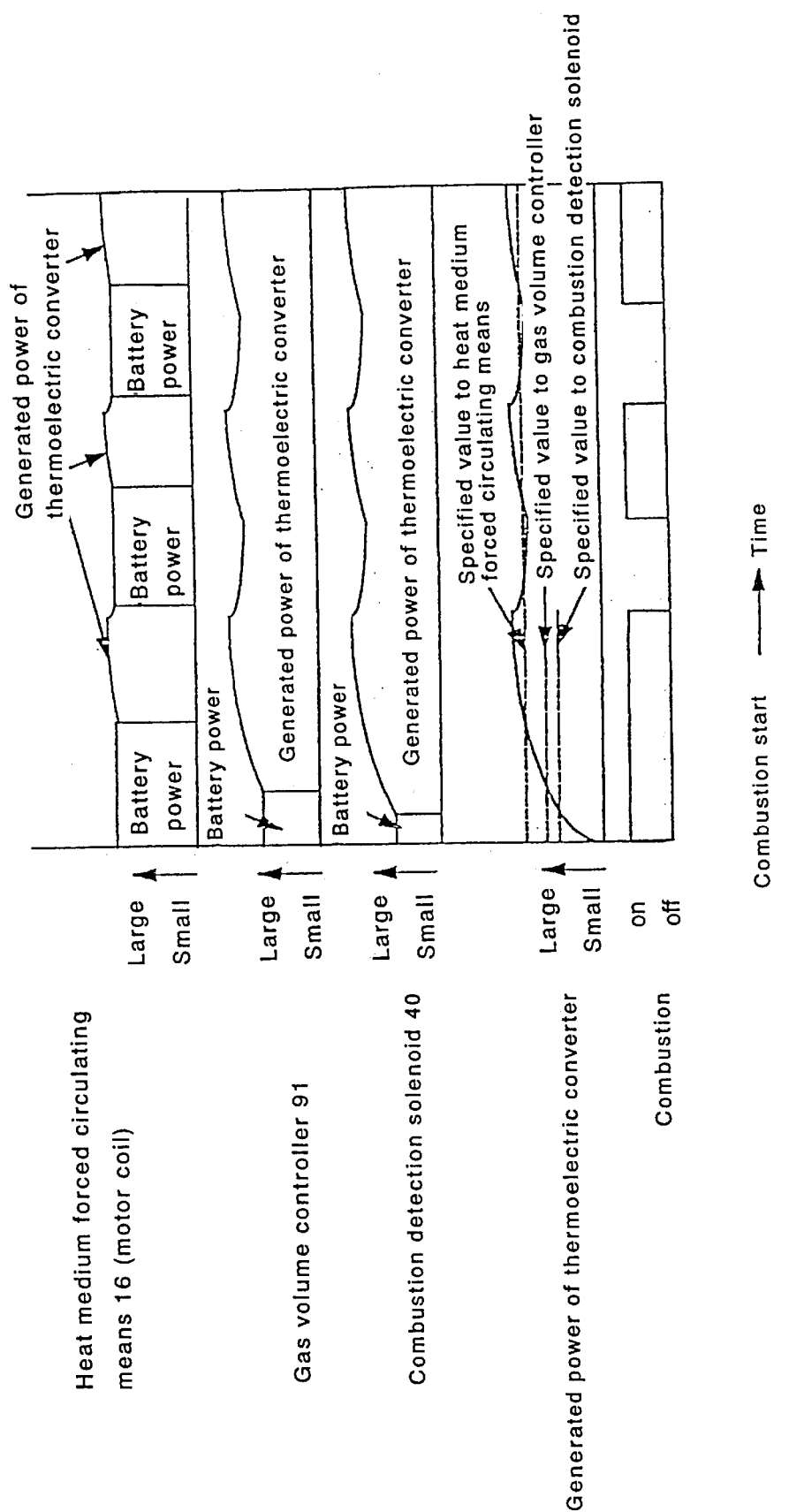
FIG. 32 is a sequence diagram of a heat transfer apparatus in embodiment 22 of the invention.

FIG. 32 is a sequence diagram of a heat transfer apparatus in embodiment 22 of the invention.

The controller in this embodiment is designed to supply the power to the combustion detection solenoid 40, gas amount controller 91 and heat medium forced circulating means 16 in FIG. 29 to FIG. 32, from the battery 12 if the generated power of the thermoelectric converter 20 is below a specified value, and change over to the generated power of the thermoelectric converter 20 above the specified value. When the heat medium forced circulating means 16 employs a brushless motor 99, any one of the motor coils 100 is selected and power is supplied.

A more specific description follows. By ignition operation, the combustion operation mechanism 42 moves the movable valve unit of the combustion detection solenoid 40 to the attracting and holding position, and opens the gas main feed valve 41, thereby starting operation of the controller 36. When the power of the battery 12 is supplied into the controller 36, the controller 36 opens the gas amount controller 91 by the power of the battery 12, and at the same time, the ignition unit 95 is operated to ignite. When the gas amount controller 91 is opened, since the gas main feed valve 41 is also open, the fuel gas is supplied into the combustion means 14, and the ignition unit 95 strikes a spark to ignite the gas. When the combustion means 14 starts combustion, the thermoelectric converter 20 generates electric power. The ignition judging unit 93 detects the generated power, and judges the ignition of the combustion means 14 when reaching a specified value, and changes over the power supply to the combustion detection solenoid from the battery 12 to the generated power of the thermoelectric converter 20.

Consequently, when the generated power of the thermoelectric converter 20 reaches the specified value, the controller 36 changes the power supply to the gas amount controller 91 from the battery 12 to the generated power of the thermoelectric converter 20.

When the generated power of the thermoelectric converter 20 reaches the specified value, the controller 36 then changes over the power supply to the heat medium forced circulating means 16 from the battery 12 to the generated power of the thermoelectric converter 20.

If the heat medium forced circulating means 16 employs a brushless motor 99, the power supply to the motor coils 100 is changed over from the battery 12 to the generated power of the thermoelectric converter 20.

In temperature regulation of the heat medium, when the temperature of the combustion means 14 detected by the temperature detector 92 has reached a specified value, the temperature regulator 94 closes the gas amount controller 91 to stop combustion, and when the generated power of the thermoelectric converter 20 declines, the controller 36 changes over the power supply to the heat medium forced circulating means 16 to the battery 12. When the combustion is resumed and the generated power of the thermoelectric converter 20 reaches the specified value, the controller 36 changes over the power supply to the generated power of the thermoelectric converter 20, and thereafter repeats the same operation.

Right after start of operation, a stable operation is assured by the power supply from the battery 12, and as the generated power of the thermoelectric converter 20 reaches the specified value, it is changed over to the generated power of the thermoelectric converter 20, and the battery life is extended.

When exceeding the specified value, the power supply to the combustion detection solenoid 40 is changed over from the battery 12 to the generated power of the thermoelectric converter 20, and the completion of ignition is judged, and hence it is possible to detect ignition earlier than in the case of judging the completion of ignition when the temperature detector 92 detects the temperature of the combustion means 14 reaching the specified temperature.

(Embodiment 23)

Figure 33:
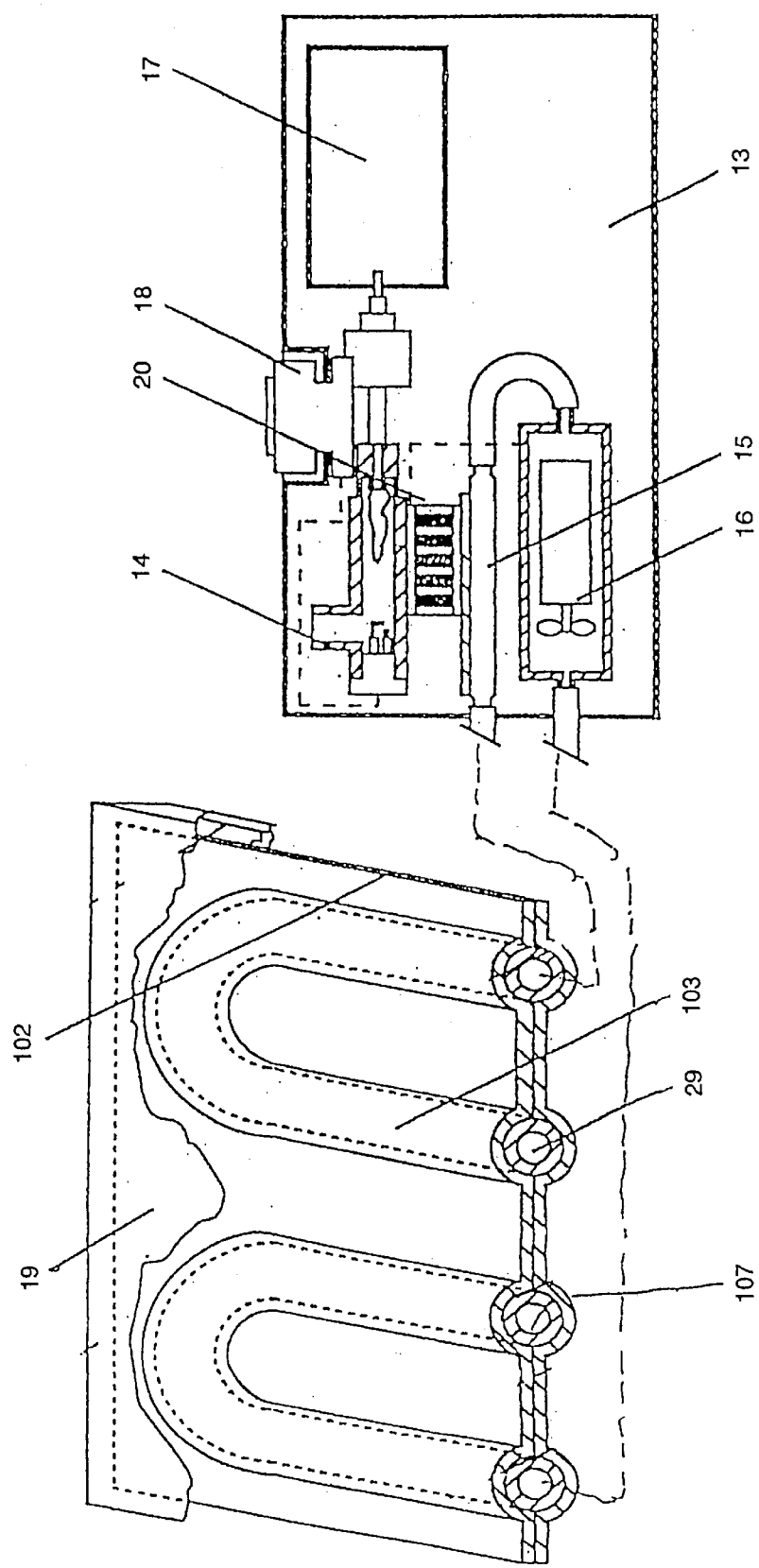
FIG. 33 is a sectional view of a heat transfer apparatus in embodiment 23 of the invention.

FIG. 33 is a sectional view of a heat transfer apparatus in embodiment 23 of the invention.

What differs from embodiment 1 is as follows: both sides of an aluminum foil are laminated with a resin material to form an aluminum laminate sheet 102 having a multilayer elastic structure, and two aluminum laminate sheets 102 are overlaid, and the heat releasing means 19 is formed so that a non-fusion seal unit 103 may serve as a heat medium passage 29 for allowing the heat medium to pass. In this embodiment, to prevent deformation or closure of the heat medium passage 29 due to external force, a flexible passage shape retaining member 107, for example, a circular coil member withstanding the external force is inserted in the heat medium passage 29.

Same reference numerals as in embodiment 1 refer to same constituent members, and duplicate explanation is omitted.

Since the non-fusion seal unit 103 of the portion of the aluminum laminate sheet 102 not fused and sealed is used as the heat medium passage 29 for heat medium, the aluminum laminate sheet 102 prevents the heat medium from flowing out, and heat transfer is stable for a long period. Moreover, since the aluminum laminate sheet 102 itself is used as the heat medium passage 29, the flexibility is outstandingly excellent, and also since the aluminum laminate sheet 102 itself is contacting with the heat medium, the aluminum foil exhibits the uniform heating effect, and the comfort is further enhanced when used and worn on the human body as the warming jacket or mat. When used and worn on the human body as the warming jacket or mat, it may be suddenly folded, but since the passage shape retaining member 107 is inserted, the heat medium passage 29 will not be narrowed or closed.

The heat releasing means 19 or the transfer tube may be made of a flexible tube tightly covered with the aluminum laminate sheet. For example, the outer circumference of the tube is tightly covered with a flexible aluminum laminate sheet in a multilayer structure laminating both sides of an aluminum foil with a resin material, laminate layers of resin material of the confronting sides of the overlaid portion of one end and other end of the aluminum laminate sheet are mutually fused to be adhered to the tube. The aluminum laminate sheet is wound around the tube so that the longitudinal direction of the overlaid portion may be parallel to the axial direction B of the tube, so that passing of the heat medium from the surface is prevented.

In this arrangement, since the aluminum foil of the aluminum laminate sheet covering the tube is metal, the heat medium is prevented from escaping outside as vapor.

Since the aluminum laminate sheet is formed so that the longitudinal direction of the overlaid portion may be parallel to the axial direction of the tube so as to be pliable, the transfer tube made of such material is pliable and flexible enough when used and worn on the human body as the warming jacket or mat. Further, by the action of the aluminum foil of the aluminum laminate sheet, heat releasing is promoted and uniform heating effect is obtained, and the sense of comfort is enhanced when the heat releasing means is used and worn on the human body as the warming jacket or mat.

In another construction, the outer circumference of the tube may be covered tightly by spirally winding an aluminum laminate sheet, and the laminate resin layers at the overlaid portions of spiral winding may be mutually fused to cover the tube surface with an aluminum laminate sheet. In this embodiment, too, the same effects are obtained.

Alternatively, without using tube, the transfer tube may be composed only of aluminum laminate sheet.

In this arrangement, since tube is not used, the flexibility is improved outstandingly, and the sense of wearing is much improved when used and worn on the human body as the warming jacket or mat. Using the aluminum laminate sheet, transmission of heat medium to outside is prevented. Moreover, since the heat is transferred only through the aluminum laminate sheet, the heat releasing effect is much improved as compared with the case of heat release through the tube.

(Embodiment 24)

Figure 34:
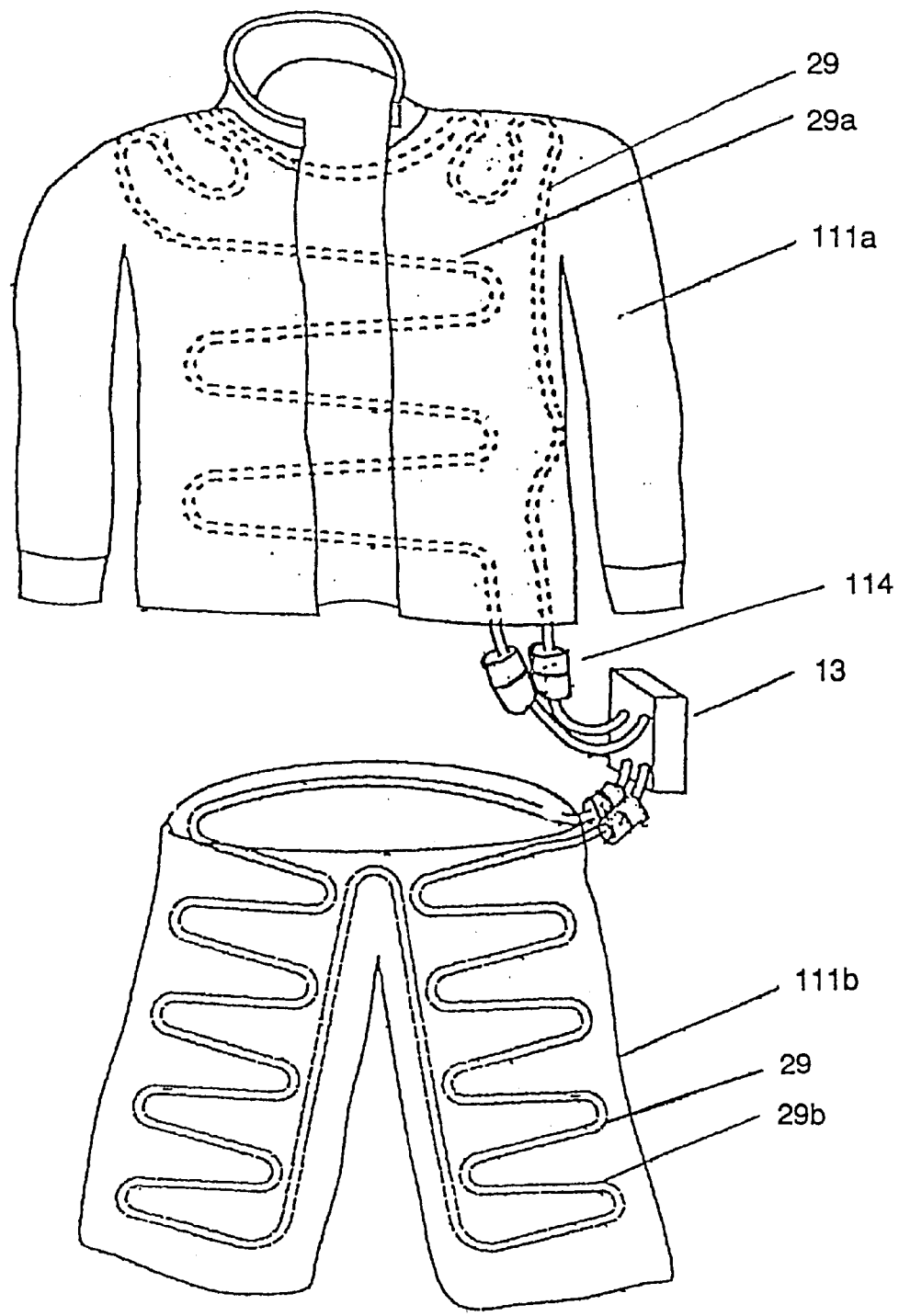
FIG. 34 is an outline view of a heat transfer apparatus in embodiment 24 of the invention.
Figure 35:
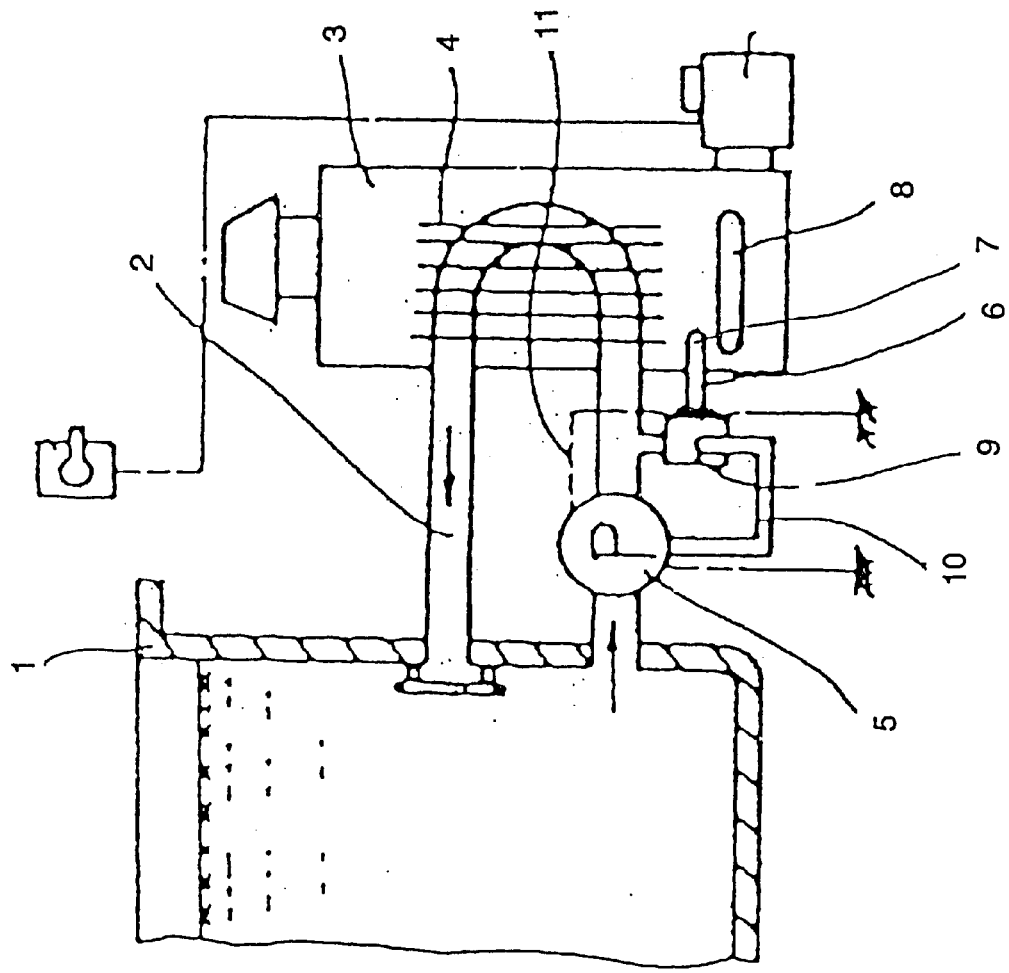
FIG. 35 is a structural diagram of a conventional heat transfer apparatus.

FIG. 34 is an appearance view of a heat transfer apparatus in embodiment 24 of the invention.

The heat releasing means in embodiment 24 is a plurality of clothes 111*a*, 111*b* for keeping warmth by circulating and releasing the heat medium heated and exchanged of heat by the heat exchanger, in which flexible heat medium passages for passing the heat medium transferred from the heat medium forced circulating means are arranged.

The operation and action are described. Consisting of a plurality of clothes, the user wears clothes 111*a*, 111*b* on plural positions of the body. For example, when piece A 111*a* is worn on the upper half and piece B 111*b* on the lower half, the heat medium is transferred from the unit main body (apparatus main body ) 13 to the piece A 111*a* and piece B 111*b*, so that the upper half and lower half of the body can be warmed at the same time. Since the heat medium passage 29 is formed in the configuration suited to the shape of the piece A 111*a* and piece B 111*b*, it is possible to warm uniformly. Thus, plural positions can be warmed at the same time, the temperature distribution is uniform, and the comfort is enhanced.

In FIG. 34, the heat medium passage 29*a* of the piece A 111*a* and the heat medium passage 29*b* of the piece B 111*b* are connected parallel to the unit main body 13, but they may be also connected in series so as to enter from the unit main body 13 into the heat medium passage 29*a* of the piece A 111*a*, then enter from the heat medium passage 29*a* into the heat medium passage 29*b* of the piece B 111*b*, and return to the unit main body 13 from the heat medium passage 29*b*. Or they may be connected in reverse order.

In other configuration of the heat medium passages for passing the heat medium through trousers, the heat medium enters from the waist portion of the upper portion of the trousers into one tubular piece for inserting one leg, and advances downward in the tubular portion, and makes a U-turn to advance upward, repeats similarly to finish the entire tubular portion, and then gets into other tubular portion for inserting other leg, advances downward in the tubular portion, makes a U-turn to advance upward, and repeats similarly to finish the entire tubular portion, and returns to the initial inlet portion in the waist portion.

The foregoing embodiments of the heat transfer apparatus may be further modified by, for example, disposing a flexible joint 114 for connecting and separating freely without allowing escape of heat medium in the midst of the heat medium passage (a representative example is shown in FIG. 34).

The construction of this flexible joint 114 is not shown, but it consists of an inserting portion and a receiving portion, and when the inserting portion and receiving portion are separated, the both close the passage by their internal blocking plates to prevent the internal heat medium from escaping outside, and when coupled, the blocking plates are released, and the passage is opened. In the embodiment in FIG. 34, when separating the unit main body 13 from the trousers, the flexible joint 114 provided in the heat medium passage is separated, so that the flexible joint is set apart without leaking the internal heat medium, and the unit main body can be separated from the trousers.

Several types of heat releasing means are presented, and representative examples include the jacket and trousers of clothes, mat, lap blanket, and wheelchair mat, and these warming devices can be used in combination with the heat transfer apparatus explained in the embodiments, and the heat medium passages may be arranged and shaped according to the shape of the warming devices, and therefore it is possible to warm uniformly, the temperature distribution is improved, and the comfort is enhanced.

What is claimed is:

1. A heat transfer apparatus comprising:
a combustion device for generating heat;
a heat exchanger;
a thermoelectric converter having a high temperature side and a low temperature side, wherein said thermoelectric converter is adapted to receive the heat generated by said combustion device at the high temperature side, transfer the heat from the low temperature side to said heat exchanger, and generate an electric power depending on a temperature difference between the high temperature side and the low temperature side;

a heat medium forced circulating device capable of being driven by the generated electric power of said thermoelectric converter so as to transfer said heat medium to said heat exchanger;
a heat releasing device for circulating and releasing the heat medium that has been heat exchanged in said heat exchanger;
a battery for supplying an electric power to said heat medium forced circulating device;
a changeover switch for changing over between said thermoelectric converter or said battery in order to change a the source of power for said heat medium forced circulating device;
a controller for controlling said changeover switch; and
a voltage detector for detecting a voltage generated by said thermoelectric converter, wherein said changeover switch is operated when said voltage generated by said thermoelectric converter reaches a preset voltage.

2. A heat transfer apparatus as claimed in claim 1, wherein said heat exchanger receives heat directly from said combustion device, and the heat received by said heat exchanger is a sum of the heat received directly from said combustion device and the heat from said thermoelectric converter, wherein the sum of the heat received by said heat exchanger is exchanged with the heat medium.

3. A heat transfer apparatus as claimed in claim 2, wherein said combustion device includes a combustion emission exhaust port, and said thermoelectric converter and/or said heat exchanger is positioned so as to be heated by combustion emission from said combustion emission exhaust port.

4. A heat transfer apparatus as claimed in claim 1, wherein said combustion device includes a combustion emission exhaust port, and said thermoelectric converter and/or said heat exchanger is positioned so as to be heated by combustion emission from said combustion emission exhaust port.

5. A heat transfer apparatus as claimed in claim 1, further comprising:
a main feed valve for opening or closing a fuel supply for said combustion device;
a combustion detection solenoid including a movable valve unit and a coil that is excitable by the power generated by said thermoelectric converter to produce a magnetic force for attracting and holding said movable valve unit in an open position; and
a combustion operation mechanism coupling said main feed valve and said movable valve unit of said combustion detection solenoid.

6. A heat transfer apparatus as claimed in claim 5, further comprising:
a switch for opening or closing the supply of power generated by said thermoelectric converter;
a piezoelectric igniter for igniting the fuel; and
an operation knob for operating said combustion operation mechanism, wherein said switch is closed and said movable valve unit is moved to the attracting and holding position, while said main feed valve is opened.

7. A heat transfer apparatus as claimed in claim 5, further comprising a heat medium temperature overheat switch for detecting the heat medium temperature, wherein a power circuit of said combustion detection solenoid is opened and the supply of fuel is stopped when the heat medium temperature exceeds a preset value.

8. A heat transfer apparatus as claimed in claim 5, wherein as said combustion device is shifted from a normal combustion state to an imperfect combustion or a misfiring state, said combustion detection solenoid detects a drop in power generated by said thermoelectric converter, and a fuel passage is closed by said movable valve unit.

9. A heat transfer apparatus as claimed in claim 5, further comprising a controller for controlling the power supplied to said heat medium forced circulating device, wherein said controller controls the power supplied to said heat medium forced circulating device within a preset power that does not exceed an upper limit of an electromotive force of said thermoelectric converter.

10. A heat transfer apparatus as claimed in claim 5, further comprising:
   an ignition device for igniting said combustion device;
   a temperature detector for detecting a temperature of said combustion device;
   an ignition judging unit for judging ignition of said combustion device based on an output from said temperature detector and controlling the power supplied to said combustion detection solenoid; and
   a temperature regulator for regulating the temperature of the heat medium based on an output of said temperature detector.

11. A heat transfer apparatus as claimed in claim 10, wherein the power generated by said thermoelectric converter can be supplied to said heat medium forced circulating device and said combustion detection solenoid, and said ignition judging unit controls the power supplied to said combustion detection solenoid from said thermoelectric converter.

12. A heat transfer apparatus as claimed in claim 10, further comprising:
   a brushless motor for driving said heat medium forced circulating device, said brushless motor having motor coils, wherein the power generated by said thermoelectric converter is supplied to the motor coils of said brushless motor; and
   a motor controller provided for controlling the power supplied to said motor coils from said thermoelectric converter, wherein said motor controller can be operated by power supplied from said battery.

13. A heat transfer apparatus as claimed in claim 1, further comprising a boosting circuit for boosting the power generated by said thermoelectric converter and an oscillating circuit for operating said boosting circuit, wherein voltage generated by said thermoelectric converter can be boosted and supplied to said heat medium forced circulating device.

14. A heat transfer apparatus as claimed in claim 13, further comprising:
   a controller for controlling the supply of power from said battery or the supply of power generated by said thermoelectric converter to said combustion detection solenoid without supplying power to said heat medium forced circulating device from a start of an operation until the power generated by said thermoelectric converter reaches a specified value, and stopping the supply of power from said battery and supplying the power generated by said thermoelectric converter to both said combustion detection solenoid and said heat medium forced circulating device when the power generated by said thermoelectric converter reaches the specified value.

15. A heat transfer apparatus as claimed in claim 13, further comprising:
   a controller for feeding power from said battery to said heat medium forced circulating device and feeding power from said battery or the power generated by said thermoelectric converter to said combustion detection solenoid from a star of operation until the power generated by said thermoelectric converter reaches a specified value, and stopping the supply of power from said battery and the feeding the power generated by said thermoelectric converter to said combustion detection solenoid and said heat medium forced circulating device when the power generated by the thermoelectric converter reaches the specified value.

16. A heat transfer apparatus as claimed in claim 13, further comprising:
   storage means for storing electric power generated by said thermoelectric converter; and
   a controller for stopping the supply of power to said heat medium forced circulating device, feeding power generated by said thermoelectric converter to said combustion detection solenoid until power stored in said storage means reaches a specified value, feeding continuously the power generated by said thermoelectric converter to said combustion detection solenoid, and feeding the stored power of said thermoelectric converter to said heat medium forced circulating device when the stored power in said thermoelectric converter reaches the specified value.

17. A heat transfer apparatus as claimed in claim 13, further comprising a controller for stopping the supply of power to said heat medium forced circulating device, feeding the power of said battery to said combustion detection solenoid from a start of operation until the stored power of said thermoelectric converter reaches a specified value, feeding the power generated by said thermoelectric converter or the power of the battery to said combustion detection solenoid, and feeding the stored power of said thermoelectric converter to said heat medium forced circulating device when the stored power of said thermoelectric converter reaches the specified value.

18. A heat transfer apparatus as claimed in claim 1, further comprising:
   a controller for controlling the supply of power from said battery or the supply of power generated by said thermoelectric converter to said combustion detection solenoid without supplying power to said heat medium forced circulating device from a start of an operation until the power generated by said thermoelectric converter reaches a specified value, and stopping the supply of power from said battery and supplying power generated by said thermoelectric converter to both said combustion detection solenoid and said heat medium forced circulating device when the power generated by said thermoelectric converter reaches the specified value.

19. A heat transfer apparatus as claimed in claim 1, further comprising:
   a controller for feeding power from said battery to said heat medium forced circulating device and feeding power from said battery or the power generated by said thermoelectric converter to said combustion detection solenoid from a star of operation until the power generated by said thermoelectric converter reaches a specified value, and stopping the supply of power from said battery and the feeding the power generated by said thermoelectric converter to said combustion detection solenoid and said heat medium forced circulating device when the power generated by the thermoelectric converter reaches the specified value.

20. A heat transfer apparatus as claimed in claim 1, further comprising:

storage means for storing electric power generated by said thermoelectric converter; and a controller for stopping the supply of power to said heat medium forced circulating device, feeding power generated by said thermoelectric converter to said combustion detection solenoid until power stored in said storage means reaches a specified value, feeding continuously the power generated by said thermoelectric converter to said combustion detection solenoid, and feeding the stored power of said thermoelectric converter to said heat medium forced circulating device when the stored power in said thermoelectric converter reaches the specified value.

21. A heat transfer apparatus as claimed in claim 1, further comprising a controller for stopping the supply of power to said heat medium forced circulating device, feeding the power of said battery to said combustion detection solenoid from a start of operation until the stored power of said thermoelectric converter reaches a specified value, feeding the power generated by said thermoelectric converter or the power of the battery to said combustion detection solenoid, and feeding the stored power of said thermoelectric converter to said heat medium forced circulating device when the stored power of said thermoelectric converter reaches the specified value.

22. A heat transfer apparatus as claimed in claim 1, further comprising a controller for controlling the power supplied to said heat medium forced circulating device, wherein said controller controls the power supplied to said heat medium forced circulating device within a preset power that does not exceed an upper limit of an electromotive force of said thermoelectric converter.

23. A heat transfer apparatus as claimed in claim 1, further comprising a gas capturing container provided in a portion of said heat medium passage, said gas capturing container having a heat medium flow-in passage and a heat medium flow-out passage, wherein a flow inlet of said flow-out passage is positioned within said gas capturing container.

24. A heat transfer apparatus as claimed in claim 23, further comprising a liquid level detector provided near the flow inlet of said flow-out passage in said gas capturing container, wherein a liquid level drop signal is emitted when a detection signal from said liquid level detector reaches a preset detection value.

25. A heat transfer apparatus as claimed in claim 1, further comprising:

a heat medium passage for circulating the heat medium formed by connecting said heat medium forced circulating device, said heat exchanger, and said heat releasing device sequentially, fuel feed means for feeding fuel into said combustion device;

temperature regulation switching device for opening or closing a fuel passage depending on the temperature of the heat medium; and a temperature regulation variable mechanism for regulating the temperature of the heat medium.

26. A heat transfer apparatus as claimed in claim 1, wherein said heat releasing device comprises:

a multilayer structure formed of a plurality of aluminum laminate sheets, wherein each aluminum laminate sheet includes an aluminum foil coated on both sides with a resin material; and a heat medium passage, for passing the heat medium, formed between opposing sheets of said aluminum laminate, wherein said heat medium passage is formed at areas of said opposing laminate sheets that are not fused and sealed, while remaining areas of said opposing laminate sheets are mutually fused and sealed.

27. A heat transfer apparatus as claimed in claim 26, wherein said heat releasing device further comprises a passage shape retaining member inserted in said heat medium passage.

28. A heat transfer apparatus as claimed in claim 1, further comprising:

a housing accommodating said thermoelectric converter, said combustion device, said heat medium forced circulating device, and said heat exchanger; and a detachable flexible joint connecting said housing and said heat releasing device.

29. A warming device including a heat transfer apparatus comprising:

a combustion device for generating heat;

a heat exchanger;

a thermoelectric converter having a high temperature side and a low temperature side, wherein said thermoelectric converter is adapted to receive the heat generated by said combustion device at the high temperature side, transfer the heat from the low temperature side to said heat exchanger, and generate an electric power depending on a temperature difference between the high temperature side and the low temperature side;

a heat medium forced circulating device capable of being driven by the generated electric power of said thermoelectric converter so as to transfer heat medium to said heat exchanger;

a heat releasing device for circulating and releasing the said heat medium that has been heat exchanged in said heat exchanger;

a battery for supplying an electric power to said heat medium forced circulating device;

a changeover switch for changing over between said thermoelectric converter or said battery in order to change a source of power for said heat medium forced circulating device;

a controller for controlling said changeover switch; and a voltage detector for detecting a voltage generated by said thermoelectric converter, wherein said changeover switch is operated when said voltage generated by said thermoelectric converter reaches a preset voltage.

* * * * *